US 12,190,952 B2

(12) United States Patent
Tanaka et al.

(10) Patent No.: US 12,190,952 B2
(45) Date of Patent: Jan. 7, 2025

(54) SEMICONDUCTOR MEMORY DEVICE AND METHOD OF MANUFACTURING THE SEMICONDUCTOR MEMORY DEVICE

(71) Applicant: Kioxia Corporation, Tokyo (JP)

(72) Inventors: Minami Tanaka, Yokkaichi (JP); Naoyuki Iida, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 400 days.

(21) Appl. No.: 17/650,422

(22) Filed: Feb. 9, 2022

(65) Prior Publication Data

US 2023/0092799 A1 Mar. 23, 2023

(30) Foreign Application Priority Data

Sep. 17, 2021 (JP) .................................. 2021-152067

(51) Int. Cl.
*G11C 16/04* (2006.01)
*H01L 23/528* (2006.01)
(Continued)

(52) U.S. Cl.
CPC ...... *G11C 16/0483* (2013.01); *H01L 23/5283* (2013.01); *H10B 41/10* (2023.02);
(Continued)

(58) Field of Classification Search
CPC .. H10B 41/10; H10B 41/00–70; H10B 43/10; H10B 43/00–50; G11C 16/0408–0458; G11C 16/0483; G11C 16/0466–0475; G11C 16/06–3495; G11C 11/5621–5642; G11C 11/5671; G11C 2216/06–10; G11C 27/005; G11C 14/0018; G11C 2216/12–30; H01L 29/42324–42336; H01L 29/788–7889;
(Continued)

(56) References Cited

U.S. PATENT DOCUMENTS 10,553,608 B2   2/2020   Aoyama
11,049,872 B2   6/2021   Nojima et al.
(Continued)

FOREIGN PATENT DOCUMENTS

JP   2019-149445 A   9/2019
JP   2020-047810 A   3/2020
(Continued)

*Primary Examiner* — Shahed Ahmed
*Assistant Examiner* — Rhys Poniente Sheker
(74) *Attorney, Agent, or Firm* — Oblon, McClelland, Maier & Neustadt, L.L.P.

(57) ABSTRACT

According to one embodiment, a semiconductor memory device includes interconnect layers stacked above a substrate; a memory pillar configured to penetrate the interconnect layers; a first member and a second member; and a dividing portion provided between the first member and the second member. The dividing portion includes insulating layers. The insulating layers each include a first portion and a second portion. The first portion is provided between the first member and the second portion. The second portion is provided between the first portion and the second member. The first portion and the second portion each have an individual arc shape when viewed from a top and are in contact with each other.

18 Claims, 76 Drawing Sheets

(51) Int. Cl.
  *H01L 27/11519* (2017.01)
  *H10B 41/10* (2023.01)
  *H10B 41/27* (2023.01)
  *H10B 41/35* (2023.01)
  *H10B 43/10* (2023.01)
  *H10B 43/27* (2023.01)
  *H10B 43/35* (2023.01)
(52) U.S. Cl.
  CPC ............ *H10B 41/27* (2023.02); *H10B 41/35* (2023.02); *H10B 43/10* (2023.02); *H10B 43/27* (2023.02); *H10B 43/35* (2023.02)
(58) Field of Classification Search
  CPC ... H01L 29/4234–42352; H01L 29/518; H01L 29/792–7926; H01L 2924/14511; H01L 2924/1438
  See application file for complete search history.

(56) References Cited

U.S. PATENT DOCUMENTS

| | | |
|---|---|---|
| 2017/0194345 A1 | 7/2017 | Nojima |
| 2020/0395374 A1* | 12/2020 | Huo ................. H10B 43/10 |
| 2020/0395376 A1* | 12/2020 | Huo ................. H10B 43/27 |
| 2021/0050366 A1* | 2/2021 | Huang ............ H01L 21/76877 |
| 2021/0082949 A1 | 3/2021 | Harada et al. |
| 2021/0167076 A1 | 6/2021 | Xu et al. |
| 2022/0262744 A1* | 8/2022 | Masaki ............. H10B 43/27 |

FOREIGN PATENT DOCUMENTS

| | | |
|---|---|---|
| JP | 2021-048155 A | 3/2021 |
| TW | 202121603 A | 6/2021 |

* cited by examiner

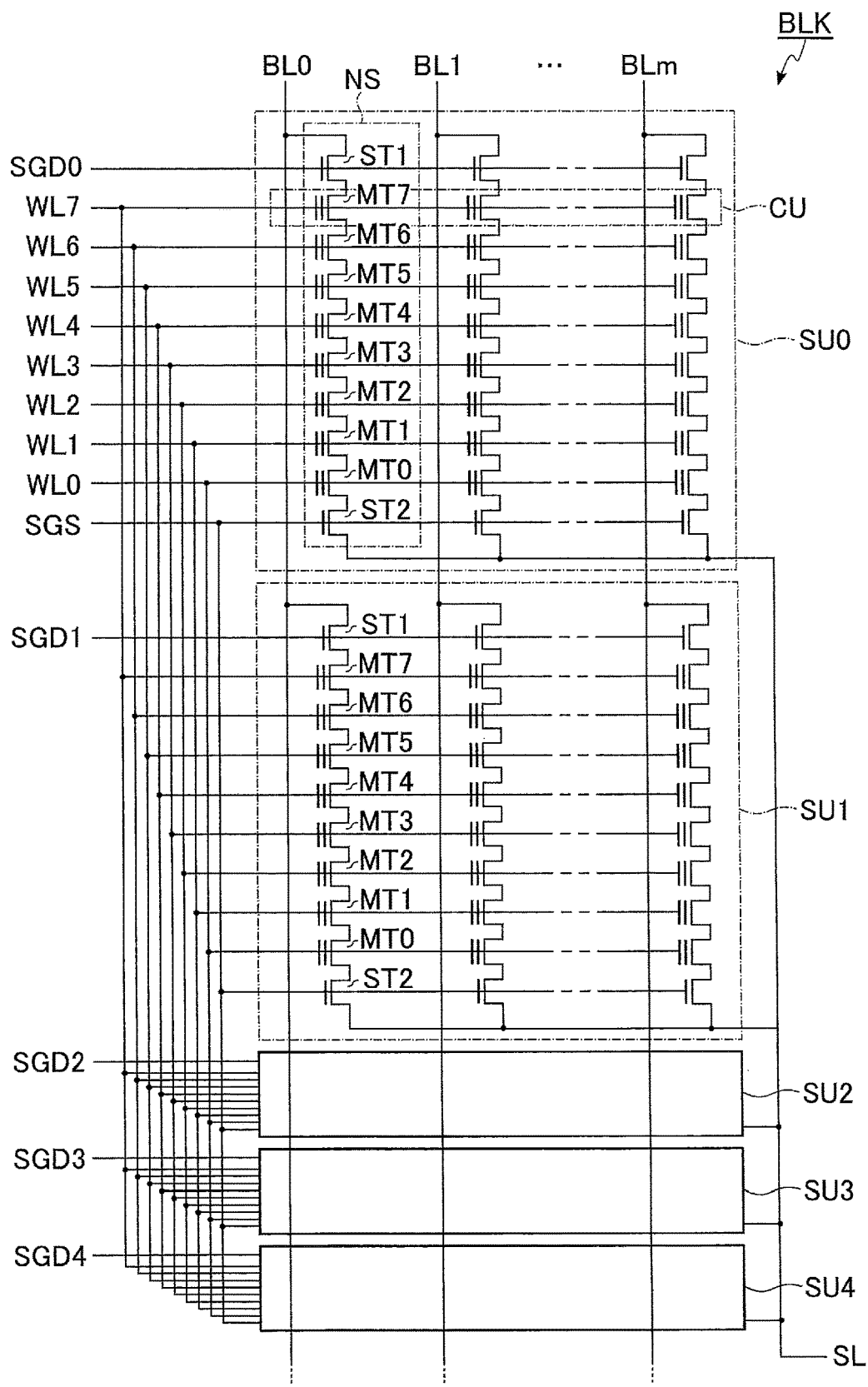
F I G. 2

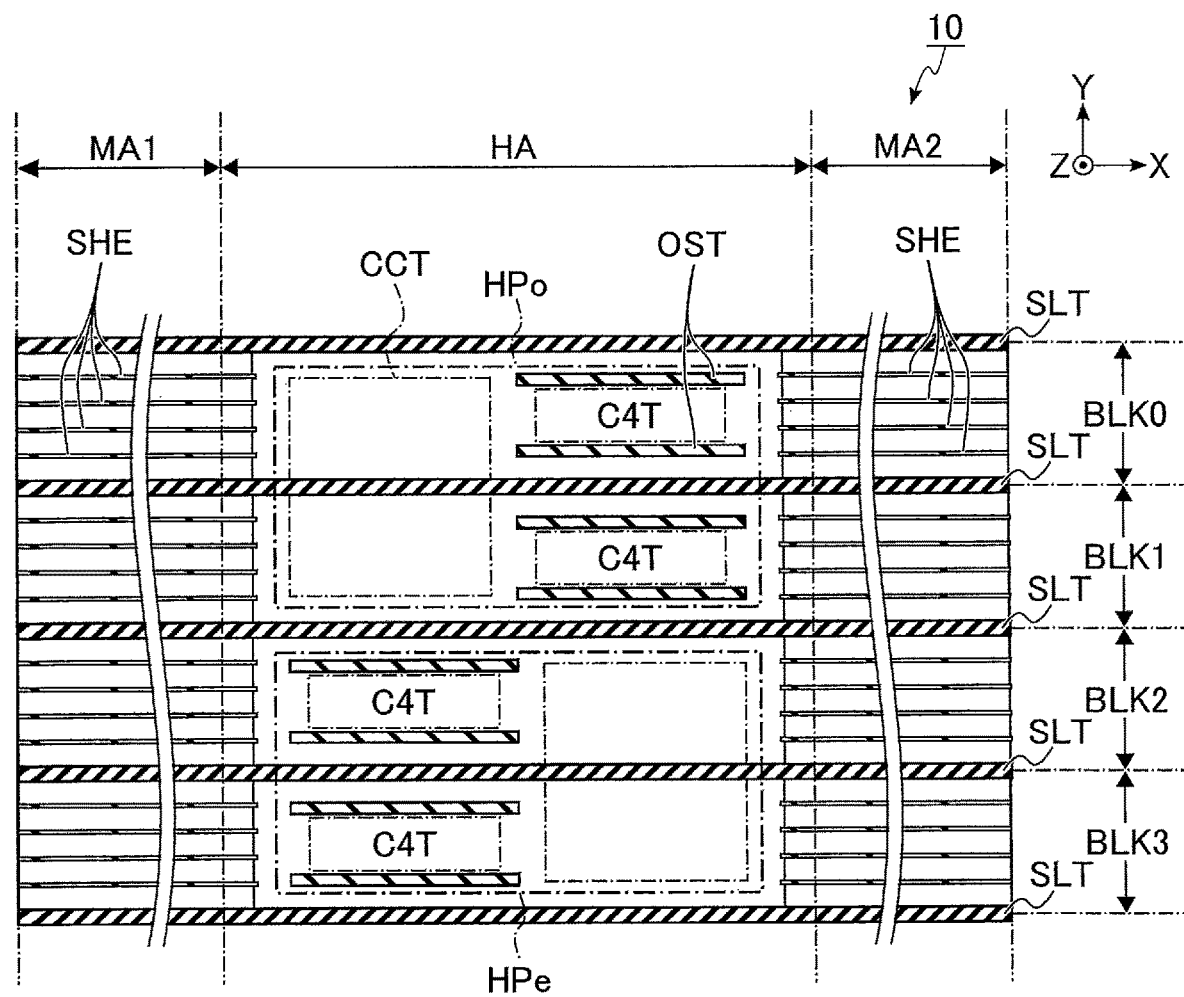
F I G. 3

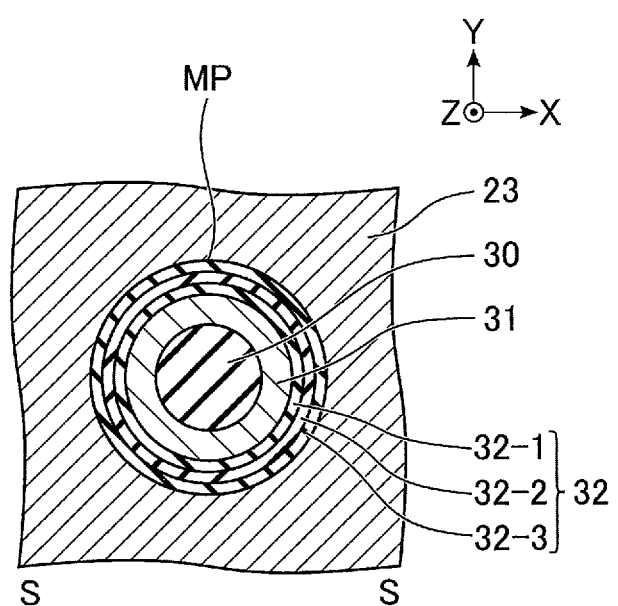
F I G. 6

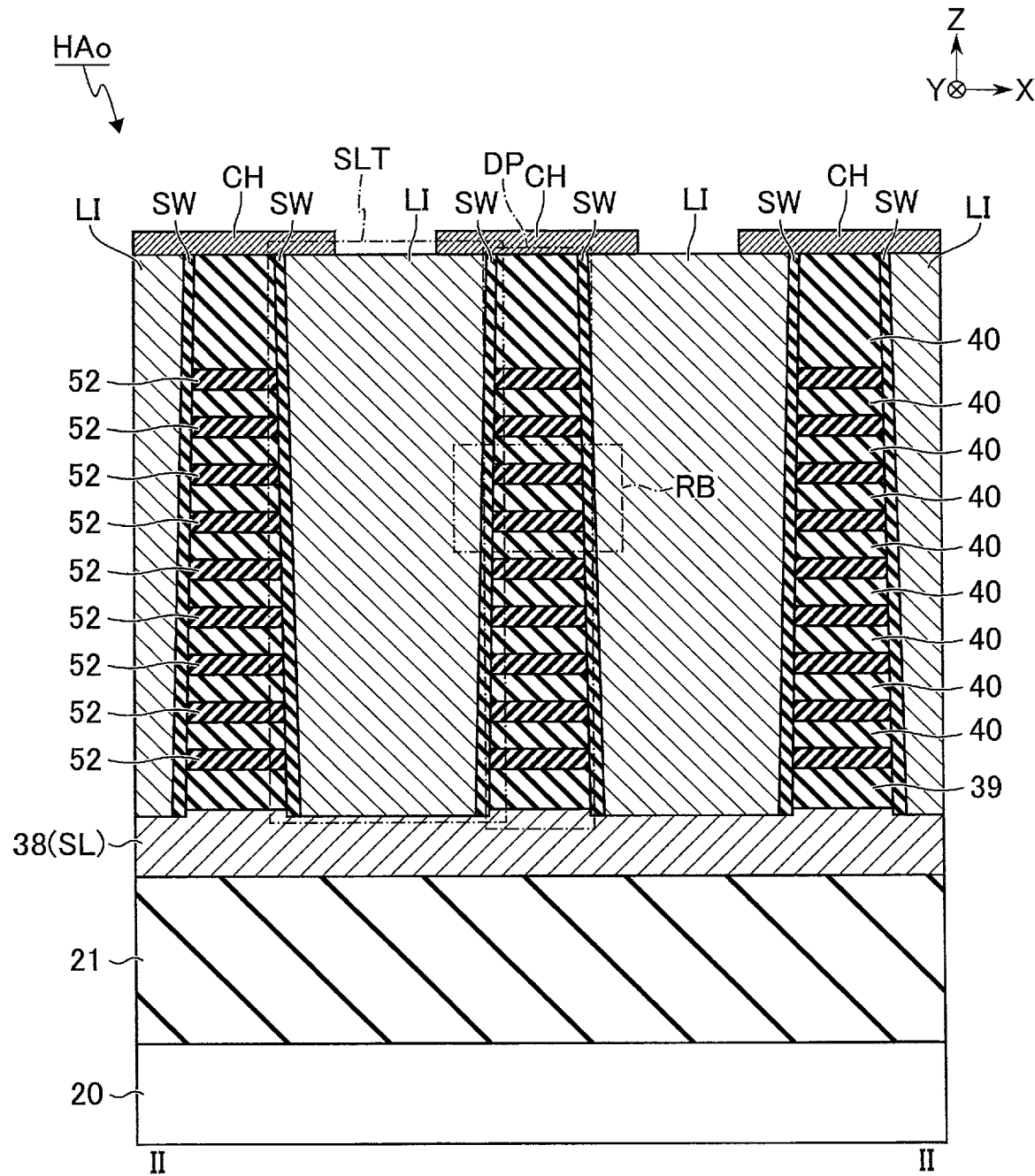
F I G. 7

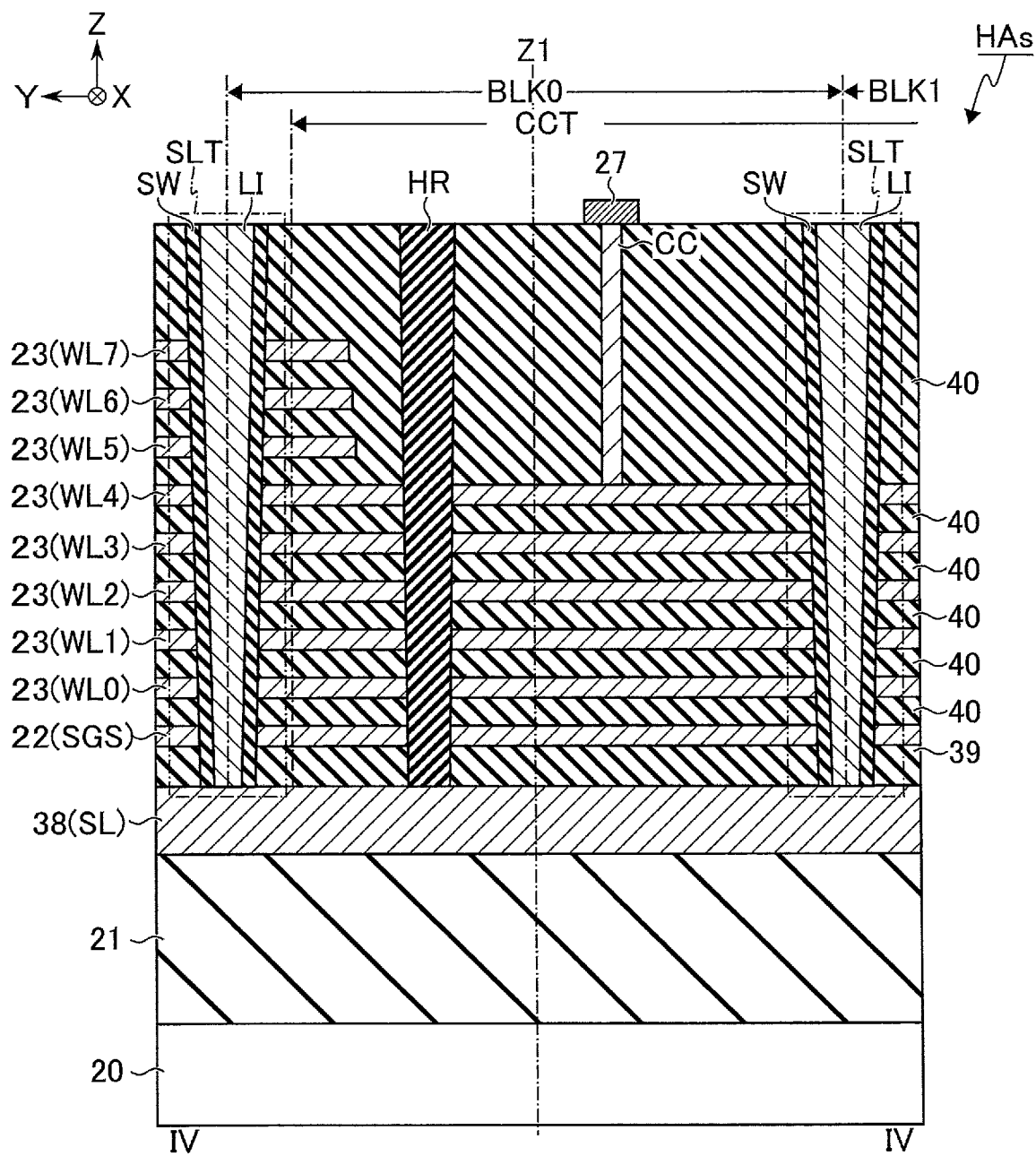
F I G. 9

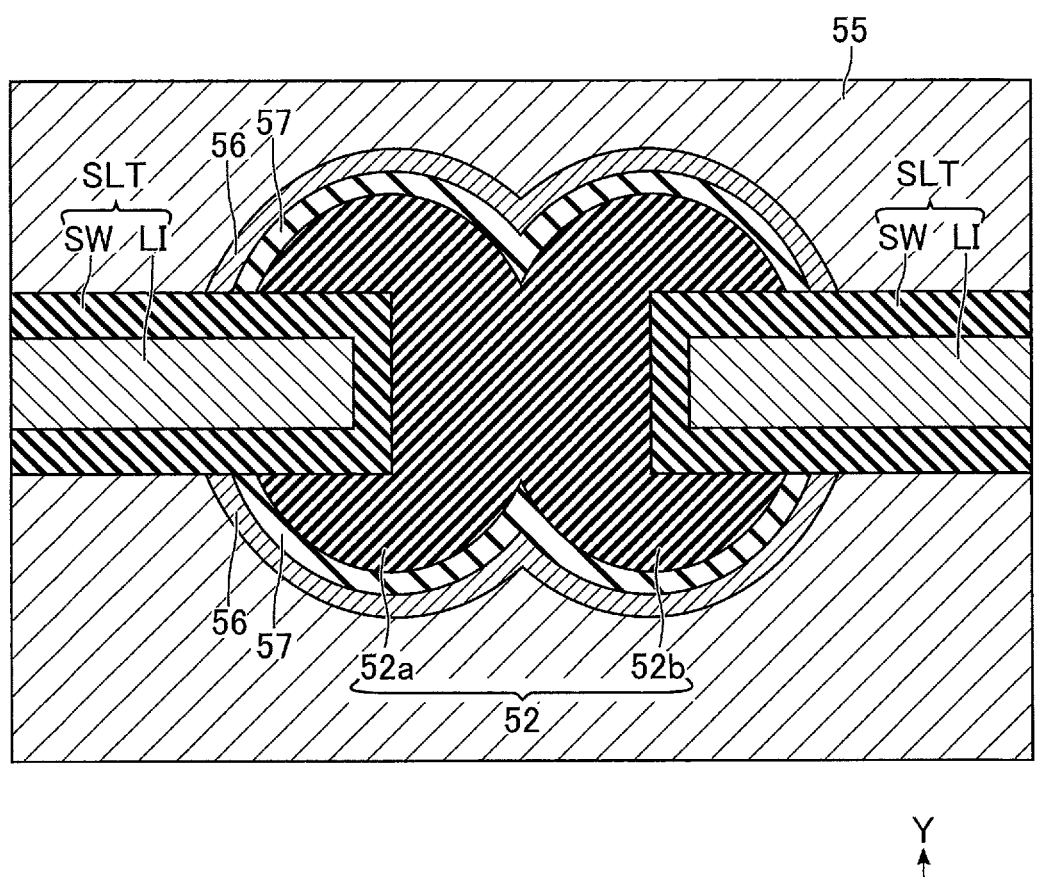
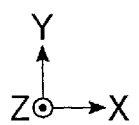
F I G. 10

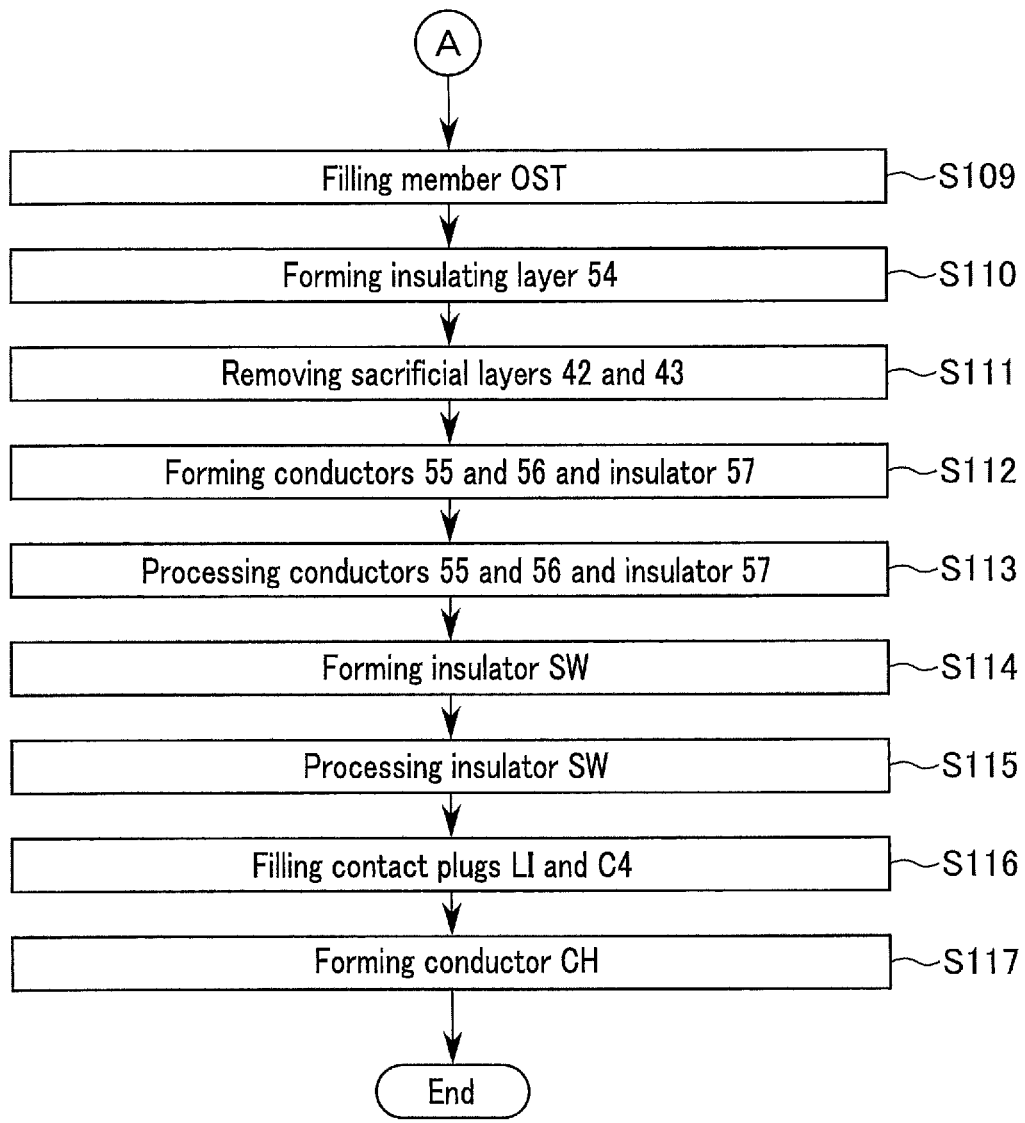
F I G. 14

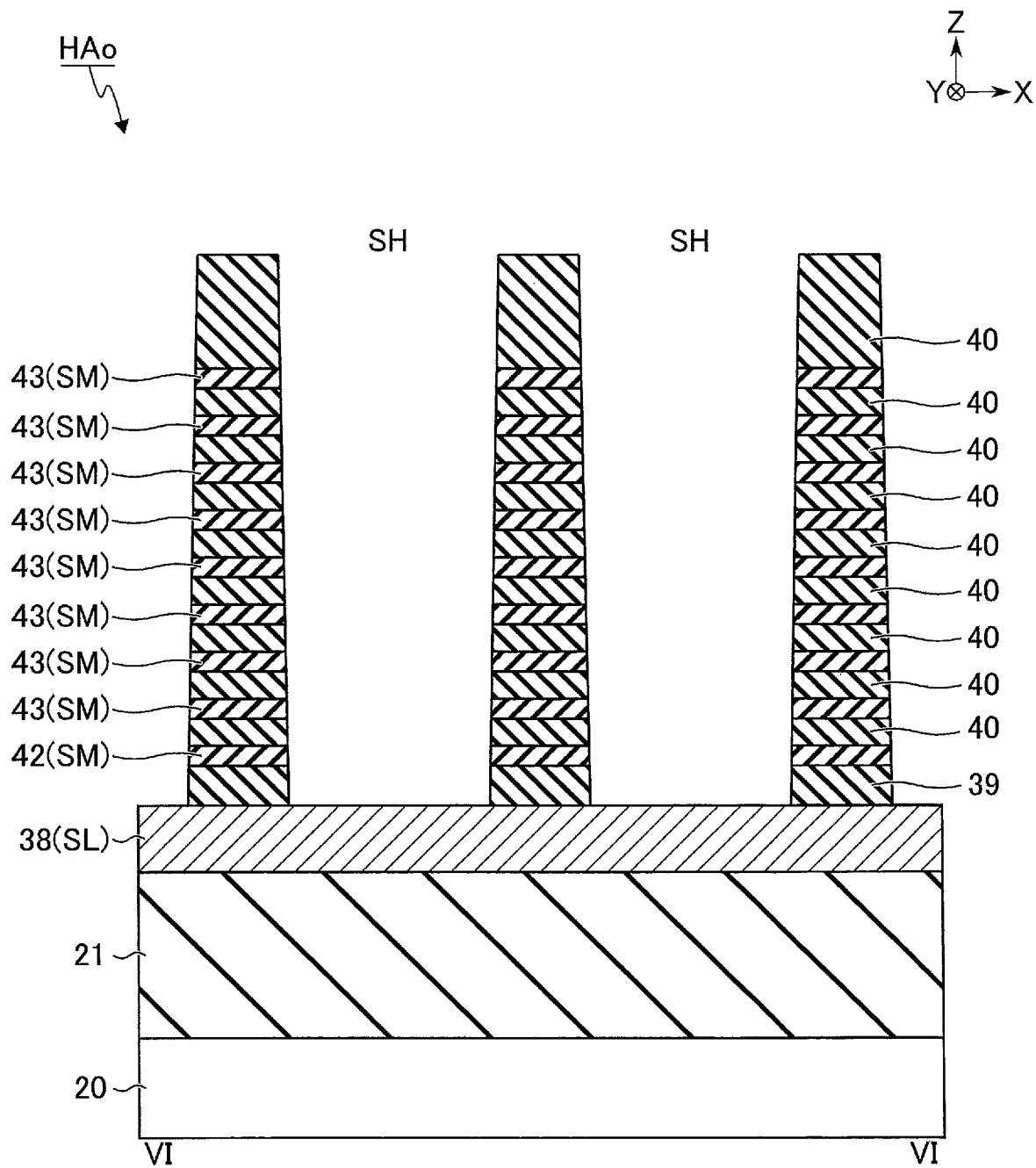
F I G. 16

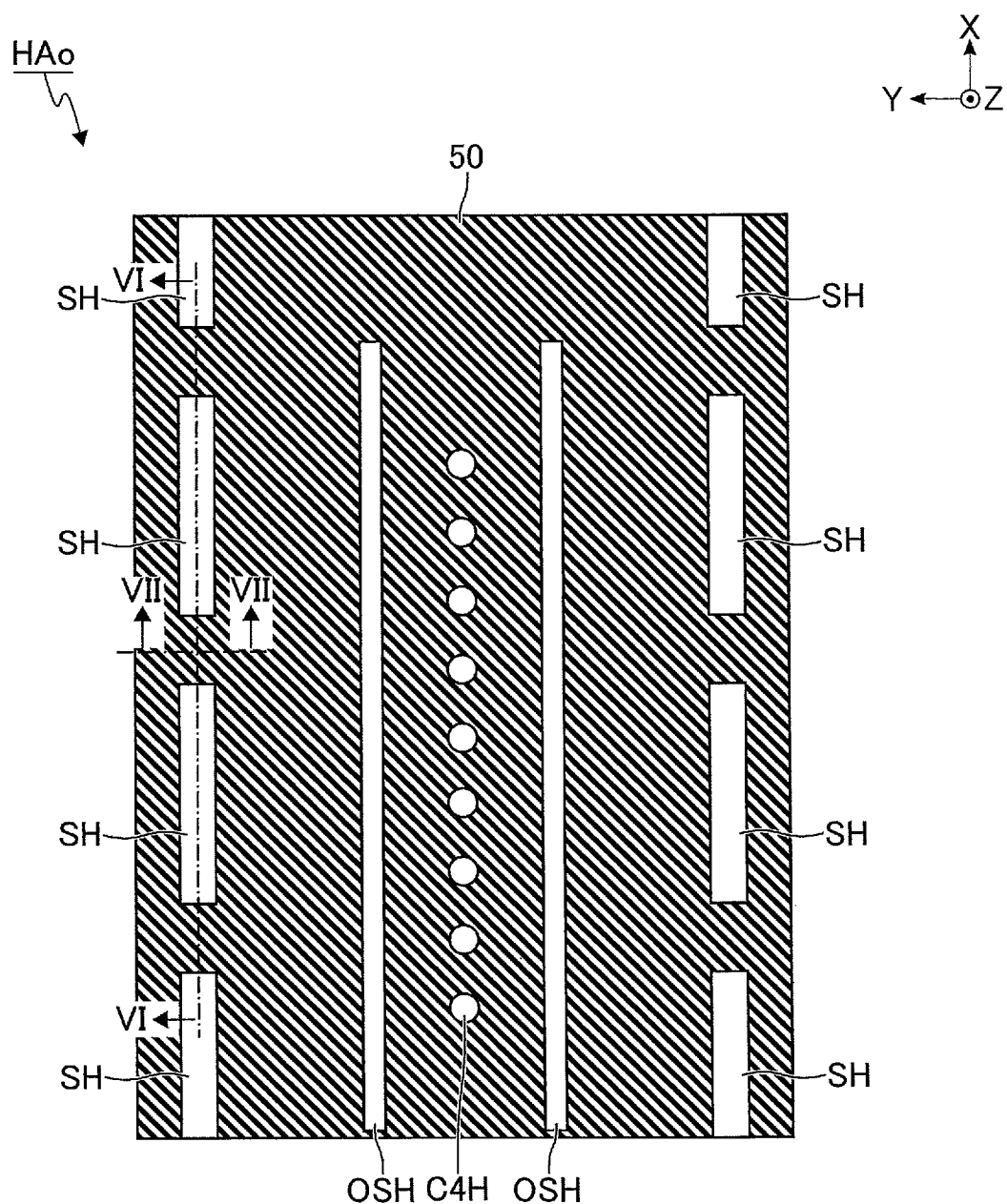
F I G. 18

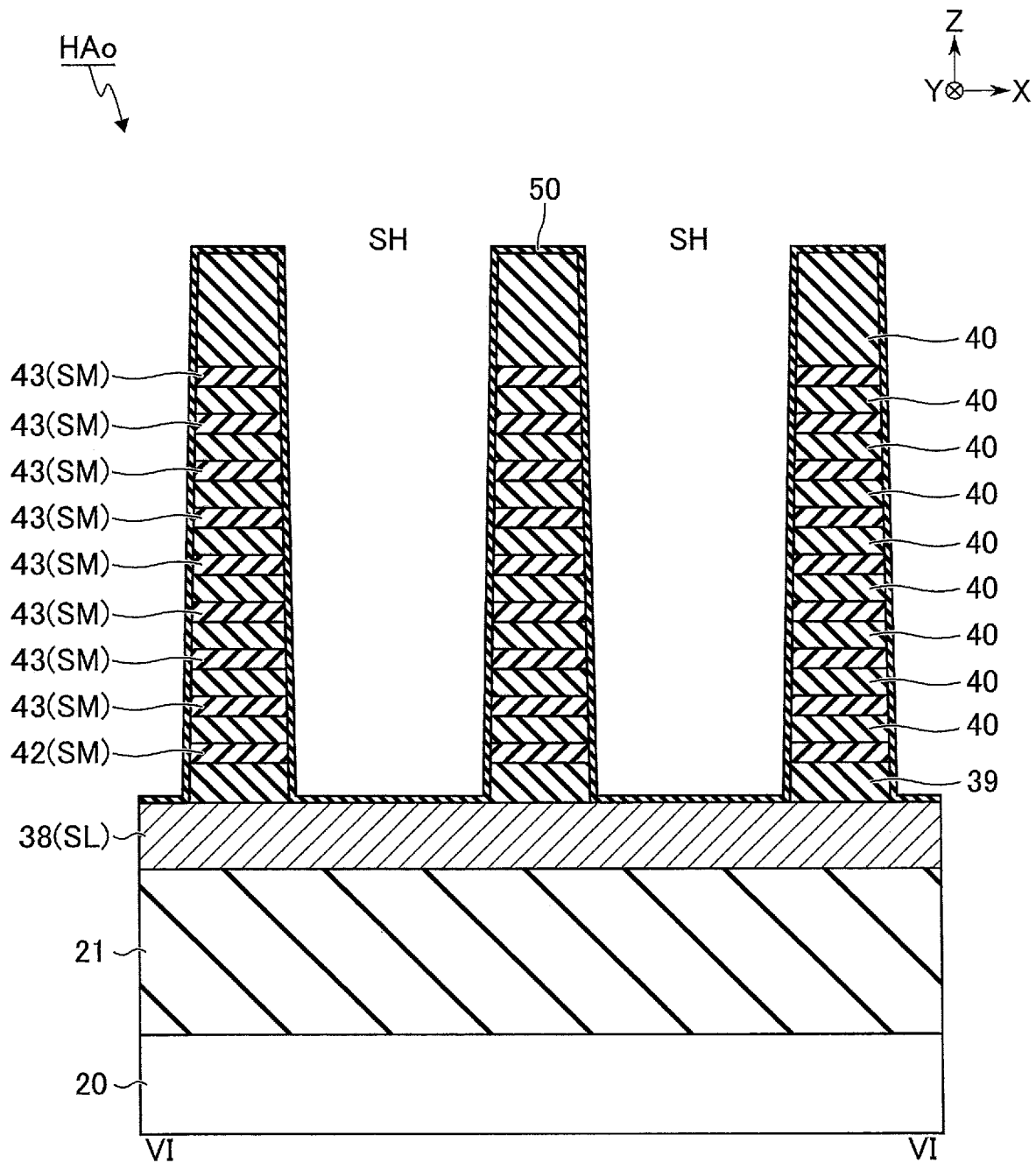
F I G. 19

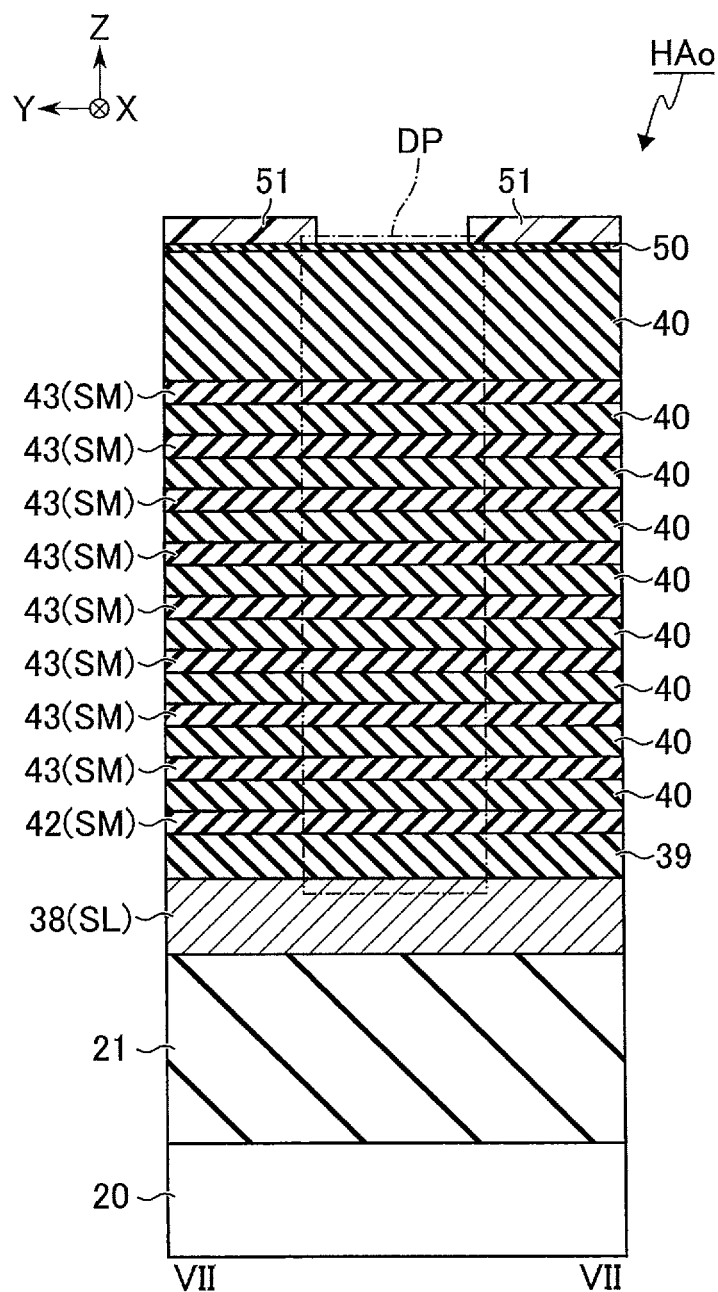
F I G. 23

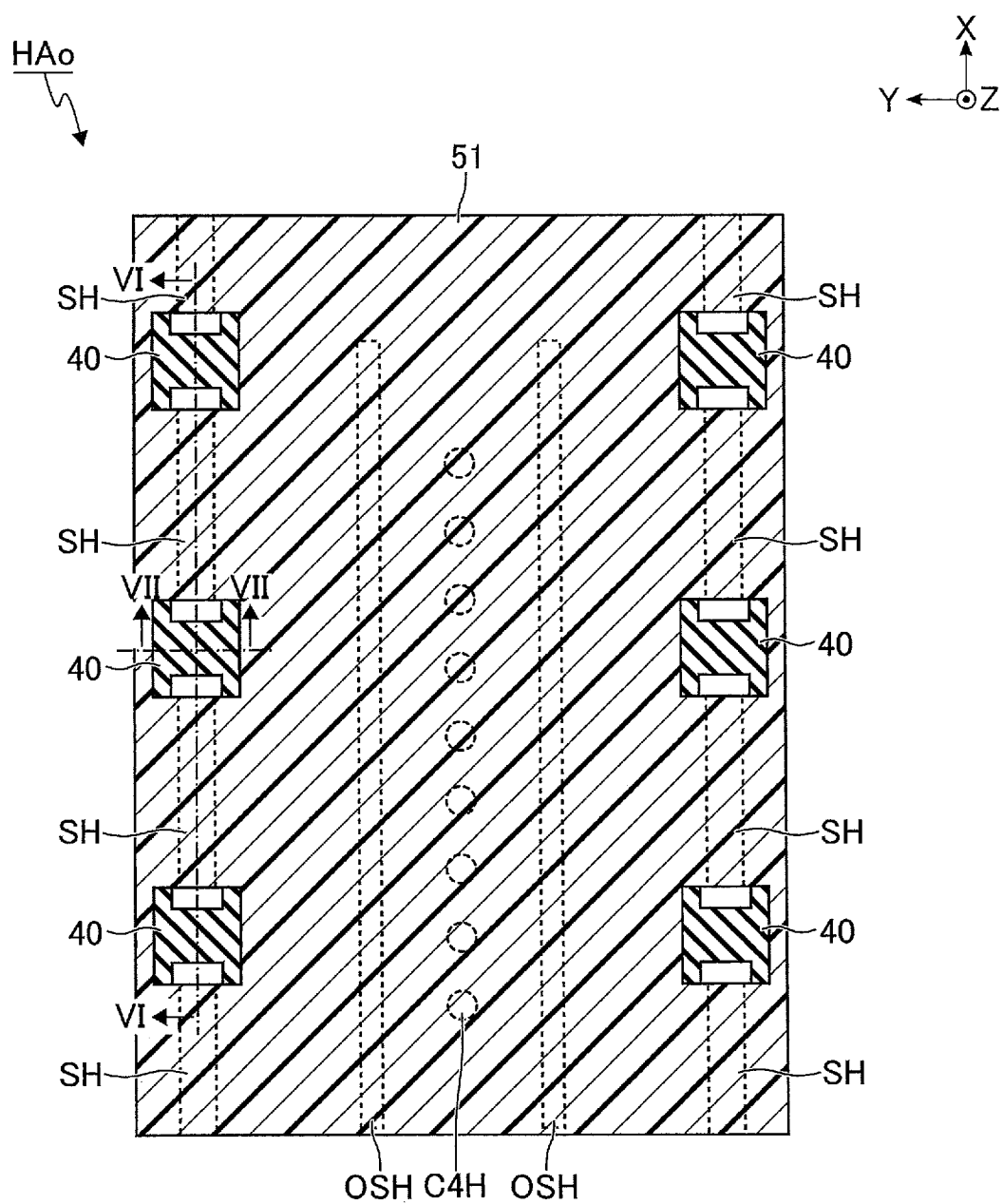
F I G. 24

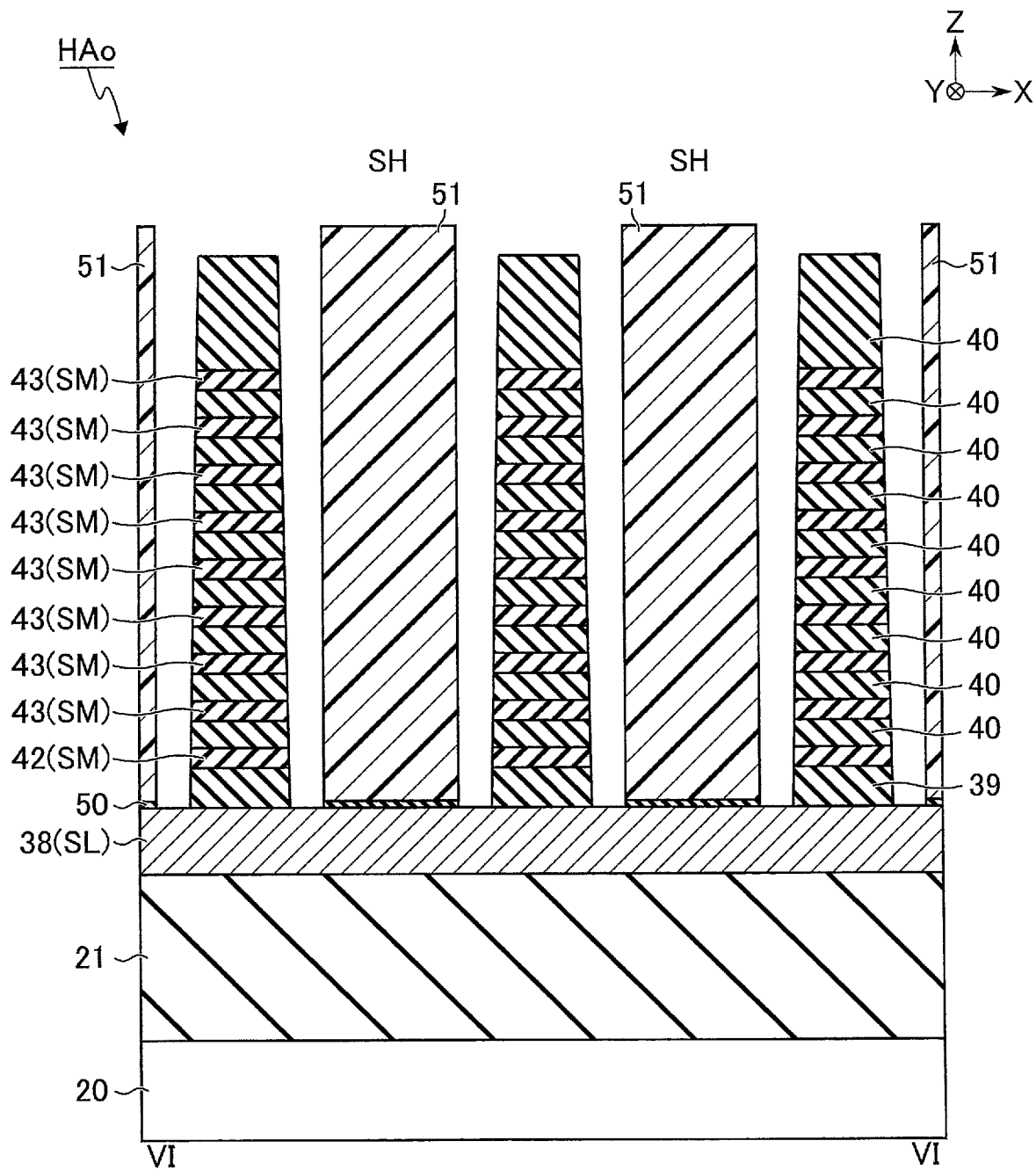
F I G. 25

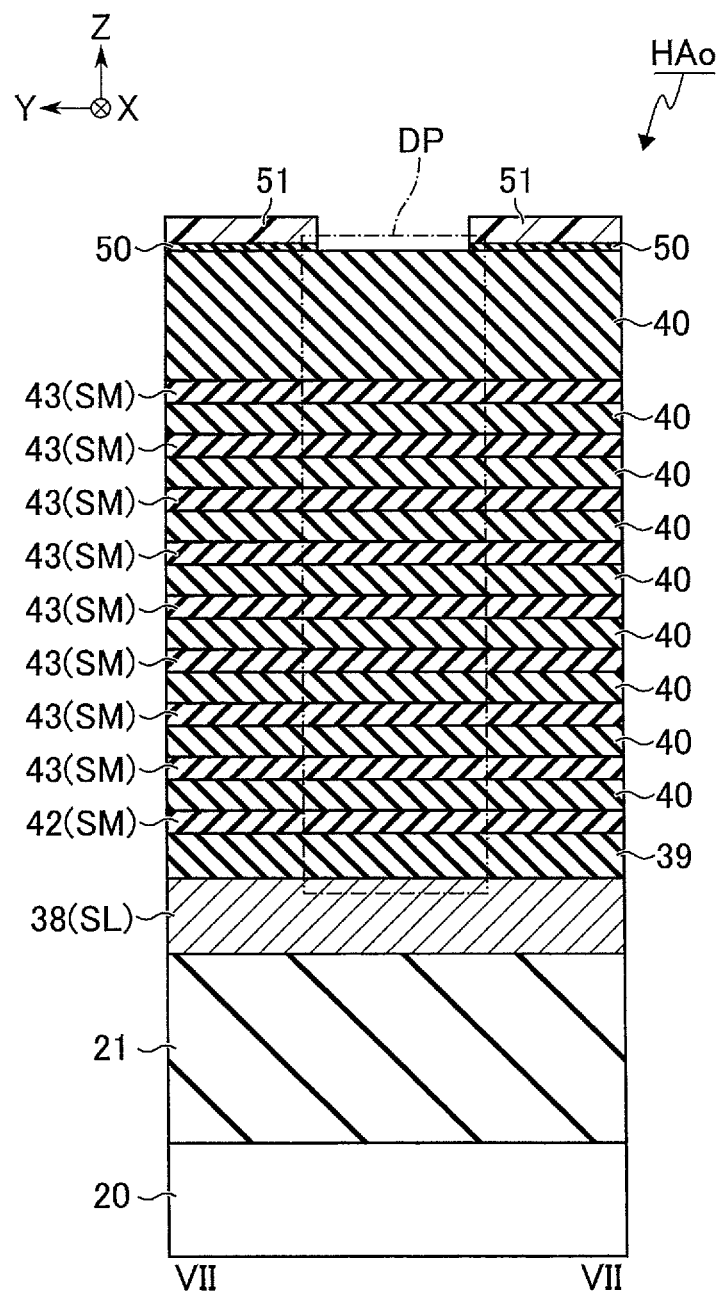
F I G. 26

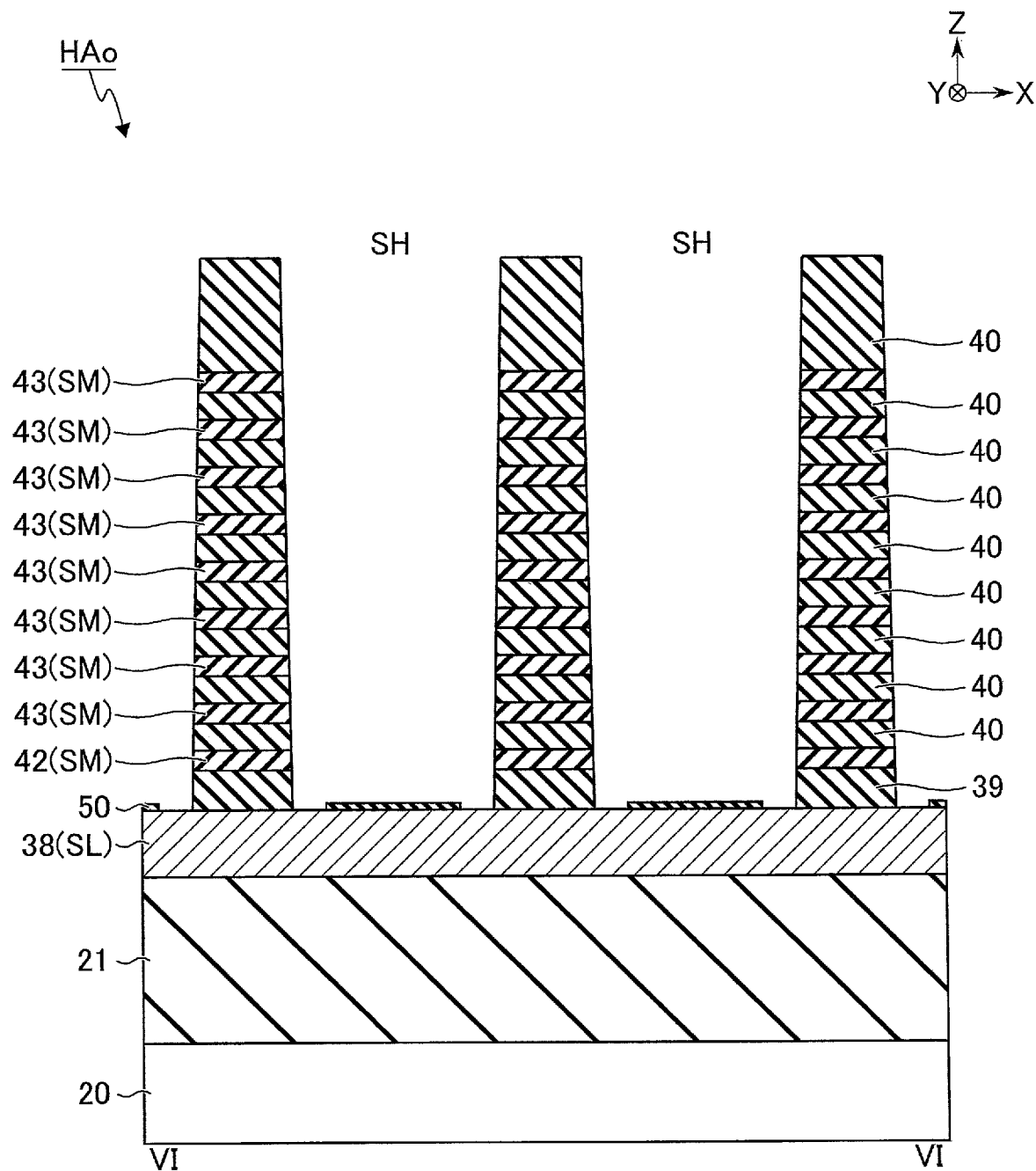
F I G. 28

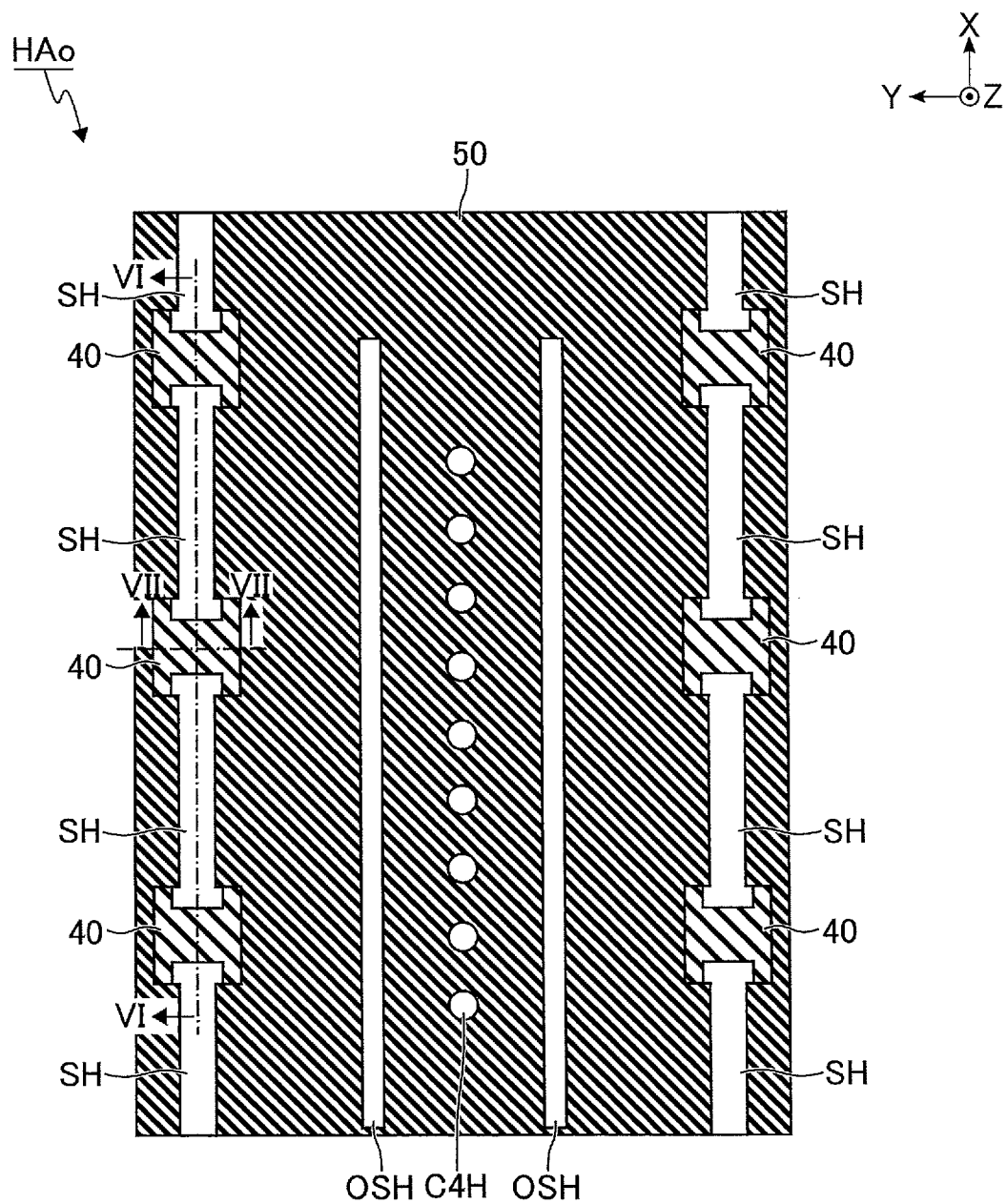
F I G. 30

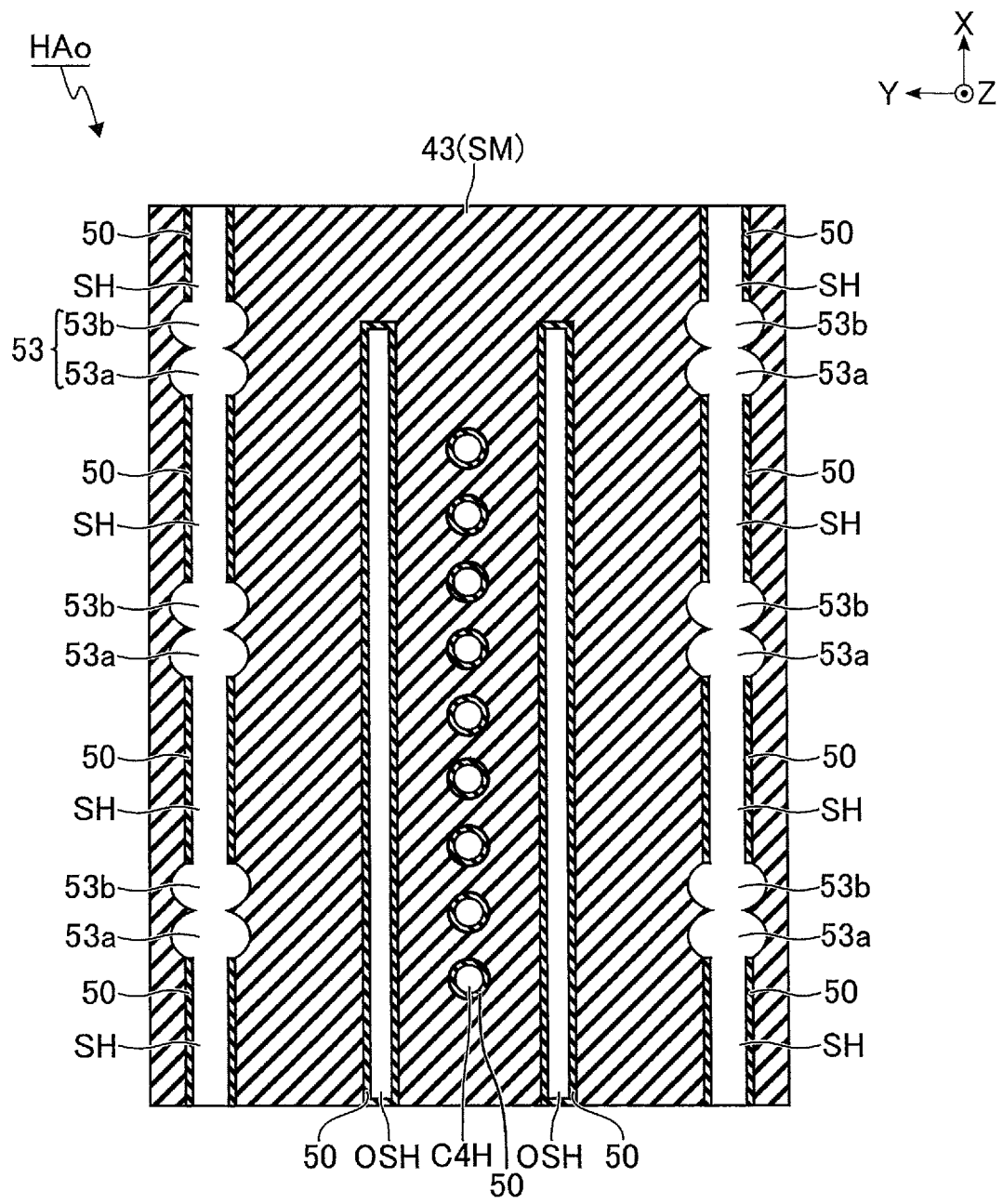
F I G. 31

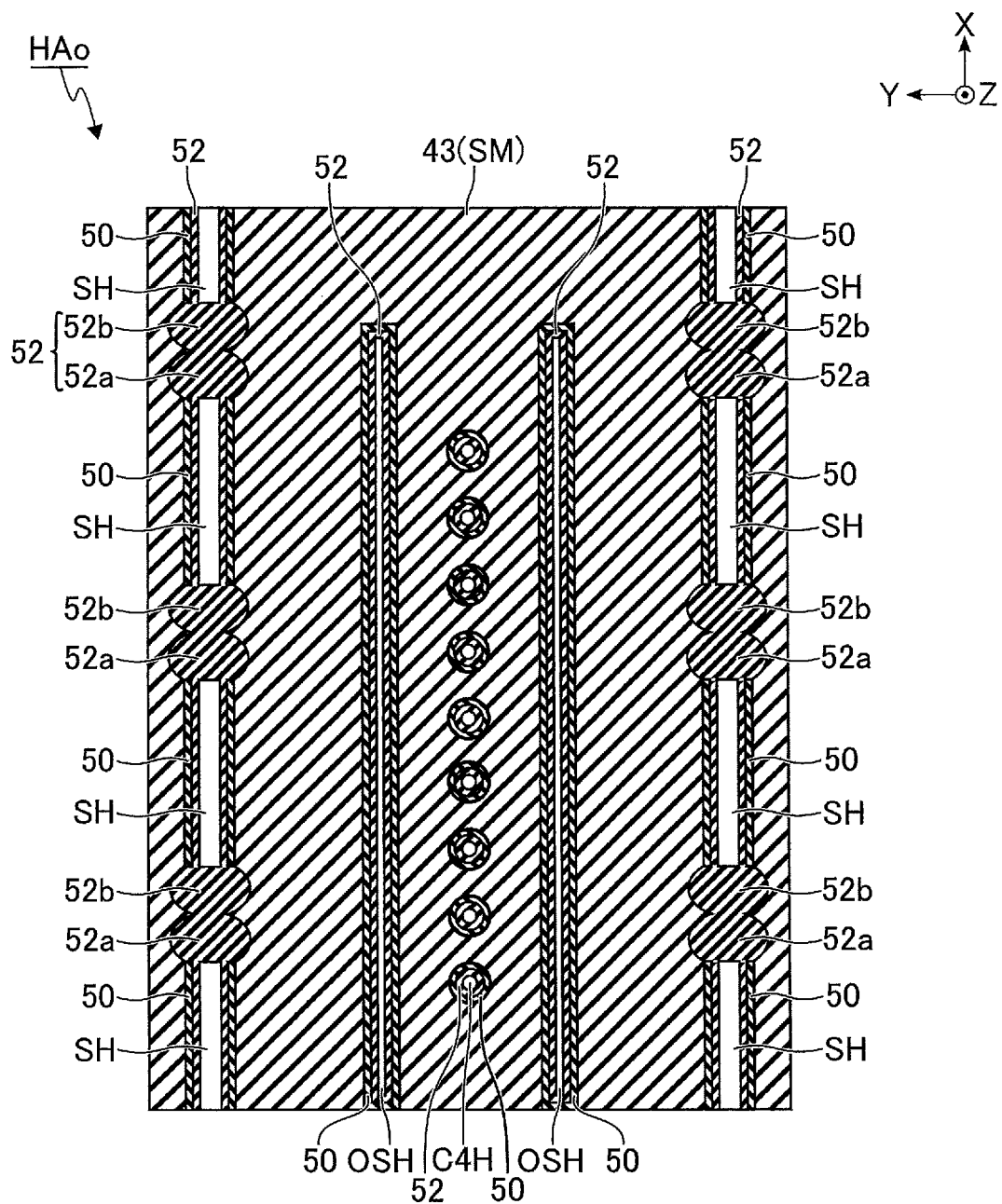
F I G. 35

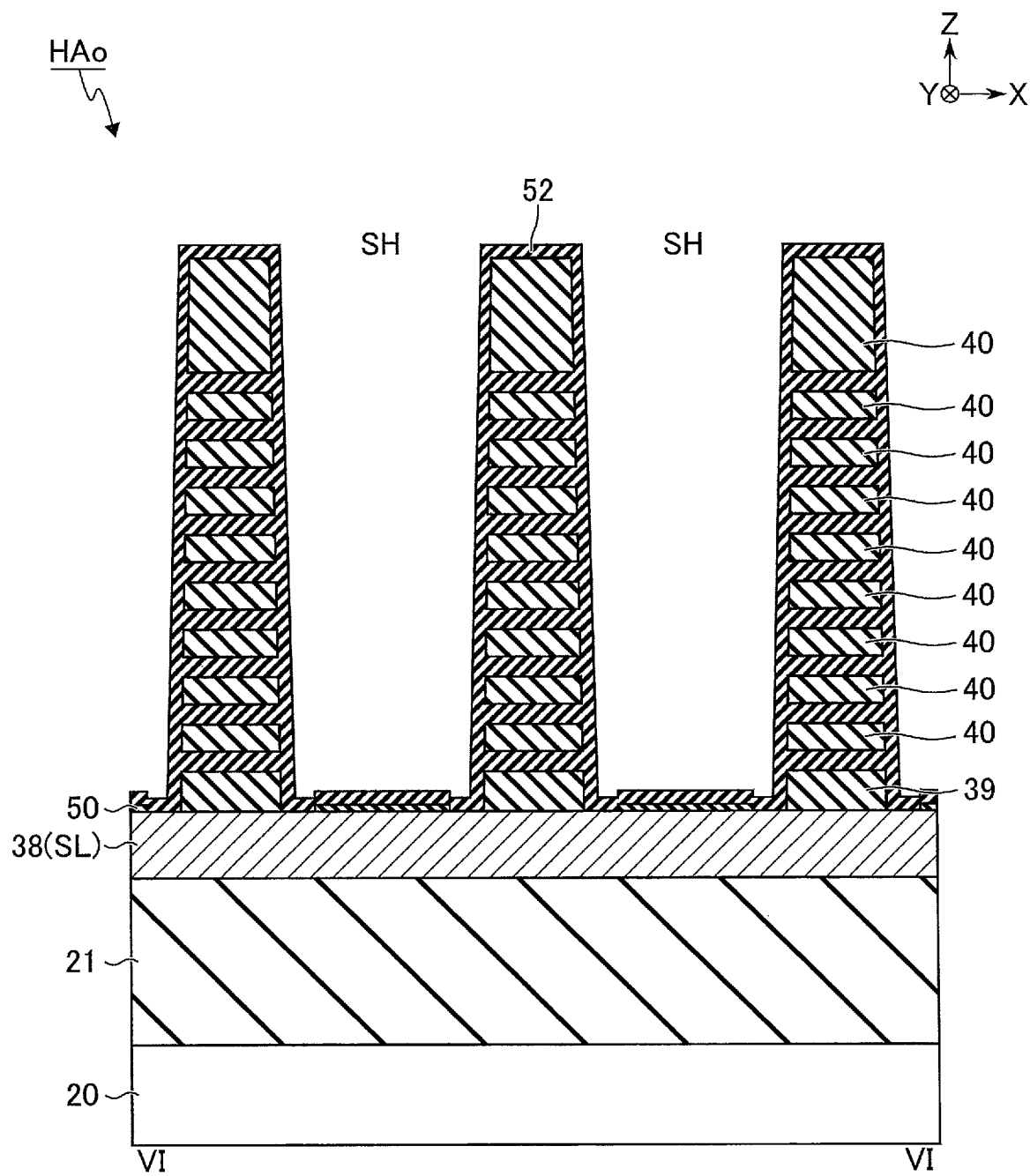
F I G. 36

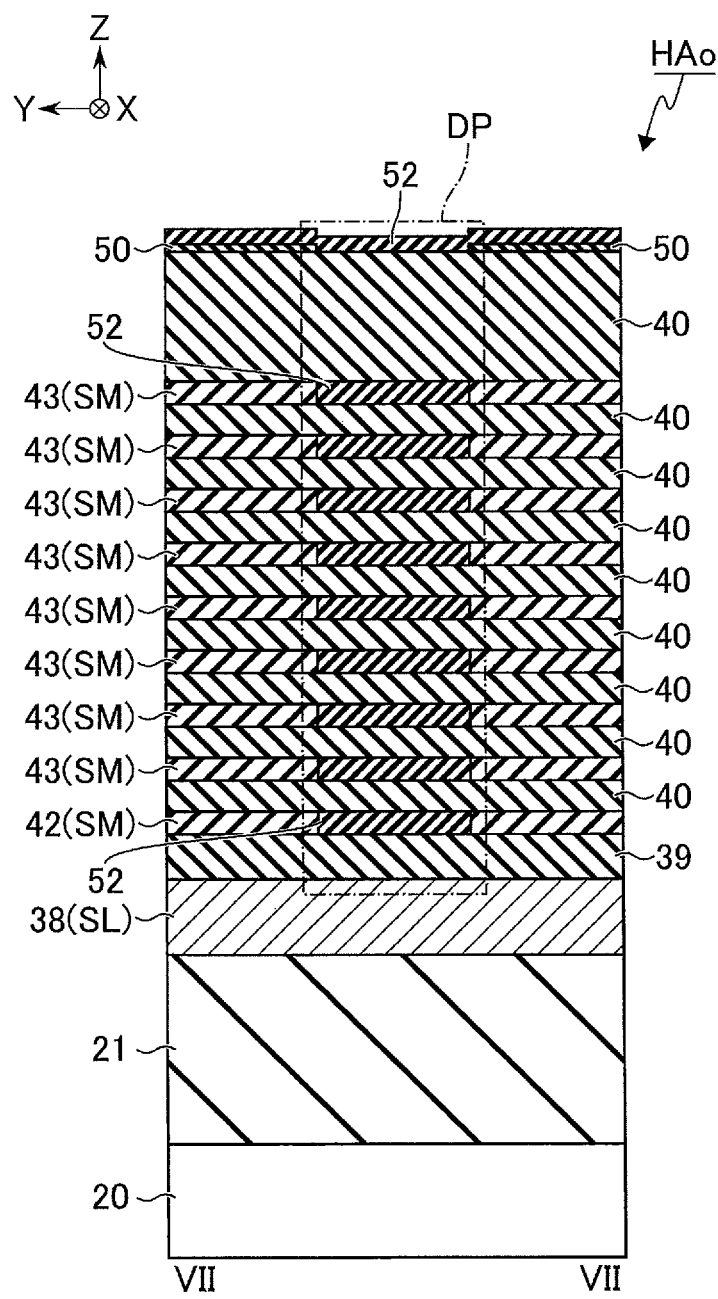
F I G. 37

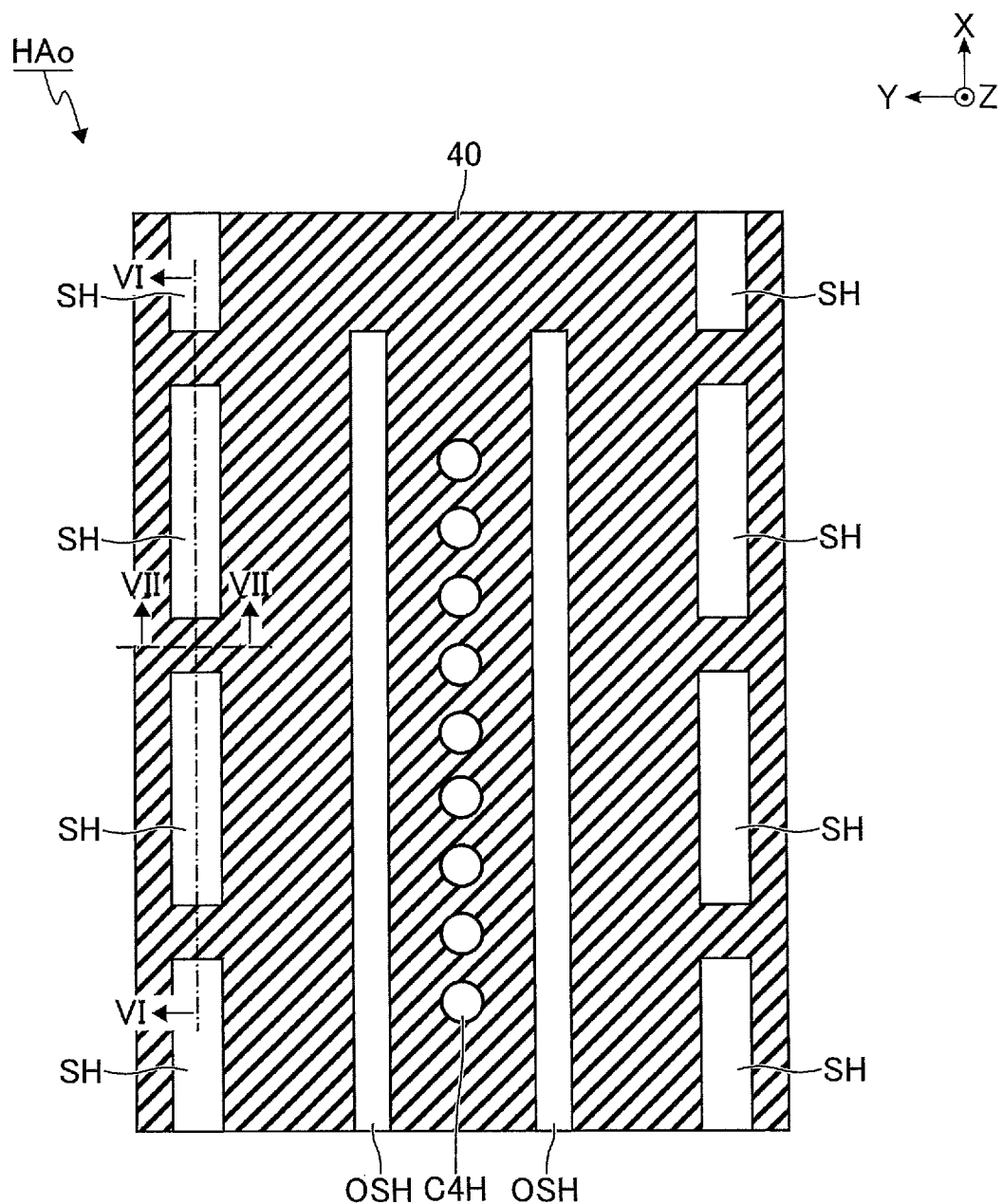
F I G. 38

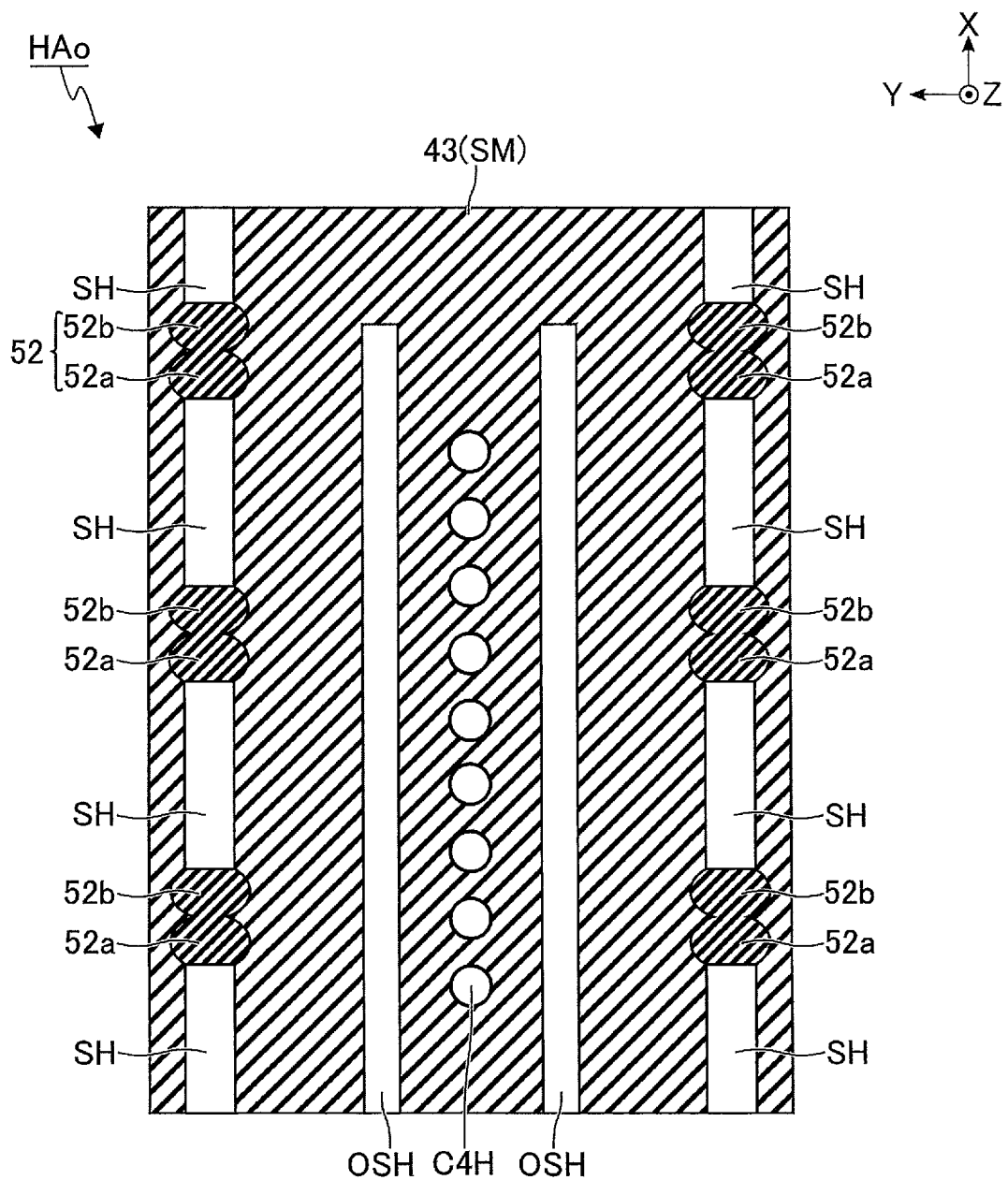
F I G. 39

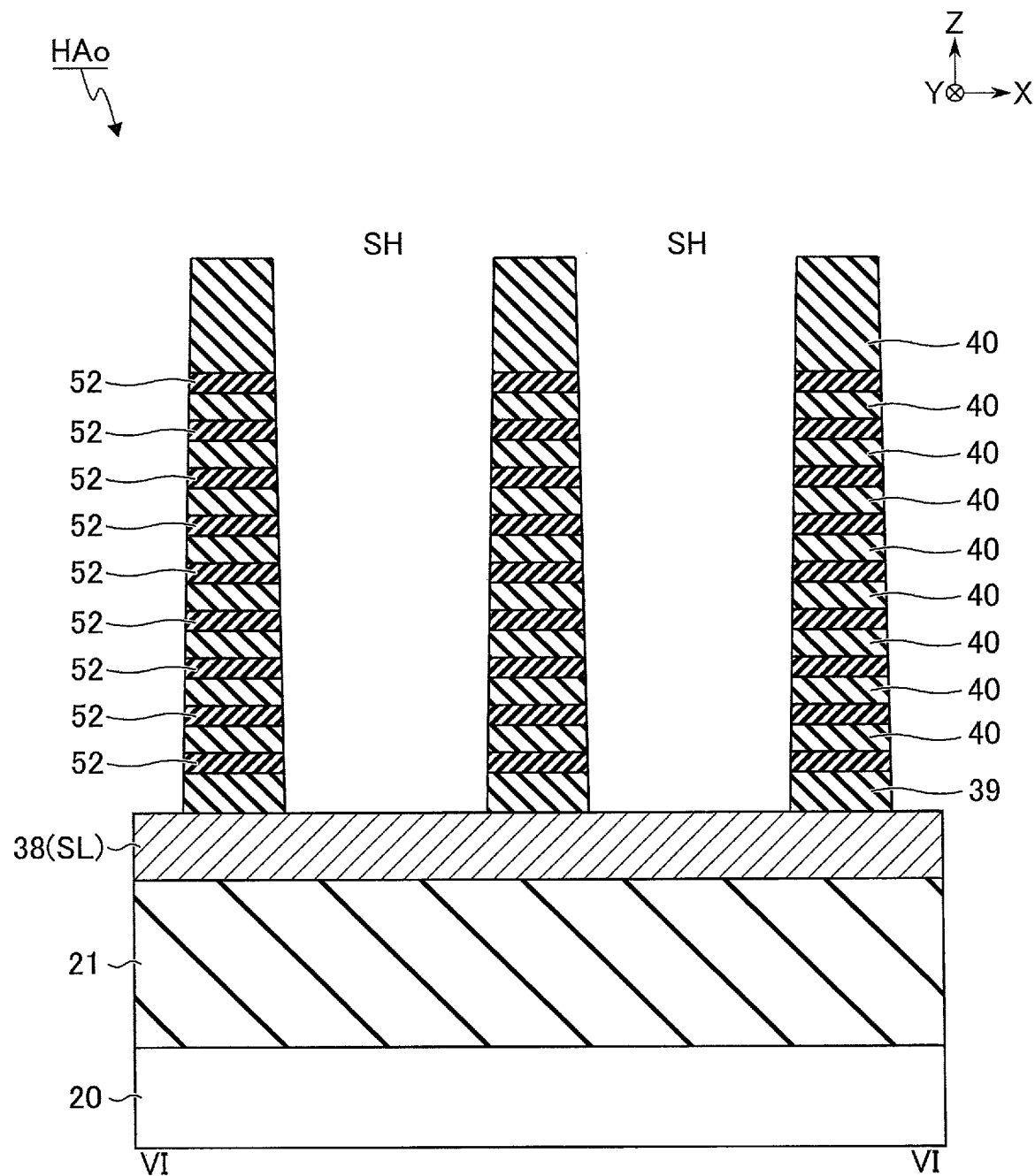
F I G. 40

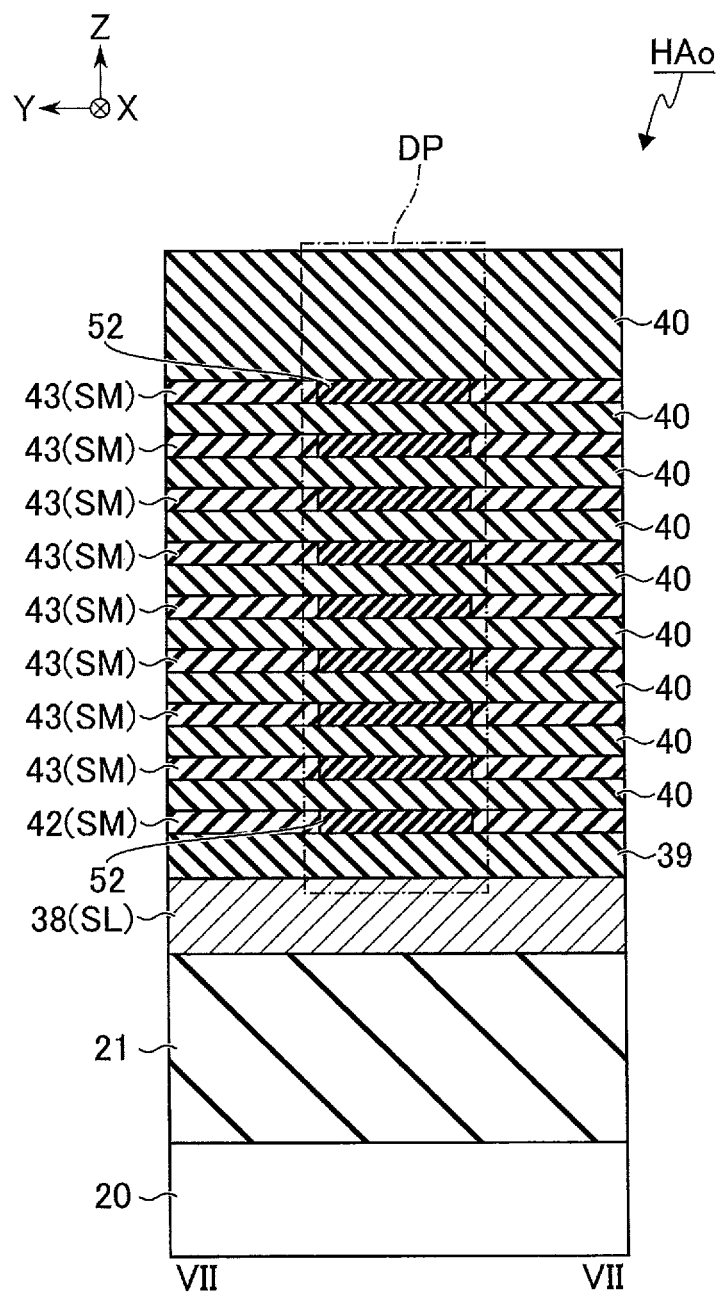
F I G. 41

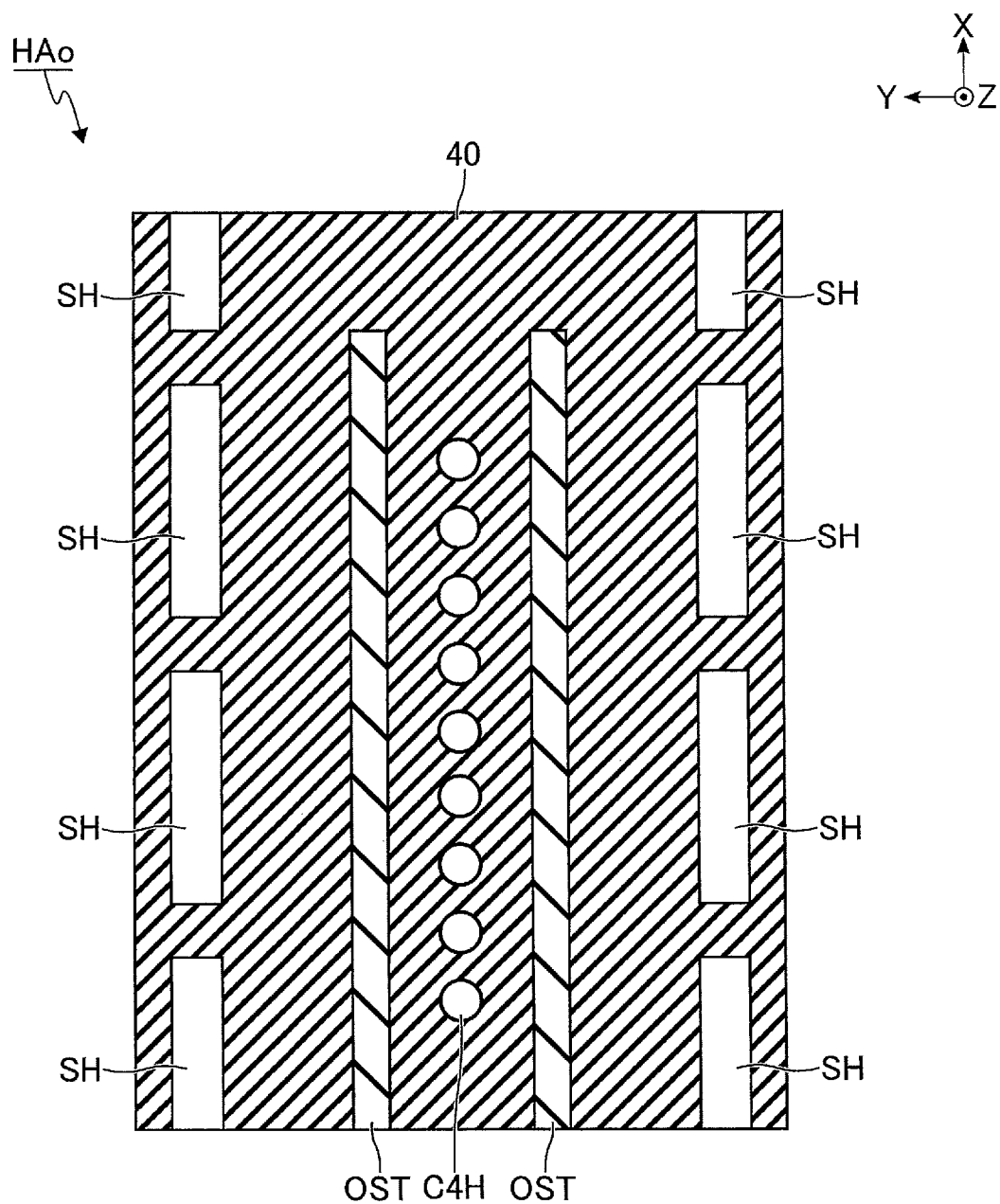
F I G. 42

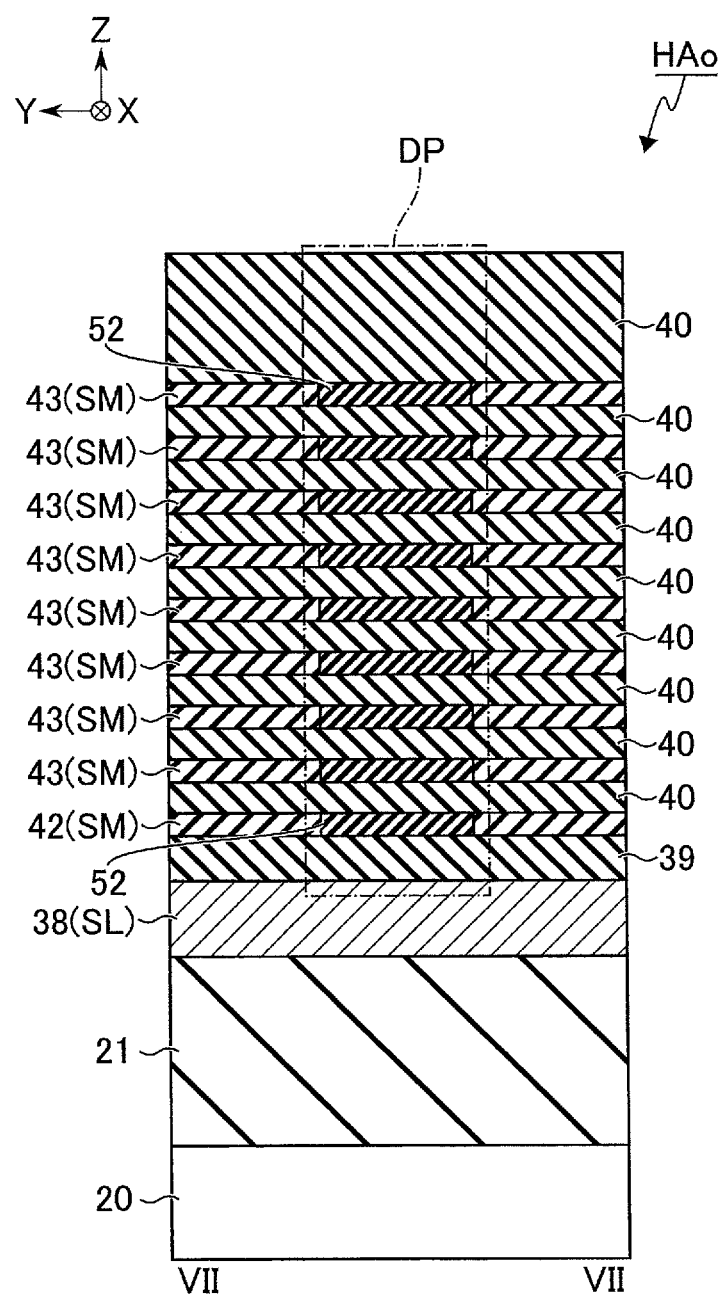
F I G. 45

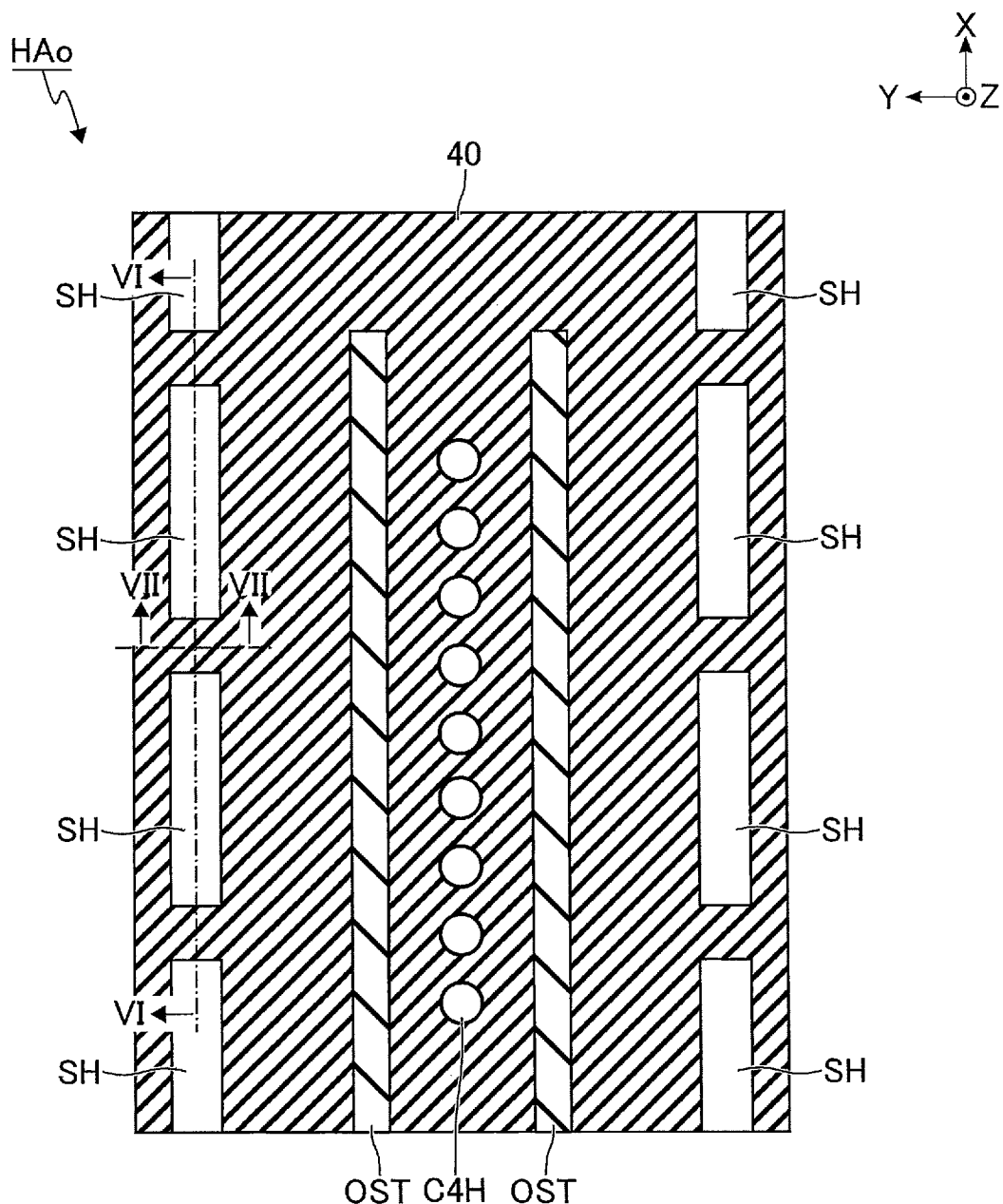
F I G. 46

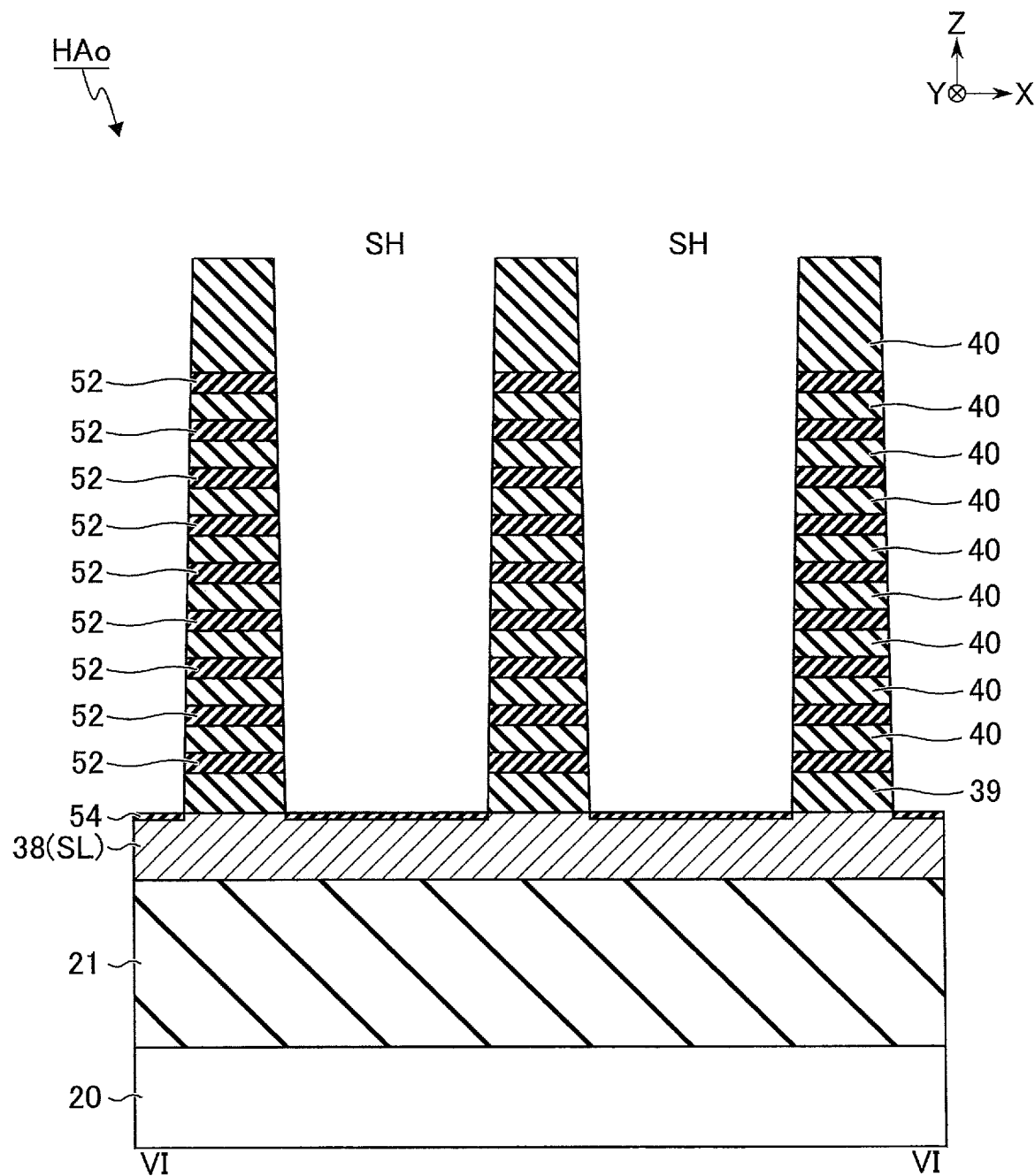
F I G. 48

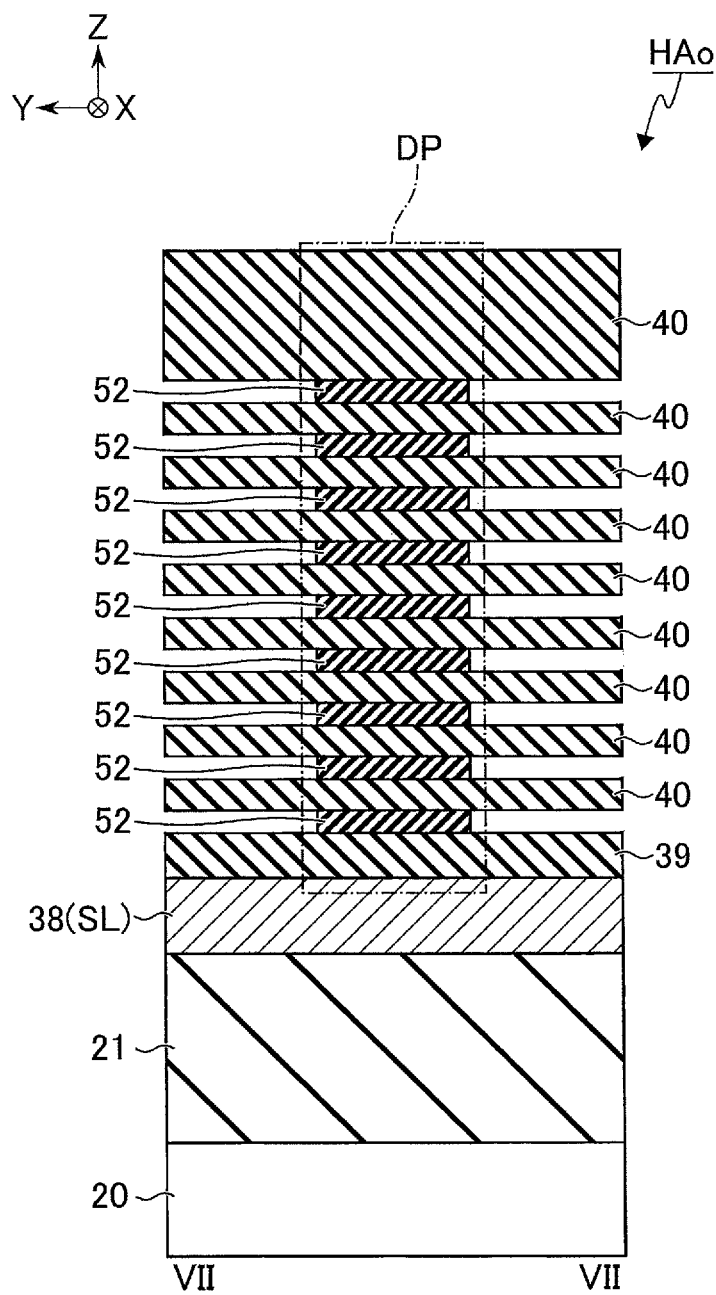
F I G. 49

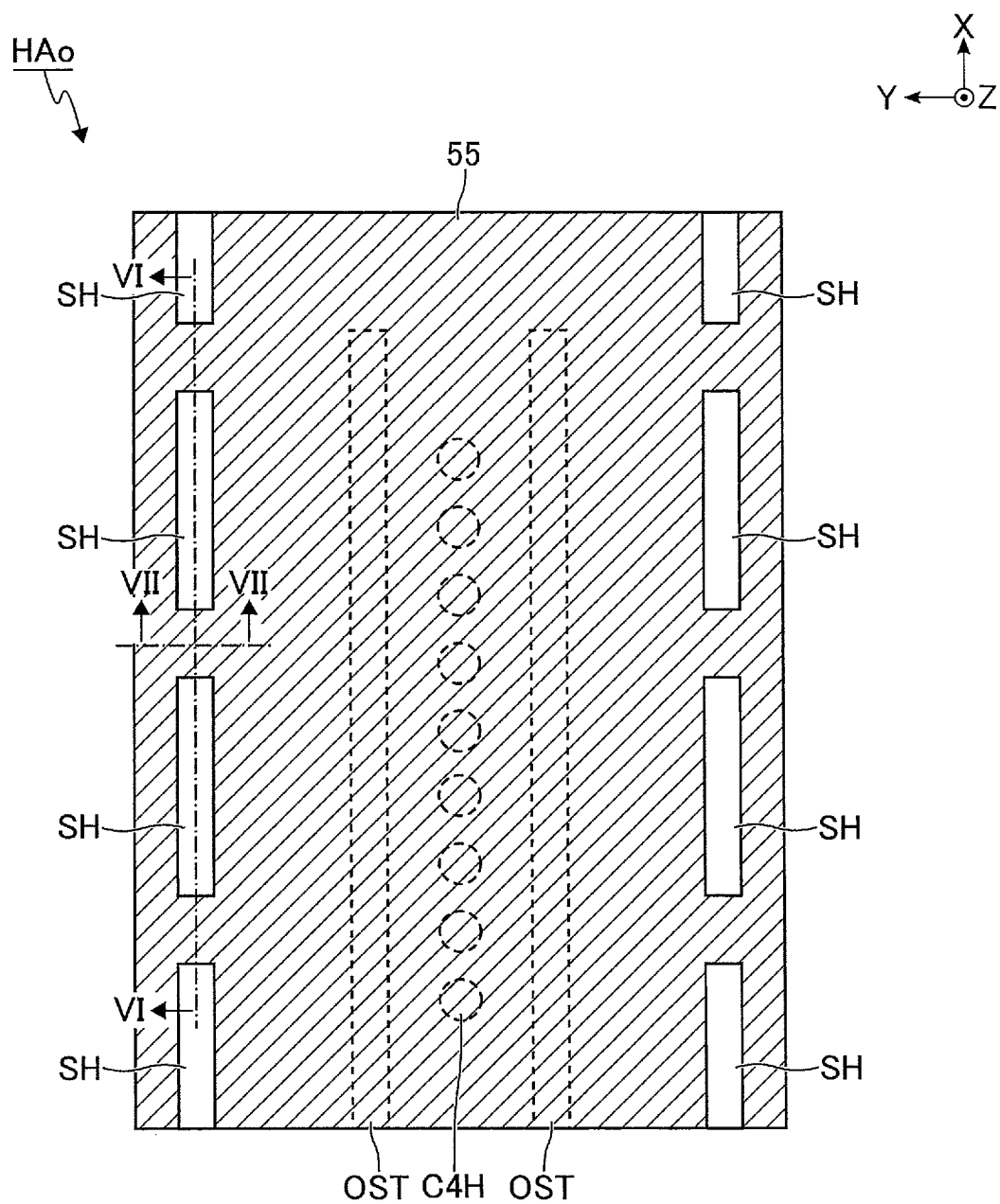
F I G. 50

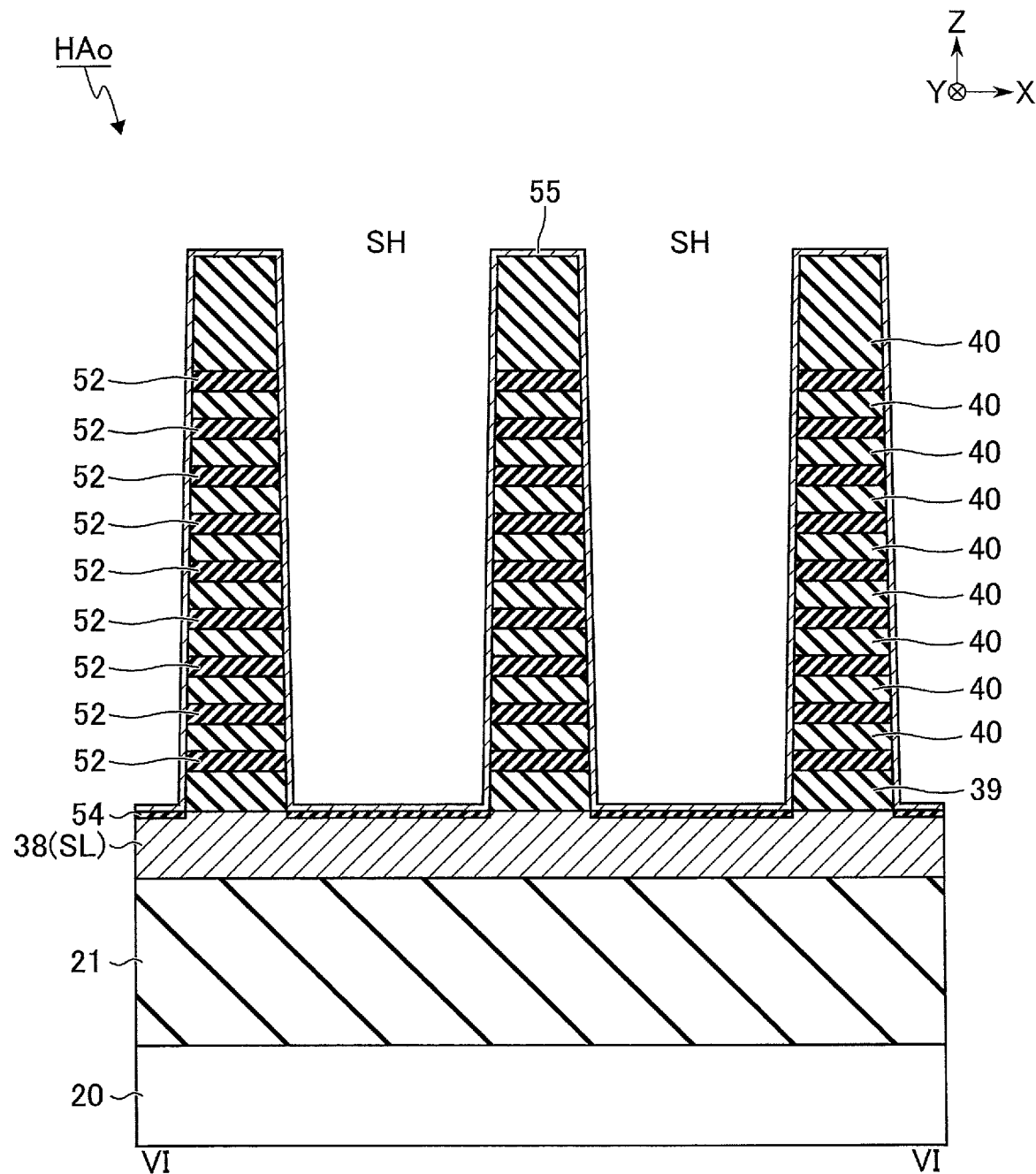
F I G. 52

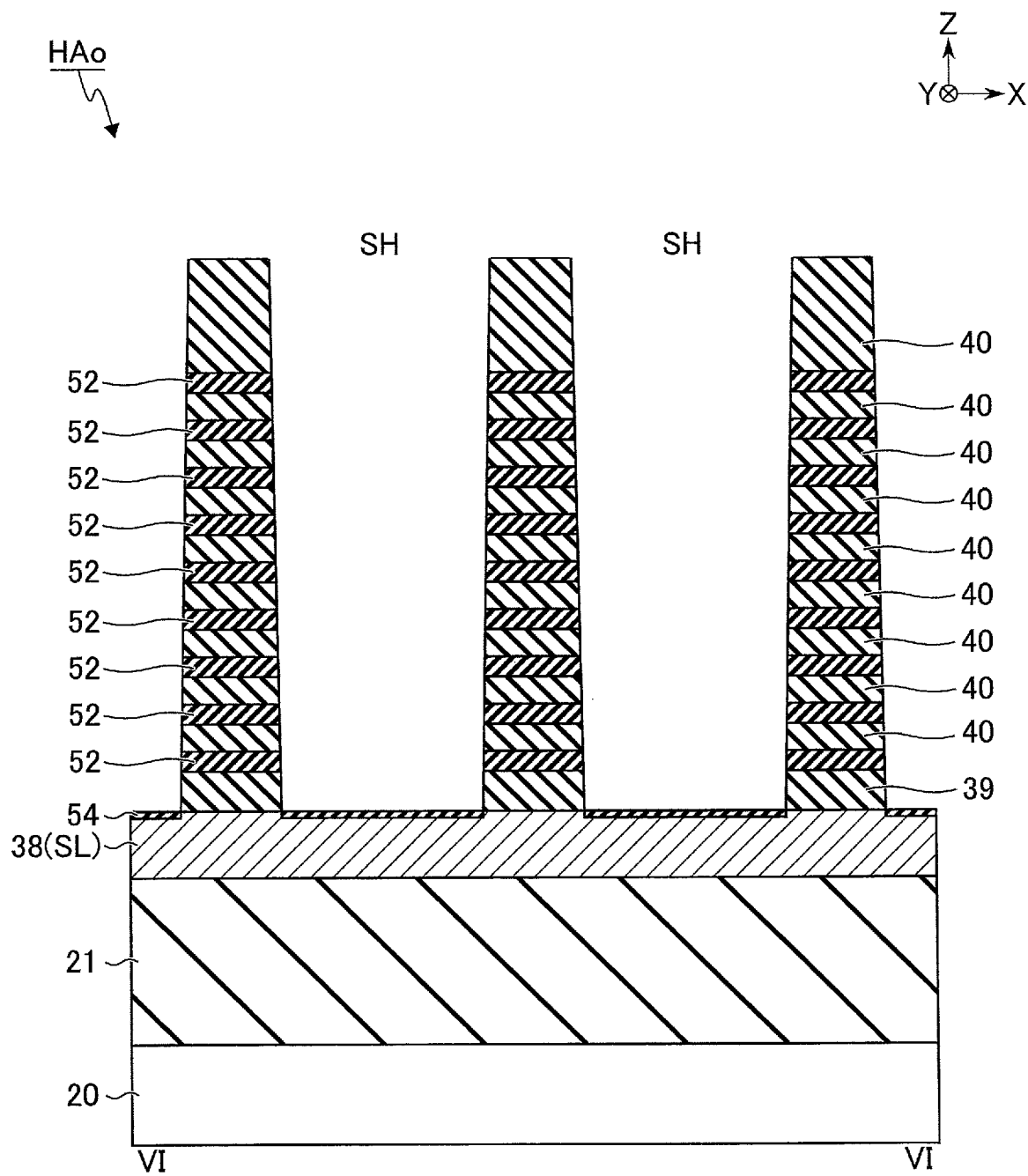
F I G. 55

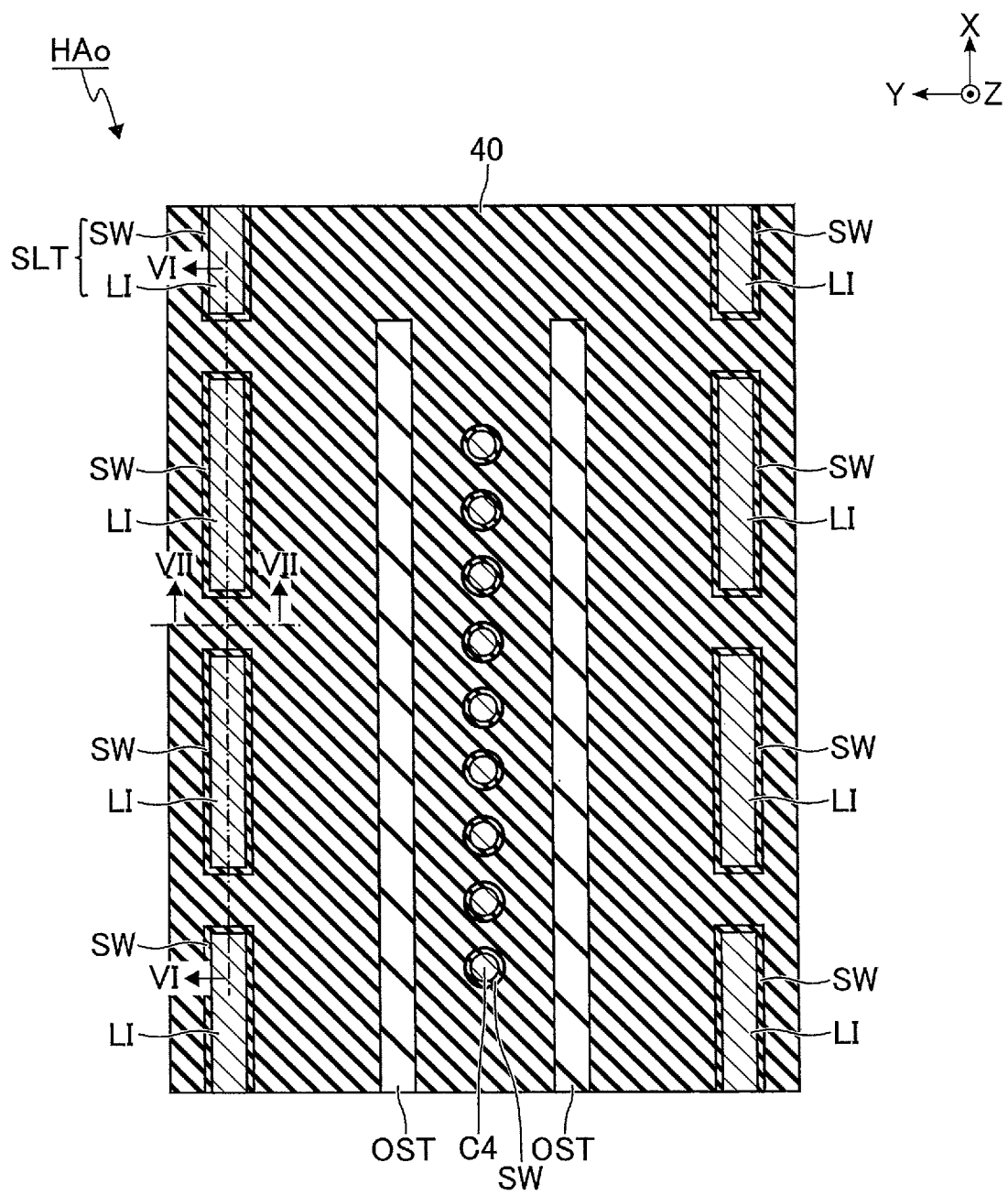
F I G. 63

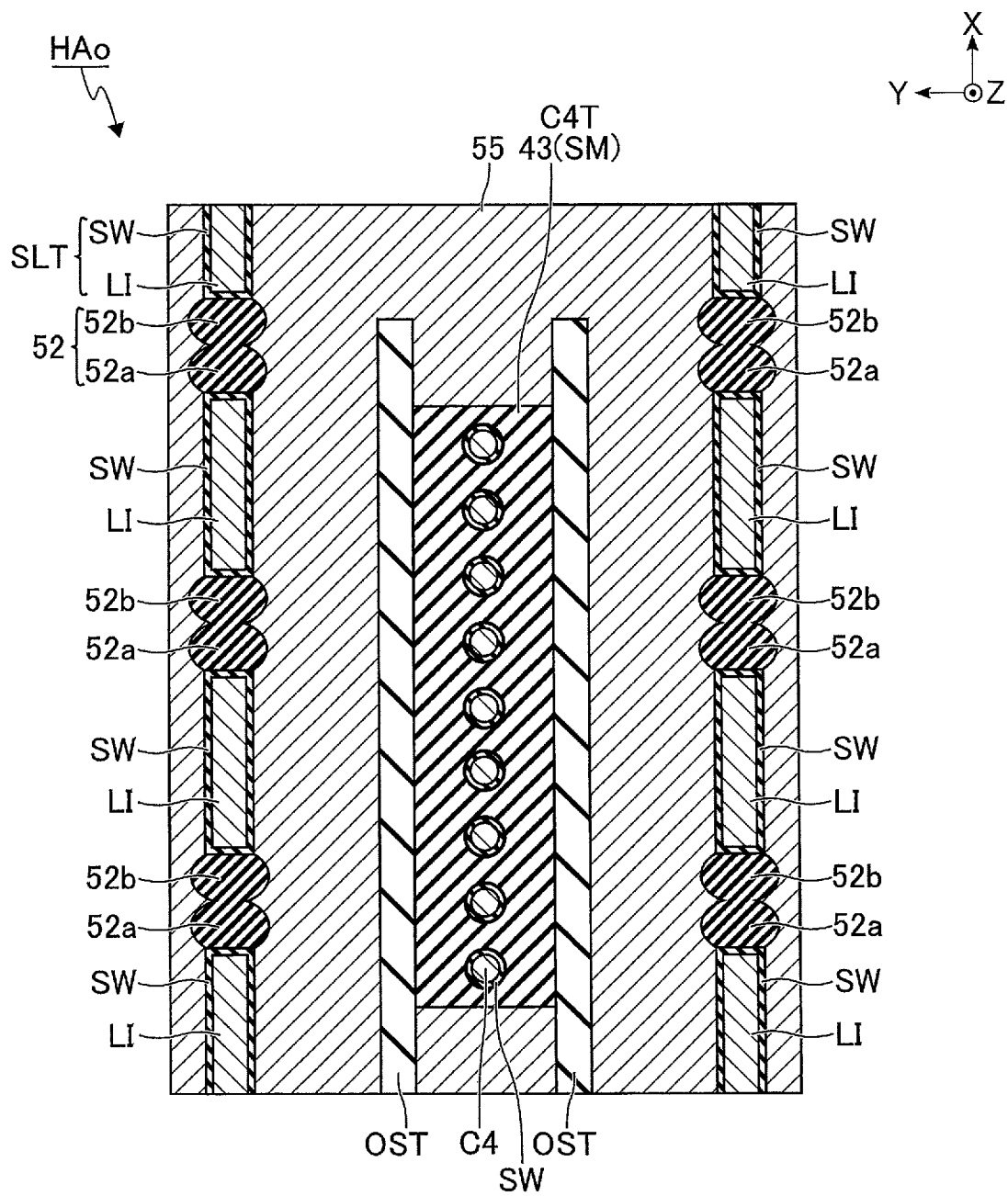
F I G. 64

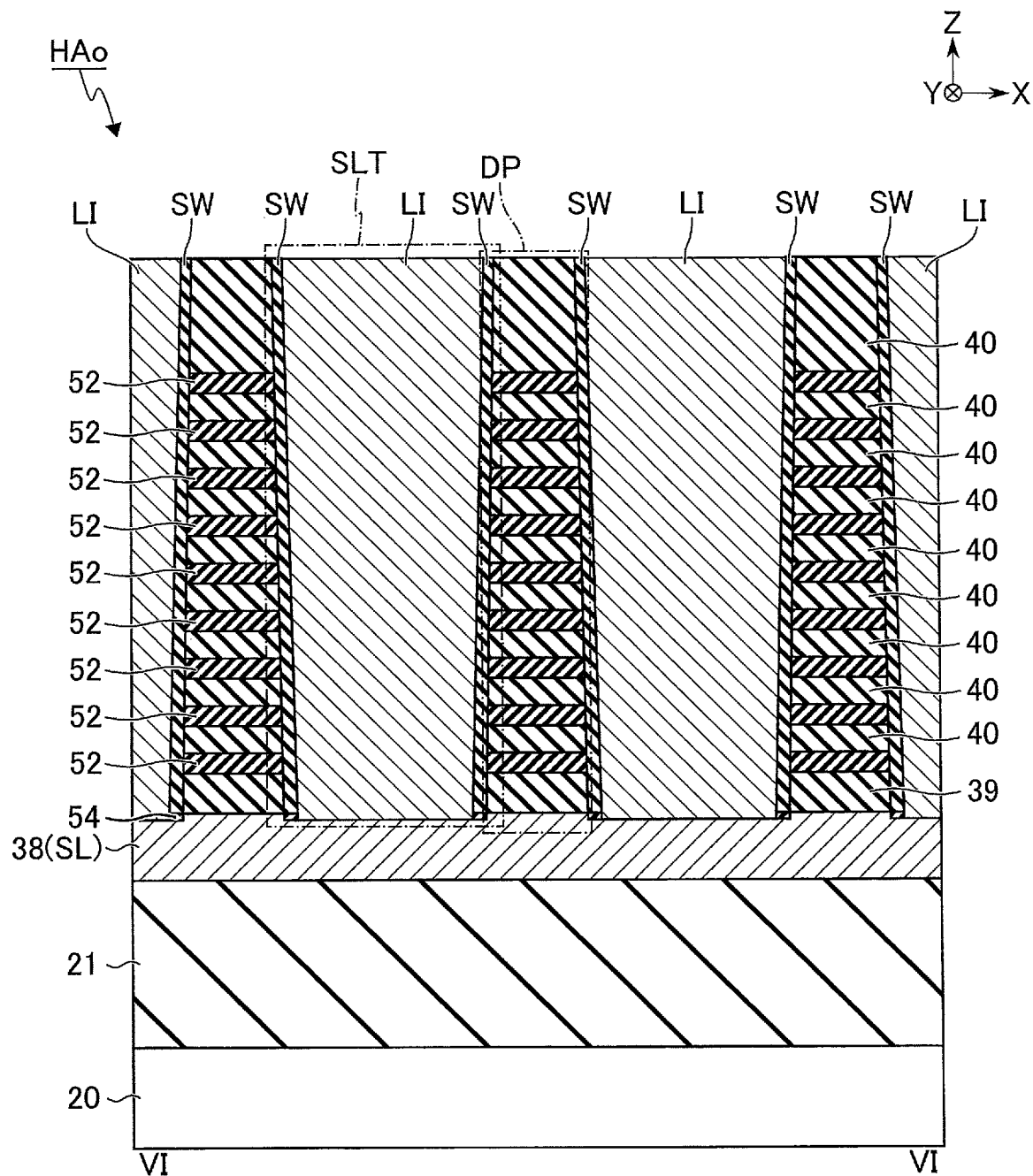
F I G. 65

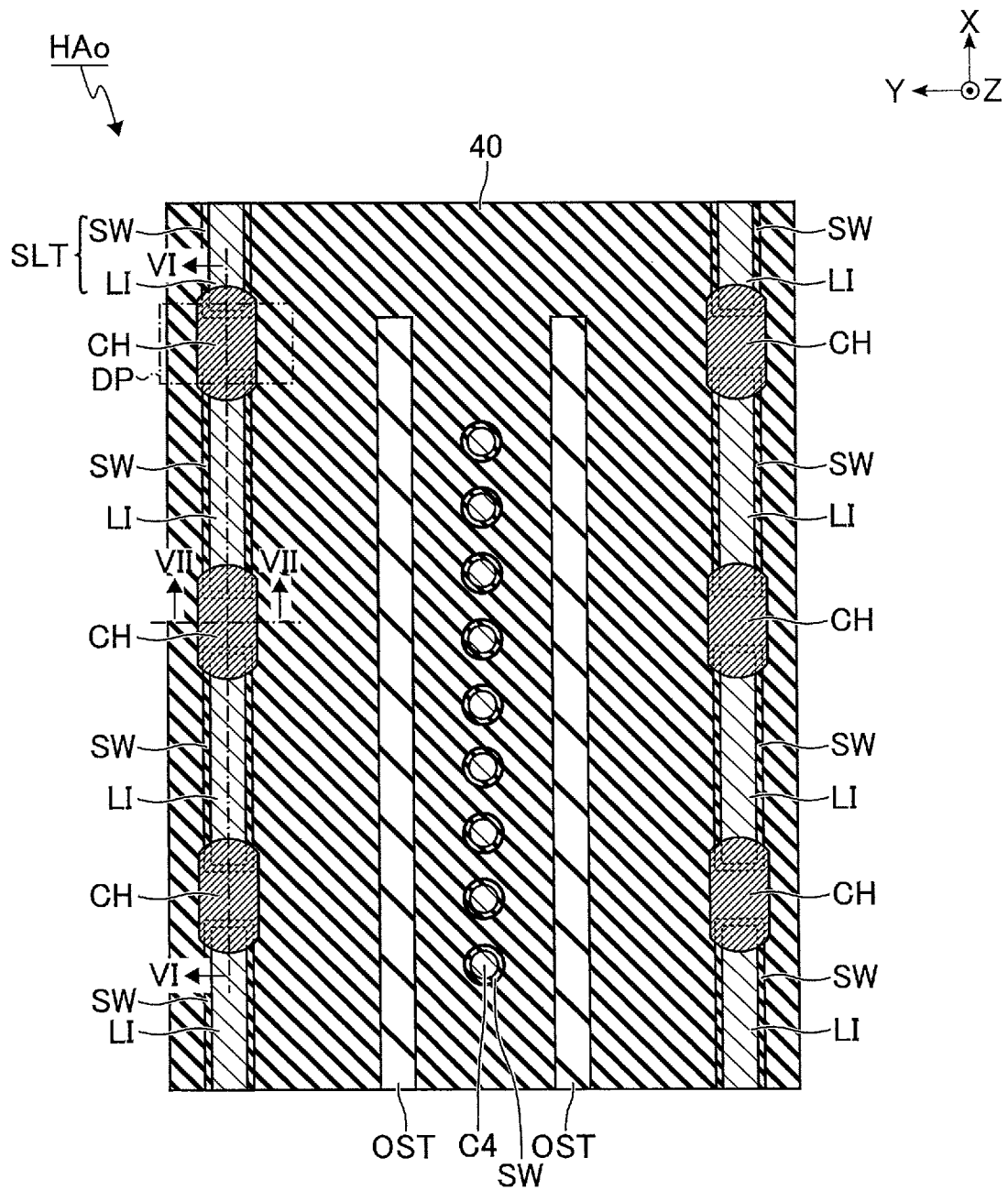
F I G. 67

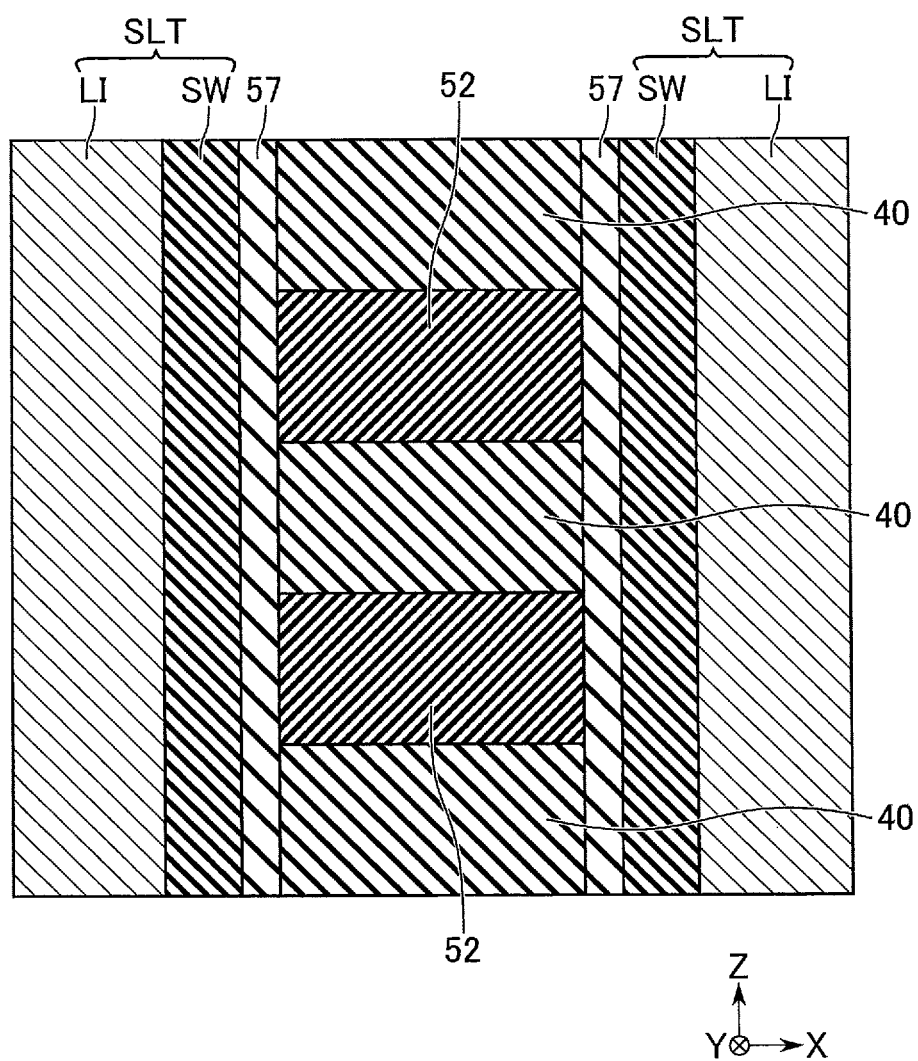
F I G. 71

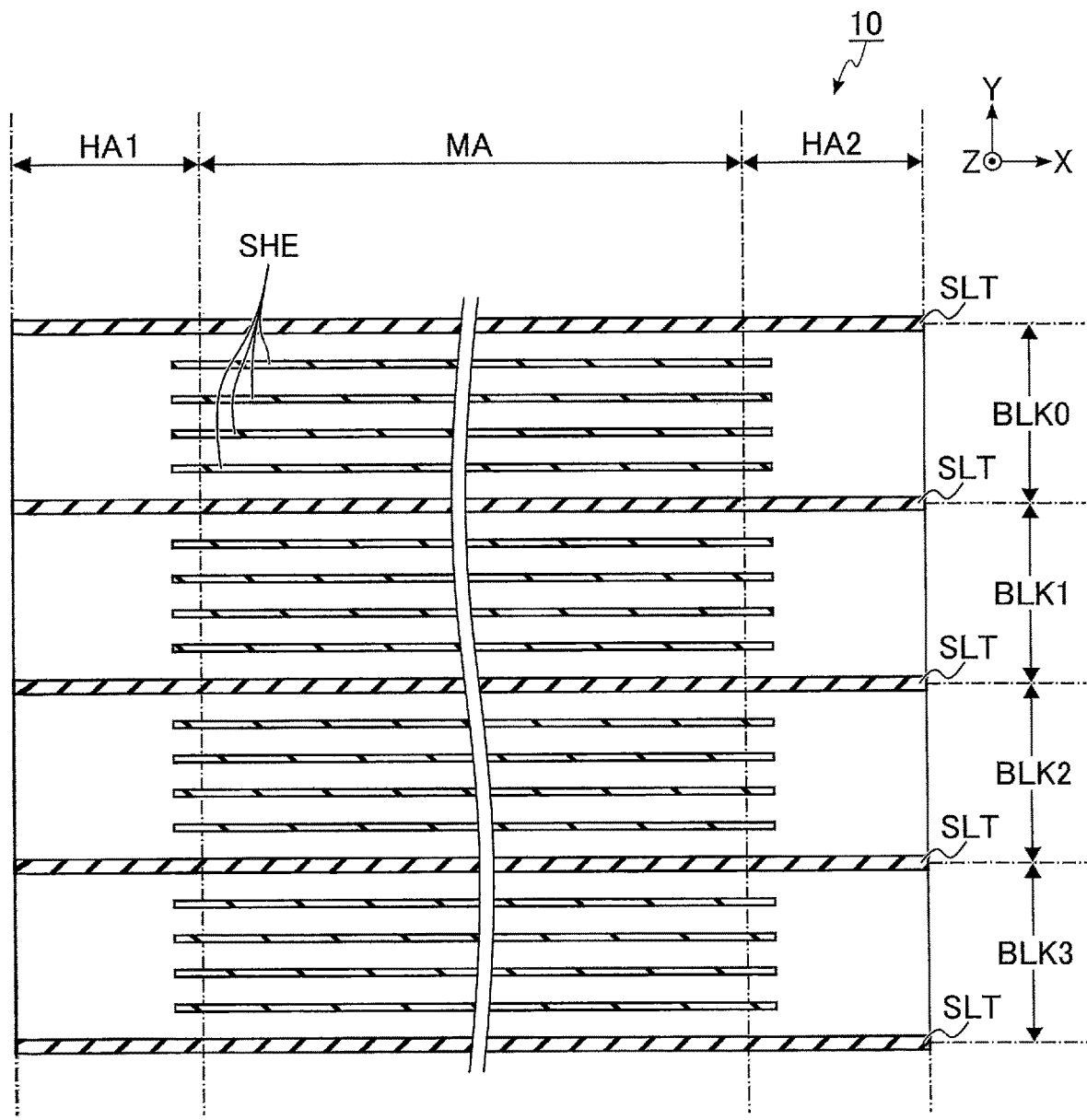
F I G. 73

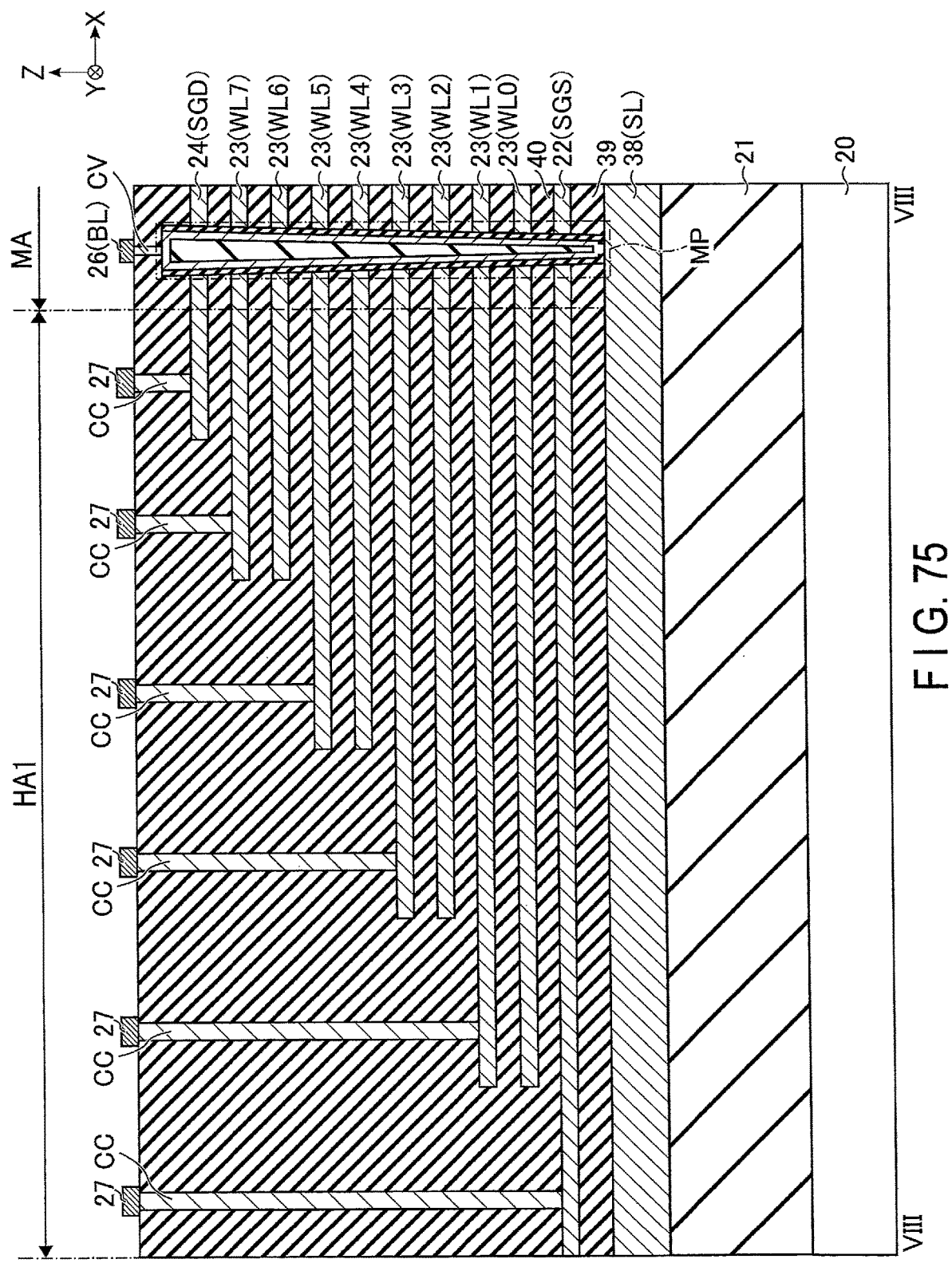
F I G. 75

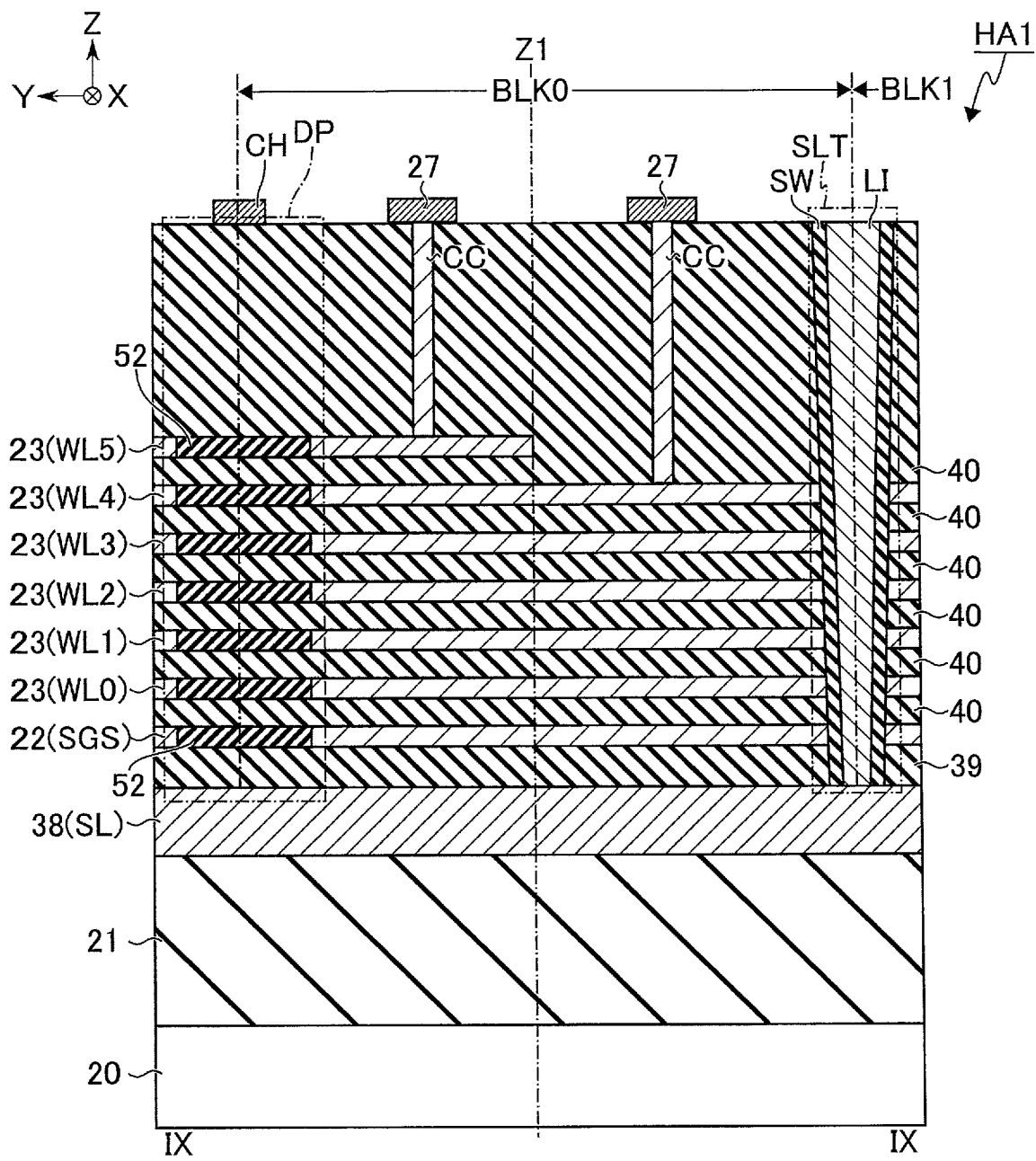
F I G. 76

SEMICONDUCTOR MEMORY DEVICE AND METHOD OF MANUFACTURING THE SEMICONDUCTOR MEMORY DEVICE

CROSS-REFERENCE TO RELATED APPLICATIONS

This application is based upon and claims the benefit of priority from Japanese Patent Application No. 2021-152067, filed Sep. 17, 2021, the entire contents of which are incorporated herein by reference.

FIELD

Embodiments described herein relate generally to a semiconductor memory device and a method of manufacturing the semiconductor memory device.

BACKGROUND

A NAND flash memory is known as a semiconductor memory device capable of storing data in a nonvolatile manner. A semiconductor memory device such as a NAND flash memory may adopt a three-dimensional memory structure for higher integration and higher capacity.

BRIEF DESCRIPTION OF THE DRAWINGS

FIG. 2 is a circuit diagram showing an example of a circuit configuration of a memory cell array included in the semiconductor memory device according to the first embodiment.

FIG. 3 is a plan view showing an example of a planar structure of the memory cell array included in the semiconductor memory device according to the first embodiment.

FIG. 6 is a cross-sectional view taken along line S-S of FIG. 5 and showing an example of a cross-sectional structure of a memory pillar in the semiconductor memory device according to the first embodiment.

FIG. 7 is a cross-sectional view taken along line II-II of FIG. 4 and showing an example of a cross-sectional structure in the hookup area of the memory cell array included in the semiconductor memory device according to the first embodiment.

FIG. 9 is a cross-sectional view taken along line IV-IV of FIG. 4 and showing an example of a cross-sectional structure in the hookup area of the memory cell array included in the semiconductor memory device according to the first embodiment.

FIG. 10 is an enlarged view of an area RA shown in FIG. 4.

FIG. 14 is a flowchart showing an example of the method of manufacturing the semiconductor memory device according to the first embodiment.

FIG. 16 is a cross-sectional view taken along line VI-VI of FIG. 15 and showing an example of a cross-sectional structure during the process of manufacturing the semiconductor memory device according to the first embodiment.

FIG. 18 is a plan view taken along the surface of the uppermost insulating layer in FIG. 8 and showing an example of a planar structure during the process of manufacturing the semiconductor memory device according to the first embodiment.

FIG. 19 is a cross-sectional view taken along line VI-VI of FIG. 18 and showing an example of a cross-sectional structure during the process of manufacturing the semiconductor memory device according to the first embodiment.

FIG. 23 is a cross-sectional view taken along line VII-VII of FIG. 21 and showing an example of a cross-sectional structure during the process of manufacturing the semiconductor memory device according to the first embodiment.

FIG. 24 is a plan view taken along the surface of the uppermost insulating layer in FIG. 8 and showing an example of a planar structure during the process of manufacturing the semiconductor memory device according to the first embodiment.

FIG. 25 is a cross-sectional view taken along line VI-VI of FIG. 24 and showing an example of a cross-sectional structure during the process of manufacturing the semiconductor memory device according to the first embodiment.

FIG. 26 is a cross-sectional view taken along line VII-VII of FIG. 24 and showing an example of a cross-sectional structure during the process of manufacturing the semiconductor memory device according to the first embodiment.

FIG. 28 is a cross-sectional view taken along line VI-VI of FIG. 27 and showing an example of a cross-sectional structure during the process of manufacturing the semiconductor memory device according to the first embodiment.

FIG. 30 is a plan view taken along the surface of the uppermost insulating layer in FIG. 8 and showing an example of a planar structure during the process of manufacturing the semiconductor memory device according to the first embodiment.

FIG. 31 is a plan view taken along line V-V of FIG. 8 and showing an example of a planar structure during the process of manufacturing the semiconductor memory device according to the first embodiment.

FIG. 35 is a plan view taken along line V-V of FIG. 8 and showing an example of a planar structure during the process of manufacturing the semiconductor memory device according to the first embodiment.

FIG. 36 is a cross-sectional view taken along line VI-VI of FIG. 34 and showing an example of a cross-sectional structure during the process of manufacturing the semiconductor memory device according to the first embodiment.

FIG. 37 is a cross-sectional view taken along line VII-VII of FIG. 34 and showing an example of a cross-sectional structure during the process of manufacturing the semiconductor memory device according to the first embodiment.

FIG. 38 is a plan view taken along the surface of the uppermost insulating layer in FIG. 8 and showing an example of a planar structure during the process of manufacturing the semiconductor memory device according to the first embodiment.

FIG. 39 is a plan view taken along line V-V of FIG. 8 and showing an example of a planar structure during the process of manufacturing the semiconductor memory device according to the first embodiment.

FIG. 40 is a cross-sectional view taken along line VI-VI of FIG. 38 and showing an example of a cross-sectional structure during the process of manufacturing the semiconductor memory device according to the first embodiment.

FIG. 41 is a cross-sectional view taken along line VII-VII of FIG. 38 and showing an example of a cross-sectional structure during the process of manufacturing the semiconductor memory device according to the first embodiment.

FIG. 42 is a plan view taken along the surface of the uppermost insulating layer in FIG. 8 and showing an example of a planar structure during the process of manufacturing the semiconductor memory device according to the first embodiment.

FIG. 45 is a cross-sectional view taken along line VII-VII of FIG. 43 and showing an example of a cross-sectional structure during the process of manufacturing the semiconductor memory device according to the first embodiment.

FIG. 46 is a plan view taken along the surface of the uppermost insulating layer in FIG. 8 and showing an example of a planar structure during the process of manufacturing the semiconductor memory device according to the first embodiment.

FIG. 48 is a cross-sectional view taken along line VI-VI of FIG. 46 and showing an example of a cross-sectional structure during the process of manufacturing the semiconductor memory device according to the first embodiment.

FIG. 49 is a cross-sectional view taken along line VII-VII of FIG. 46 and showing an example of a cross-sectional structure during the process of manufacturing the semiconductor memory device according to the first embodiment.

FIG. 50 is a plan view taken along the surface of the uppermost insulating layer in FIG. 8 and showing an example of a planar structure during the process of manufacturing the semiconductor memory device according to the first embodiment.

FIG. 52 is a cross-sectional view taken along line VI-VI of FIG. 50 and showing an example of a cross-sectional structure during the process of manufacturing the semiconductor memory device according to the first embodiment.

FIG. 55 is a cross-sectional view taken along line VI-VI of FIG. 54 and showing an example of a cross-sectional structure during the process of manufacturing the semiconductor memory device according to the first embodiment.

FIG. 63 is a plan view taken along the surface of the uppermost insulating layer in FIG. 8 and showing an example of a planar structure during the process of manufacturing the semiconductor memory device according to the first embodiment.

FIG. 64 is a plan view taken along line V-V of FIG. 8 and showing an example of a planar structure during the process of manufacturing the semiconductor memory device according to the first embodiment.

FIG. 65 is a cross-sectional view taken along line VI-VI of FIG. 63 and showing an example of a cross-sectional structure during the process of manufacturing the semiconductor memory device according to the first embodiment.

FIG. 67 is a plan view taken along the surface of the uppermost insulating layer in FIG. 8 and showing an example of a planar structure during the process of manufacturing the semiconductor memory device according to the first embodiment.

FIG. 71 is an enlarged view of an area RB shown in FIG. 7 in the semiconductor memory device according to the modification of the first embodiment.

FIG. 73 is a plan view showing an example of a planar structure of a memory cell array included in a semiconductor memory device according to a third embodiment.

FIG. 75 is a cross-sectional view taken along line VIII-VIII of FIG. 74 and showing an example of a cross-sectional structure in the hookup area of the memory cell array included in the semiconductor memory device according to the third embodiment.

FIG. 76 is a cross-sectional view taken along line IX-IX of FIG. 74 and showing an example of a cross-sectional structure in the hookup area of the memory cell array included in the semiconductor memory device according to the third embodiment.

DETAILED DESCRIPTION

Figure 1:
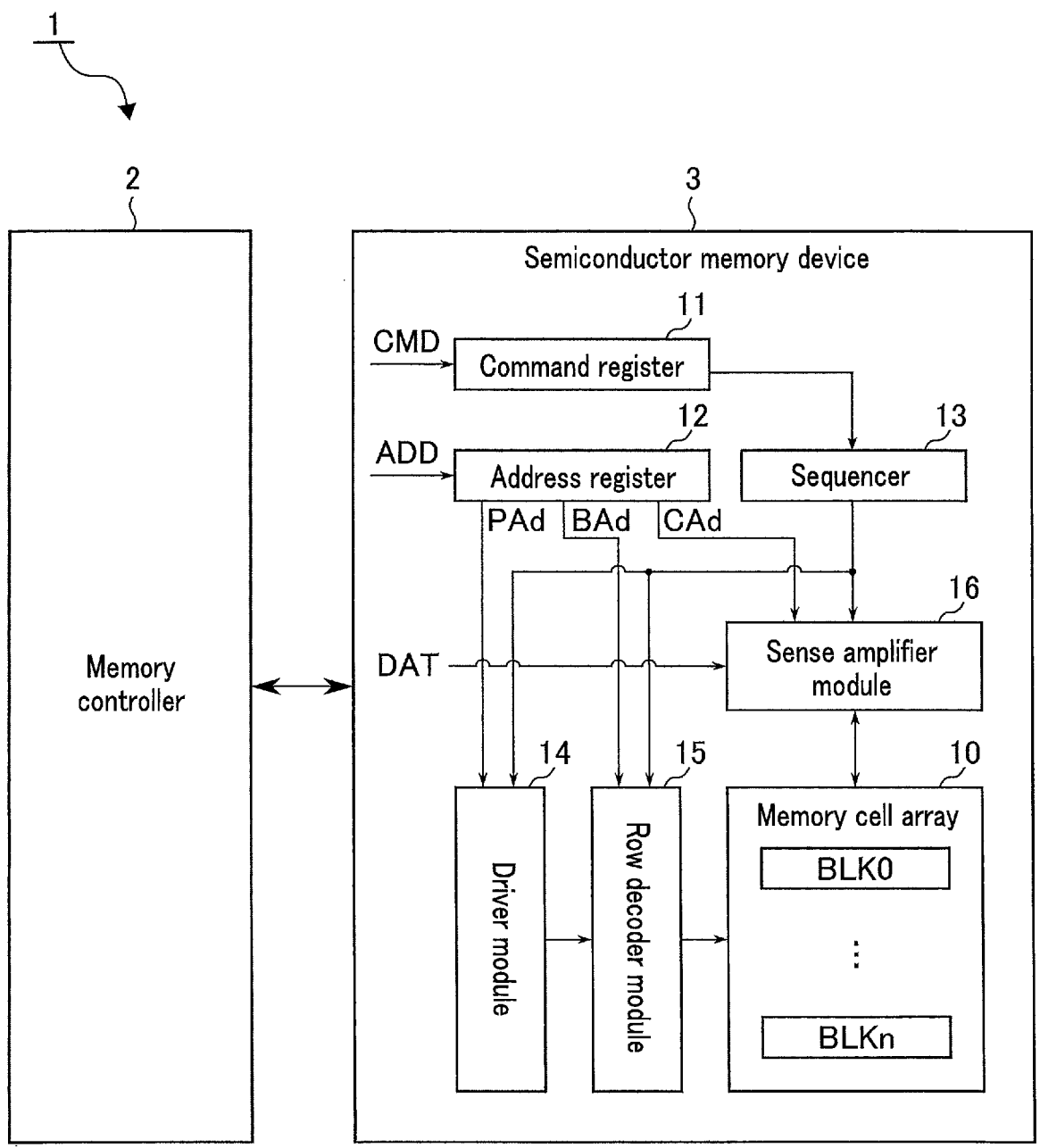
FIG. 1 is a block diagram showing a configuration of a memory system including a semiconductor memory device according to a first embodiment.

In general, according to one embodiment, a semiconductor memory device includes a plurality of interconnect layers stacked above a substrate and spaced apart from each other in a first direction; a memory pillar configured to penetrate the plurality of interconnect layers in the first direction; a first member and a second member each having a longitudinal direction set to a second direction intersecting the first direction when viewed from a top, the first member and the second member being arranged in the second direction and penetrating the plurality of interconnect layers in the first direction; and a dividing portion provided between the first member and the second member. The dividing portion includes a plurality of insulating layers spaced apart from each other in the first direction. The plurality of insulating layers each include a first portion and a second portion. The first portion is provided between the first member and the second portion. The second portion is provided between the first portion and the second member. The first portion and the second portion each have an individual arc shape when viewed from the top and are in contact with each other.

Hereinafter, embodiments will be described with reference to the accompanying drawings. The dimensions and ratios, etc. in the drawings are not always the same as the actual ones. In the following description, constituent elements having substantially the same function and configuration will be assigned the same reference numeral or symbol. In the case where elements having similar configurations are distinguished from each other in particular, their identical reference symbols may be assigned different letters or numbers.

1 First Embodiment

1.1. Configuration 1.1.1 Configuration of Memory System

A configuration of a memory system including a semiconductor memory device according to a first embodiment will be described with reference to FIG. 1. FIG. 1 is a block diagram showing a configuration of the memory system. The memory system is configured to be connected to an external host device (not shown). The memory system is, for example, a memory card such as an SD™ card, a universal flash storage (UFS), or a solid state drive (SSD). The memory system 1 includes a memory controller 2 and a semiconductor memory device 3.

The memory controller 2 is constituted by an integrated circuit such as a system-on-a-chip (SoC). The memory controller 2 controls the semiconductor memory device 3, based on a request received from the host device. Specifically, for example, the memory controller 2 writes data which is requested to be written by the host device to the semiconductor memory device 3. Furthermore, the memory controller 2 reads data which is requested to be read by the host device from the semiconductor memory device 3 and transmits the read data to the host device.

The semiconductor memory device 3 is a memory configured to store data in a nonvolatile manner. The semiconductor memory device 3 is, for example, a NAND flash memory.

Communications between the memory controller 2 and the semiconductor memory device 3 are compliant with, for example, a single data rate (SDR) interface, a toggle double data rate (DDR) interface, or an open NAND flash interface (ONFI).

1.1.2 Configuration of Semiconductor Memory Device

A configuration of the semiconductor memory device according to the first embodiment will be described with reference to FIG. 1. The semiconductor memory device 3 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer equal to or greater than 1). The block BLK is a set of a plurality of memory cells that can store data in a nonvolatile manner, and is used as, for example, a data erase unit. In the memory cell array 10, a plurality of bit lines and a plurality of word lines are provided. Each memory cell is associated with, for example, a single bit line and a single word line. A detailed configuration of the memory cell array 10 will be described later.

The command register 11 stores a command CMD received by the semiconductor memory device 3 from the memory controller 2. The command CMD includes an order to cause the sequencer 13 to execute a read operation, a write operation, an erase operation, or the like.

The address register 12 stores address information ADD received by the semiconductor memory device 3 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the overall operation of the semiconductor memory device 3. For example, the sequencer 13 controls the driver module 14, the row decoder module 15, and the sense amplifier module 16, etc., based on the command CMD stored in the command register 11, thereby executing the read operation, the write operation, the erase operation, and the like.

The driver module 14 generates voltages used in the read operation, the write operation, the erase operation, and the like. Then, the driver module 14 applies the generated voltage to a signal line corresponding to a selected word line based on, for example, the page address PA stored in the address register 12.

Based on the block address BAd stored in the address register 12, the row decoder module 15 selects one block BLK in the corresponding memory cell array 10. Then, the row decoder module 15 transfers, for example, the voltage applied to the signal line corresponding to the selected word line to the selected word line in the selected block BLK.

The sense amplifier module 16 selects a bit line based on the column address CAd stored in the address register 12. In a write operation, the sense amplifier module 16 applies a voltage to a selected bit line in accordance with write data DAT received from the memory controller 2. In a read operation, the sense amplifier module 16 determines data stored in a memory cell based on a voltage of the selected bit line, and transfers the determination result as read data DAT to the memory controller 2.

1.1.3 Circuit Configuration of Memory Cell Array

A circuit configuration of the memory cell array 10 will be described with reference to FIG. 2. FIG. 2 is a circuit diagram showing an example of a circuit configuration of the memory cell array 10. FIG. 2 shows one of the plurality of blocks BLK included in the memory cell array 10. As shown in FIG. 2, the block BLK includes, for example, five string units, SU0 to SU4. The string unit SU is a set of NAND strings NS to be described later. For example, in the write operation or the read operation, for example, NAND strings NS in the string unit SU are selected in a batch.

Each string unit SU includes a plurality of NAND strings NS that are respectively associated with bit lines BL0 to BLm (m is an integer equal to or greater than 1). Each NAND string NS includes, for example, memory cell transistors MT0 to MT7 and select transistors ST1 and ST2. Each memory cell transistor MT includes a control gate and a charge storage layer, and stores data in a nonvolatile manner. Each of the select transistors ST1 and ST2 is used for selection of a string unit SU in various operations.

In each NAND string NS, memory cell transistors MT0 to MT7 are coupled in series. A drain of the select transistor ST1 is coupled to the associated bit line BL. A source of the select transistor ST1 is coupled to one end of the memory cell transistors MT0 to MT7 coupled in series. A drain of the select transistor ST2 is coupled to the other end of the memory cell transistors MT0 to MT7 coupled in series. A source of the select transistor ST2 is coupled to a source line SL.

The control gates of the memory cell transistors MT0 to MT7 in the same block BLK are respectively coupled to the word lines WL0 to WL7. Gates of the select transistors ST1 in the string units SU0 to SU4 are respectively coupled to select gate lines SGD0 to SGD4. Gates of the select transistors ST2 in the string units SU0 to SU4 are commonly coupled to a select gate line SGS.

The bit lines BL0 to BLm are respectively assigned different column addresses. Each of the bit lines BL is shared by the NAND strings NS assigned the same column address among a plurality of blocks BLK. A set of word lines WL0 to WL7 is provided for each block BLK. The source line SL is shared by, for example, the plurality of blocks BLK.

A set of memory cell transistors MT commonly coupled to a word line WL in one string unit SU may be referred to as a cell unit CU, for example. For example, the storage capacity of the cell unit CU constituted by memory cell transistors MT respectively configured to store 1-bit data is defined as "1-page data". The cell unit CU may have a storage capacity of 2-page data or more in accordance with the number of bits of data stored in the memory cell transistors MT.

The circuit configuration of the memory cell array 10 included in the semiconductor memory device 3 according to the first embodiment is not limited to the configuration described in the above. For example, the number of string units SU included in each block BLK may be any number. The numbers of memory cell transistors MT, select transistors ST1, and select transistors ST2 included in each NAND string NS may be any number.

1.1.4 Structure of Memory Cell Array

Next, an example of the structure of the memory cell array 10 will be described. In the drawings mentioned below, the X direction corresponds to the extending direction of the word lines WL, the Y direction corresponds to the extending direction of the bit lines BL, and the Z direction corresponds to the vertical direction to the surface of a semiconductor substrate which is used for formation of the semiconductor memory device 3. In the plan views, hatching is added as appropriate to make the views easy to see. The hatching added to the plan views is not necessarily related to the materials or characteristics of the hatched components. In the cross-sectional views, some of the components are omitted as appropriate to make the views easy to see.

1.1.4.1 Outline of Planar Structure

An outline of a planar structure of the memory cell array 10 will be described with reference to FIG. 3. FIG. 3 is a plan view showing an example of a planar structure of the memory cell array 10. FIG. 3 shows areas corresponding to the four blocks BLK0 to BLK3. The memory cell array 10 is divided in the X direction into memory areas MA1 and MA2 and a hookup area HA, for example. The hookup area HA is arranged between the memory area MA1 and the memory area MA2. The memory areas MA1 and MA2 and the hookup area HA include stacked interconnects in which the select gate line SGS, the word lines WL0 to WL7, and the select gate line SGD are stacked with a space therebetween in the Z direction in order from a lower layer. Hereinafter, the plurality of interconnects stacked with a space therebetween in the Z direction will be referred to as stacked interconnects. The memory areas MA1 and MA2 are areas including a plurality of NAND strings NS. The hookup area HA is an area used for the coupling between the stacked interconnects and the row decoder module 15.

The memory cell array 10 includes a plurality of members SLT and SHE.

The plurality of members SLT are arranged in the Y direction. The member SLT extends in the X direction and crosses the memory areas MA1 and MA2 and the hookup area HA. One block BLK is arranged between the two members SLT arranged in the Y direction. That is, each member SLT is provided between the two blocks adjacent in the Y direction. The member SLT has a structure in which, for example, an insulator or a conductor is embedded. The member SLT divides the stacked interconnects in the two blocks adjacent in the Y direction. FIG. 3 shows the example in which the five members SLT arranged in the Y direction are provided. Each of the four blocks BLK0 to BLK3 is arranged between the five members SLT. The member SLT has a plurality of portions (not shown) extending in the X direction. Each of the portions of the member SLT will be described later in detail.

The plurality of members SHE are arranged in each of the memory areas MA1 and MA2 in each block BLK. For example, in the memory area MA1, the plurality of members SHE are arranged in the Y direction. The member SHE extends in the X direction and crosses the memory area MA1. One end of the member SHE is included in the hookup area HA. The member SHE has a structure in which, for example, an insulator is embedded. The member SHE divides the select gate lines SGD adjacent in the Y direction and does not divide the word lines WL and the select gate lines SGS provided below the select gate lines SGD. The same applies to the memory area MA2. Each of the areas separated by the members SLT and SHE corresponds to a single string unit SU.

The hookup area HA includes a plurality of hookup portions HP arranged in the Y direction. Each of the hookup portions HP is arranged for each set of two blocks BLK. In other words, each of the hookup portions HP includes, in the hookup area HA, part of the two adjacent blocks BLK and part of the member SLT provided between the two blocks BLK. Hereinafter, the odd-numbered hookup portion HP will also be referred to as an "HPo", and the even-numbered hookup portion HP will also be referred to as an "HPe".

Each of the hookup portions HP includes a contact area CCT, two contact areas C4T, and four members OST.

The contact area CCT is an area having a portion (terrace portion) in which each interconnect in the stacked interconnects does not overlap an interconnect in a higher layer. The shape of the terrace portion is similar to a step, a terrace, etc. The contact area CCT includes part of the two adjacent blocks BLK and part of the member SLT provided between the two blocks BLK.

The contact area C4T is an insulating area that penetrates through the stacked interconnects. One contact area C4T is provided in each block BLK. Two contact areas C4T in the hookup portion HP are arranged in the Y direction. The contact area CCT and the two contact areas C4T are arranged in the X direction.

Four members OST are provided in such a manner that each set of two members OST is provided in each of the two adjacent blocks BLK. That is, two members OST are provided in one block BLK. The member OST extends in the X direction. The two members OST in the block BLK are arranged in the Y direction. In each block BLK, the contact area C4T is sandwiched between the two members OST. In other words, the two members OST are respectively in contact with the two side surfaces in the Y direction of the contact area C4T. The member OST has a structure in which, for example, an insulator is embedded.

The stacked interconnects except for the select gate lines SGD (that is, the select gate line SGS and the word lines WL) in each block. BLK bypass the contact area C4T sandwiched between the members OST, thereby being electrically coupled between the memory areas MA1 and MA2, that is, in the hookup area HA. That is, the stacked interconnects have a portion that is arranged with the members OST and the contact area C4T in the Y direction. In other words, the stacked interconnects have a portion provided between the member OST and the member SLT in the Y direction.

In the hookup areas HA, the contact areas CCT and C4T in each hookup portion HP are arranged, for example, in a staggered pattern. Specifically, the arrangement of the contact areas CCT and C4T in the hookup portion HPe is similar to the arrangement obtained by inverting the contact areas CCT and C4T in the hookup portion HPo in the X direction. That is, in the hookup portion HPo, the contact area CCT is arranged on the memory area MA1 side while the contact areas C4T are arranged on the memory area MA2 side. In the hookup portion HPe, the contact areas C4T are arranged on the memory area MA1 side while the contact area CCT is arranged on the memory area MA2 side.

The example in FIG. 3 shows the case provided with four blocks BLK. However, in the case provided with five or more blocks BLK, for example, the structure shown in FIG. 3 is arranged repeatedly in the Y direction.

The planar structure of the memory cell array 10 is not limited to the structure described in the above. For example, the number of members SHE provided between the two members SLT adjacent in the Y direction may be designed to be any number based on the number of string units SU in the block BLK.

1.1.4.2 Memory Area and Hookup Area (Planar Structure)

Figure 4:
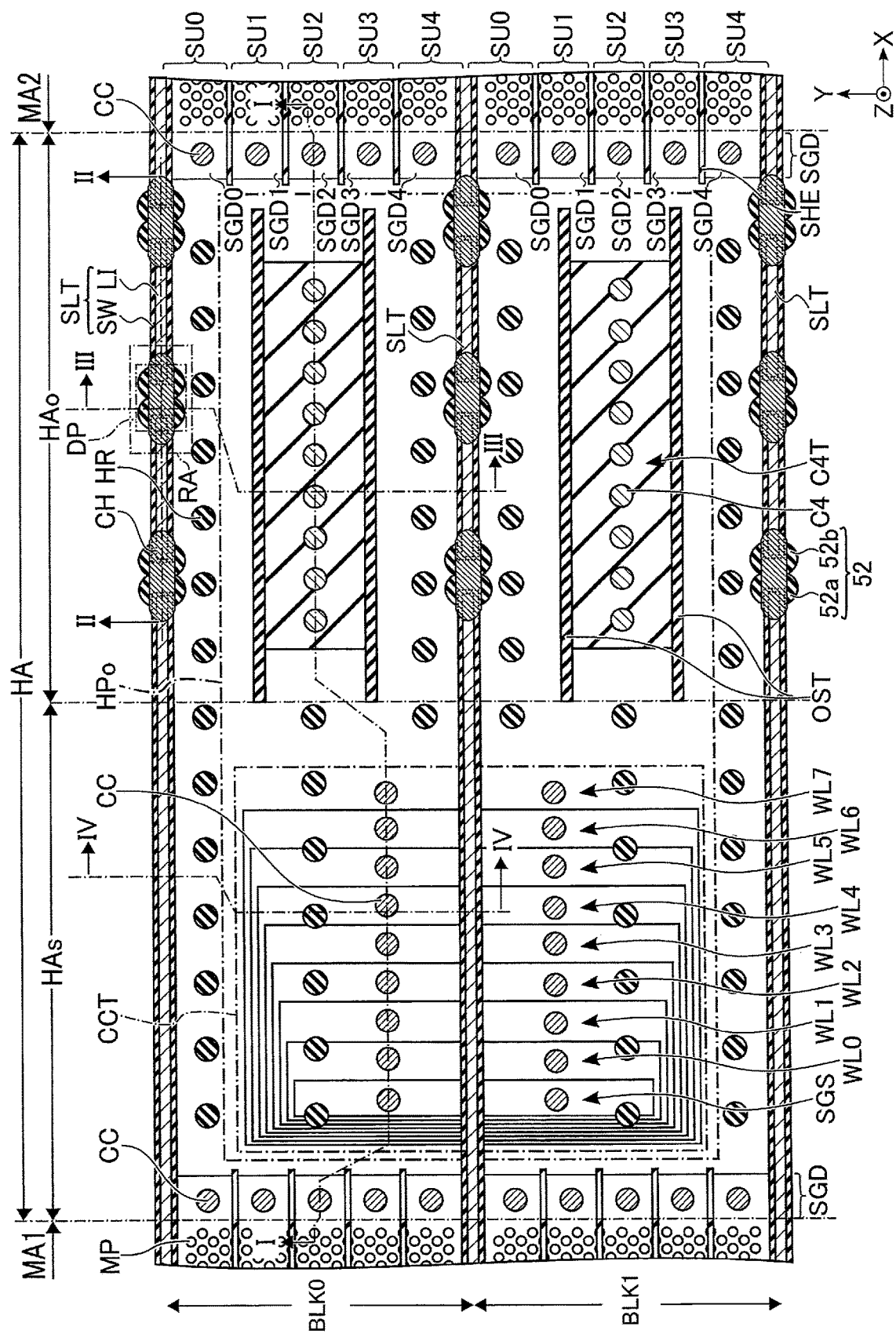
FIG. 4 is a plan view showing an example of a detailed planar structure in a hookup area of the memory cell array included in the semiconductor memory device according to the first embodiment.

The planar structure of the memory areas MA1 and MA2 and the hookup area HA will be described in detail with reference to FIG. 4. FIG. 4 is a plan view showing an example of a detailed planar structure in the hookup area HA of the memory cell array 10. FIG. 4 shows the hookup area HA and part of the memory areas MA1 and MA2 in the two blocks BLK0 and BLK1. Each block BLK is divided by the members SLT and SHE into the string units SU0 to SU4. Interlayer insulating layers are omitted. Hereinafter, the hookup area HA including the contact area C4T will also be referred to as "HAo", and the hookup area HA including the contact area CCT will also be referred to as "HAs".

The memory cell array 10 further includes a plurality of dividing portions DP, a plurality of conductors CH, a plurality of contact plugs CC and C4, a plurality of support pillars HR, and a plurality of memory pillars MP.

First, a structure of the memory pillars MP in the memory areas MA1 and MA2 will be described.

The memory pillar MP functions, for example, as one NAND string NS. The plurality of memory pillars MP are provided in the memory areas MA1 and MA2. The number of memory pillars MP shown in FIG. 4 is schematic, and the number of memory pillars MP is not limited to the one shown in FIG. 4.

Next, a structure of the members SLT, the dividing portions DP, the conductors CH, the contact plugs CC, and the support pillars HR in the hookup area HA will be described.

The member SLT includes a contact plug LI and an insulator SW. The members SLT are provided in such a manner that a plurality of line-shaped portions in which the X direction is set to the longitudinal direction when seen from a top view (when viewed from the upper side of the drawing sheet of FIG. 4) are arranged in the X direction. A distance between the two members SLT adjacent in the X direction is smaller than, for example, a distance between the member SLT and the member OST (an insulating area including the contact areas C4T and the two members OST) in the Y direction. The contact plug LI is a conductor that extends in the XZ plane for each of the portions in the member SLT. The contact plug LI is formed into a line shape corresponding to each of the line-shaped portions in the member SLT, and couples the source line SL and an interconnect provided above the memory cell array 10. The contact plug LI is made of a conductive material and includes, for example, tungsten. The insulator SW is provided on a side surface of the contact plug LI. In other words, the contact plug LI is surrounded by the insulators SW in a plan view. The contact plug LI is not in contact with the stacked interconnects. The insulator SW is made of an insulating material and includes, for example, silicon oxide.

The dividing portion DP is provided between the two members SLT arranged in the X direction. For example, in the hookup area HAo, the member SLT is divided by the dividing portions DP into a plurality of portions in the X direction. That is, in the X direction, the divided members SLT and the dividing portions DP are alternately arranged. In the example shown in FIG. 4, three dividing portions DP are provided in the X direction in the hookup area HAo. The three dividing portions DP are in contact with the hookup area HAo, and are arranged in positions facing the contact area. C4T in the Y direction. In other words, the dividing portions DP and the insulating area including the contact area C4T and the two members OST are arranged in the Y direction. The three dividing portions DP divide the member SLT into four portions.

The above example described the case in which the dividing portions DP are provided in the hookup area HAo; however, the arrangement of the dividing portions DP is not limited to the described one. For example, the dividing portions DP may be provided in the hookup area HAs or the memory areas MA1 and MA2. That is, the member SLT may be divided in the hookup area HAs or the memory areas MA1 and MA2.

The dividing portion DP includes a plurality of insulating layers 52. The plurality of insulating layers 52 are respectively provided in the same layers as the select gate lines SGS and the word lines WL0 to WL7. That is, the plurality of insulating layers 52 are stacked with a space therebetween in the Z direction and are respectively adjacent to the select gate lines SGS and the word lines WL0 to WL7 respectively provided in the same layers as the insulating layers 52. The insulating layer 52 includes a first portion 52a and a second portion 52b. The first portion 52a is provided between the second portion 52b and one of the two members SLT adjacent in the X direction. The second portion 52b is provided between the other member SLT and the first portion 52a. The first portion 52a and the second portion 52b each have an individual arc shape when viewed from a top, for example, and come into contact with each other in the X direction. The insulating layer 52 is made of an insulating material and includes, for example, silicon oxide.

The conductor CH electrically couples the two contact plugs LI adjacent in the X direction. The conductor CH extends in the X direction. The conductor CH is provided on the end portions in the X direction of the two members SLT adjacent in the X direction and on the dividing portion DP. The end portions in the X direction of the conductor CH are arranged on the end portions of the contact plugs LI of the two members SLT divided by the dividing portion DP. The conductor CH is made of a conductive material.

The contact plugs CC electrically couple the select gate lines SGS and SGD and the word lines WL0 to WL7 to an interconnect provided above the memory cell array 10. The contact plug CC is a conductor. The contact plugs CC are provided on the terrace portions of the select gate lines SGD in the hookup area HAs, and the terrace portions of the select gate line SGS and the word lines WL in the contact area CCT. The contact plugs CC are provided on the terrace portions of the select gate lines SGD in the hookup area HAo. The contact plug CC is made of a conductive material and includes, for example, tungsten.

The support pillar HR is an insulator that penetrates through the stacked interconnects. The support pillar HR functions as a pillar that supports an interlayer insulating layer when an air gap is formed in an area corresponding to the stacked interconnects during a manufacturing process, for example. The support pillars HR are arranged as appropriate in an area that is included in the hookup area HA and excludes the members SLT, SHE, and OST, the contact plugs CC, and the contact areas C4T.

Next, the structure of the contact area CCT will be described.

In the contact area CCT, the select gate line SGS and the word lines WL0 to WL7 respectively have terrace portions. In the example shown in FIG. 4, the terrace portions of the select gate line SGS and the word lines WL0 to WL7 are provided in such a manner as to form a stepwise shape having steps in the X direction. In other words, the contact area CCT has a staircase portion in which the select gate line SGS and the word lines WL0 to WL7 respectively have portions drawn out in a stepwise manner. The contact area CCT includes the plurality of contact plugs CC and the plurality of support pillars HR. The plurality of contact plugs CC are respectively provided on the terrace portions of the select gate line SGS and the word lines WL0 to WL7 in each block BLK. In the contact area CCT, the plurality of contact plugs CC in each block BLK are arranged in the X direction, for example. The plurality of contact plugs CC may not be arranged in the X direction and may be shifted in the Y direction. The support pillars HR are arranged as appropriate in an area excluding the contact plugs CC.

Next, the structure of the contact area C4T will be described.

The contact area C4T is an insulating area that penetrates through the source line SL, the select gate lines SGS and SGD, and the word lines WL0 to WL7. The contact area C4T includes the plurality of contact plugs C4. The contact plug C4 electrically couples an interconnect provided above the memory cell array 10 to a circuit (for example, the row decoder module 15) arranged below the memory cell array 10. The contact plug C4 is a conductor. The plurality of contact plugs C4 respectively correspond to, for example, the select gate line SGS and the word lines WL0 to WL7. The plurality of contact plugs C4 are arranged in the X direction, for example. The plurality of contact plugs C4 may not be arranged in the X direction and may be shifted in the Y direction. The contact plug C4 is in contact with none of the select gate lines SGS and SGD and the word lines WL0 to WL7. The contact plug C4 is made of a conductive material and includes, for example, tungsten.

(Cross-Sectional Structure)

Figure 5:
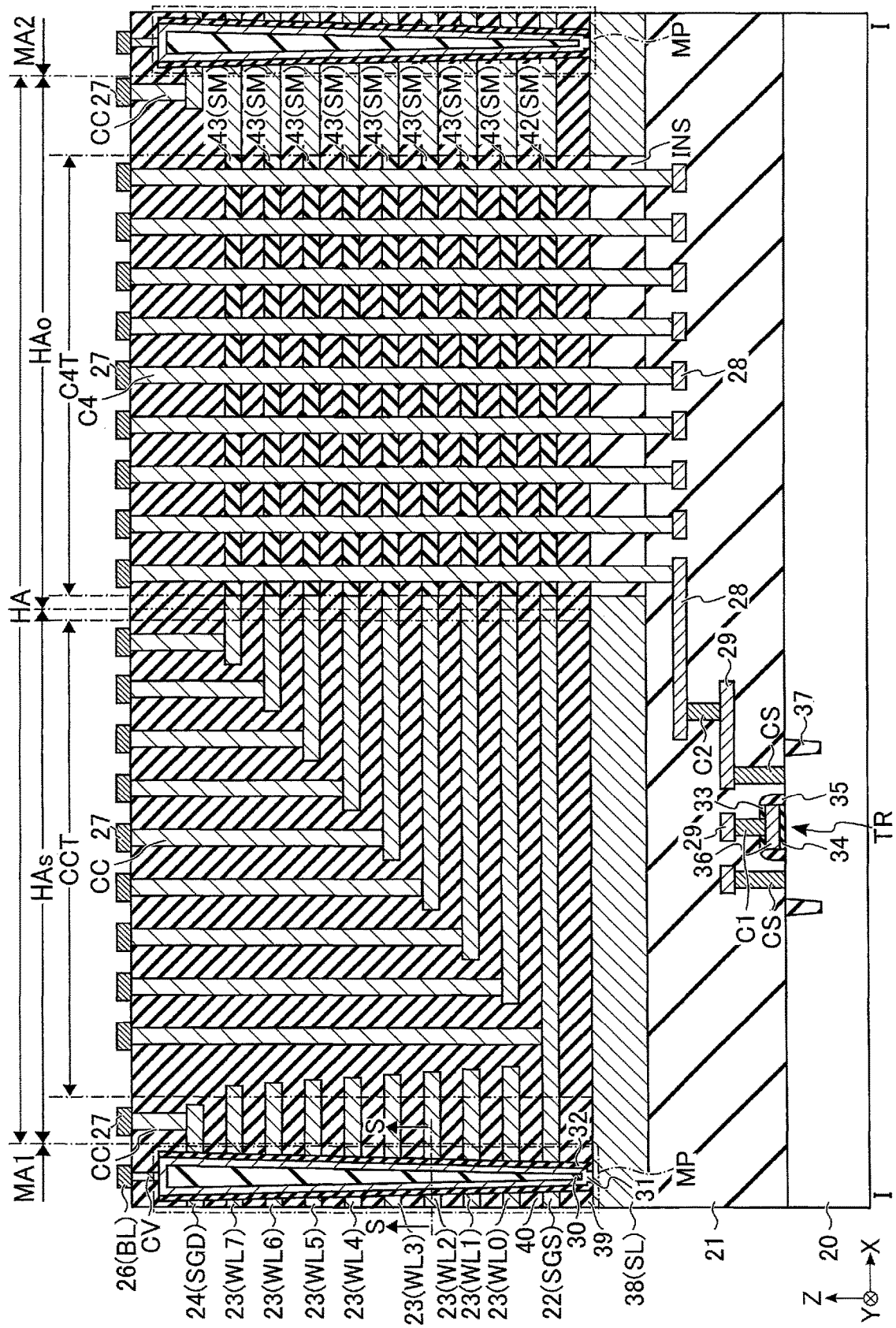
FIG. 5 is a cross-sectional view taken along line I-I of FIG. 4 and showing an example of a cross-sectional structure in the hookup area of the memory cell array included in the semiconductor memory device according to the first embodiment.

A cross-sectional structure of the memory cell array 10 will be described with reference to FIG. 5. FIG. 5 is a cross-sectional view taken along line I-I of FIG. 4. FIG. 5 shows the hookup area HA and part of the memory areas MA1 and MA2.

An insulating layer 21 is provided on the semiconductor substrate 20. The insulating layer 21 is made of an insulating material and includes, for example, silicon oxide. An interconnect layer 38 is provided on the insulating layer 21. The interconnect layer 38 is formed into, for example, a plate shape extending along the XY plane, and is used as the source line SL. The interconnect layer 38 is made of a conductive material and includes, for example, silicon doped with phosphorus.

An insulating layer 39 is provided on the interconnect layer 38. The insulating layer 39 is made of an insulating material and includes, for example, silicon oxide. An interconnect layer 22 is provided on the insulating layer 39. The interconnect layer 22 is formed into a plate shape extending along the XY plane, for example. The interconnect layer 22 is used as the select gate line SGS. The interconnect layer 22 is made of a conductive material and includes, for example, tungsten.

A plurality of insulating layers 40 and a plurality of interconnect layers 23 are alternately stacked one by one on the interconnect layer 22. In other words, the plurality of interconnect layers 23 with a space therebetween in the Z direction are provided above the interconnect layer 22. An interconnect layer 23 is formed into a plate shape extending along the XY plane, for example. The plurality of interconnect layers 23 are respectively used as the word lines WL0 to WL7, in the order from the side of the semiconductor substrate 20. The insulating layer 40 is made of an insulating material and includes, for example, silicon oxide. The interconnect layer 23 is made of a conductive material and includes, for example, tungsten.

The insulating layer 40 is provided on the uppermost interconnect layer 23. An interconnect layer 24 is provided on the insulating layer 40 on the uppermost interconnect layer 23. The interconnect layer 24 is formed into a plate shape extending along the XY plane, for example. The interconnect layer 24 is used as the select gate line SGD. The interconnect layer 24 is made of a conductive material and includes, for example, tungsten.

Each of the interconnect layers 22 to 24 includes areas (corresponding to MA1 and MA2) in which the memory pillars MP are arranged, and an area (corresponding to HA) in which the memory pillars MP are not arranged. In each of the interconnect layers 22 to 24, the area in which the memory pillars MP are not arranged further includes an area (corresponding to HAo) formed in such a manner as to surround the insulating area including the contact area C4T and the two member OST, and an area (corresponding to HAs) having a staircase portion in which the interconnect layers 22 to 24 respectively have portions drawn out in a stepwise manner.

Examples of the method of forming the interconnect layers 22 to 24 include the method (hereinafter referred to as "replace") of forming interconnect layers 22 to 24 by forming a structure corresponding to the interconnect layers 22 to 24 with sacrificial layers and replacing the sacrificial layers with a conductive material. In the present embodiment, a sacrificial layer 42 corresponds to the interconnect layer 22, and a sacrificial layer 43 corresponds to the interconnect layer 23. The sacrificial layers 42 and 43 are made of an insulating material and include, for example, silicon nitride.

The insulating layer 40 is provided on the interconnect layer 24. In the memory areas MA1 and MA2, an interconnect layer 26 is provided on the insulating layer 40 on the interconnect layer 24. The interconnect layer 26 is formed into, for example, a line shape extending in the Y direction, and is used as the bit line BL. That is, in an area that is not shown in the drawings, the plurality of conductive layers 26 are arranged in the X direction. The interconnect layer 26 is made of a conductive material and includes, for example, copper.

In the memory areas MA1 and MA2, the memory pillar MP extends in the Z direction and penetrate through the interconnect layers 22 to 24. The lower end of each memory pillar MP is in contact with the interconnect layer 38. For example, the memory pillar MP has a pillar shape and has its cross-sectional area along the XY plane (XY plane cross-sectional area) increasing from the lower portion toward the upper portion. The cross-sectional shape of the memory pillar MP is not limited to the above shape.

The portion in which the memory pillar MP intersects the interconnect layer 22 functions as the select transistor ST2. The portion in which the memory pillar MP intersects one interconnect layer 23 functions as one memory cell transistor MT. The portion in which the memory pillar MP intersects the interconnect layer 24 functions as the select transistor ST1.

The memory pillar MP includes, for example, a core film 30, a semiconductor film 31, and a stacked film 32.

The core film 30 extends in the Z direction. For example, the upper end of the core film 30 is located above the interconnect layer 24, and the lower end of the core film 30 is located above the interconnect layer 38. The core film 30 is made of an insulating material and includes, for example, silicon oxide.

The semiconductor film 31 covers the periphery of the core film 30. In the lower end of the memory pillar MP, the semiconductor film 31 is partially in contact with the interconnect layer 38. The semiconductor film 31 includes, for example, silicon.

The stacked film 32 covers the side and bottom surfaces of the semiconductor film 31 except for the portion in which the semiconductor film 31 and the interconnect layer 38 are in contact with each other. The stacked film 32 includes, for example, a first insulating layer, a second insulating layer, and a third insulating layer arranged in this order.

FIG. 6 is a cross-sectional view taken along line S-S of FIG. 5 and showing an example of a cross-sectional structure of the memory pillar MP. Specifically, FIG. 6 shows a cross-sectional structure of the memory pillar MP in a layer that is parallel to the surface of the semiconductor substrate 20 and includes the interconnect layer 23. As shown in FIG. 6, the stacked film 32 includes, for example, a first insulating layer 32-1, a second insulating layer 32-2, and a third insulating layer 32-3.

The first insulating layer 32-1 covers the periphery of the semiconductor film 31. The first insulating layer 32-1 functions as a tunnel insulating film for the memory cell transistor MT. The first insulating layer 32-1 is made of an insulating material and includes, for example, silicon oxide. The second insulating layer 32-2 covers the periphery of the first insulating layer 32-1. The second insulating layer 32-2 functions as a charge storage layer for the memory cell transistor MT. The second insulating layer 32-2 is made of an insulating material and includes, for example, silicon nitride. The third insulating layer 32-3 covers the periphery of the second insulating layer 32-2. The third insulating layer 32-3 functions as a block insulating film for the memory cell transistor MT. The third insulating layer 32-3 is made of an insulating material and includes, for example, silicon oxide. The interconnect layer 23 covers the periphery of the third insulating layer 32-3 via an insulator including a metal oxide to be described later.

As shown in FIG. 5, a pillar-shaped contact plug CV is provided on the semiconductor film 31 in the memory pillar MP. The contact plug CV electrically couples the memory pillar MP and the interconnect layer 26 provided above the memory cell array 10. The contact plug CV is a conductor. The interconnect layer 26 is provided on the contact plug CV. The interconnect layer 26 is electrically coupled to the memory pillar MP with the contact plug CV intervening therebetween. The contact plug CV is made of a conductive material and includes, for example, tungsten.

In the hookup area HAs, the interconnect layer 24 has a terrace portion. In the contact area CCT, the plurality of interconnect layers 22 and 23 have their terrace portions formed into a stepwise shape. The plurality of contact plugs CC are respectively provided on the terrace portions of the plurality of interconnect layers 22 to 24. Interconnect layers 27 are respectively provided on the contact plugs CC. The interconnect layer 27 is provided in the same layer as, for example, the interconnect layer 26. Each interconnect layer 27 is electrically coupled to one of the interconnect layers 22 to 24 with the contact plug CC intervening therebetween. The interconnect layer 27 is made of a conductive material.

In the hookup area HAo, the interconnect layer 24 has a terrace portion. The contact plug CC is provided on the terrace portion of the interconnect layer 24. In the contact area C4T, an insulating layer INS is provided in the same layer as the interconnect layer 38. In the contact area C4T, the plurality of sacrificial layers 42 and 43 remain without being respectively replaced with the plurality of interconnect layers 22 and 23. The plurality of contact plugs C4 penetrate the plurality of sacrificial layers 42 and 43 and the insulating layer INS. That is, each contact plug C4 is separated from the plurality of interconnect layers 22 to 24 and 38. The interconnect layer 27 is provided on each contact plug C4. The lower end of each contact plug C4 is in contact with an interconnect layer 28 arranged in the insulating layer 21. The interconnect layer 28 is made of a conductive material.

Furthermore, in addition to a plurality of interconnect layers 28, a plurality of interconnect layers 29 and a plurality of contact plugs C1, C2, and C5 are provided in the insulating layer 21. Each of the contact plugs C1, C2, and C5 is a conductor. Each interconnect layer 28 is coupled to the transistor TR with the interconnect layer 29 and the contact plugs C2, C1, and C5 intervening therebetween. Although not shown, a circuit corresponding to, for example, the row decoder module 15, the sense amplifier module 16, etc. is provided as a circuit containing the aforementioned transistor TR, in the semiconductor substrate 20 and the insulating layer 21.

The transistor TR includes two impurity diffusion layer areas (not shown), insulating layers 33 to 35, and a gate electrode 36.

The impurity diffusion layer areas are arranged in such a manner that one is spaced apart from the other, for example, in the X direction in the vicinity of the surface of the semiconductor substrate 20. The two impurity diffusion layer areas function as a source (source diffusion layer) and a drain (drain diffusion layer) of the transistor TR.

The insulating layer 34 is provided between the two impurity diffusion layer areas. The insulating layer 34 functions as a gate insulating film of the transistor TR. The insulating layer 34 is made of an insulating material. The gate electrode 36 is provided on the insulating layer 34. The gate electrode 36 is made of a conductive material. The insulating layer 35 is provided on a side surface of the gate electrode 36 of the transistor TR. The insulating layer 35 functions as a side wall. The insulating layer 35 is made of an insulating material. The insulating layer 33 is provided on the gate electrode 36. The insulating layer 33 is made of an insulating material.

The contact plug C1 is provided between the gate electrode 36 of the transistor TR and the interconnect layer 29. The gate electrode 36 is electrically coupled to the interconnect layer 29 with the contact plug C1 intervening therebetween. The interconnect layer 29 is made of a conductive material. The contact plug C1 is made of a conductive material. The contact plug C5 is provided between the source or drain of the transistor TR and the interconnect layer 29. The source and drain of the transistor TR are electrically coupled to the interconnect layer 29 with the contact plug C5 intervening therebetween. The contact plug C5 is made of a conductive material. The contact plug C2 is provided between the interconnect layer 29 and the interconnect layer 28. The interconnect layer 29 is electrically coupled to the interconnect layer 28 with the contact plug C2 intervening therebetween. The contact plug C2 is made of a conductive material.

For example, insulating layers 37 are provided on the upper surface (the vicinity of the surface) of the semiconductor substrate 20. The insulating layer 37 is in contact with the upper surface of the semiconductor substrate 20. The insulating layer 37 is provided in order to electrically separate, for example, an N-type well area and a P-type well area from each other. The insulating layer 37 is made of an insulating material.

With the above configuration, the respective interconnect layers 22 to 24 are electrically coupled to the row decoder module 15 with the contact plugs CC, C4, C1, C2, and C5 and the interconnect layers 27 to 29 intervening therebetween.

FIG. 7 is a cross-sectional view taken along line II to II of FIG. 4. FIG. 7 shows the XZ plane of the member SLT in the hookup area HAo.

Four contact plugs LI are arranged in the X direction on the interconnect layer 38. The insulators SW are provided in such a manner as to cover the side surfaces of the contact plugs LI. The lower end of the insulator SW is in contact with the interconnect layer 38. The dividing portion DP is provided between the two insulators SW adjacent in the X direction. The dividing portion DP includes insulating layers 39, 40, and 52. Specifically, the insulating layer 39 is provided on the interconnect layer 38, and the plurality of insulating layers 52 and the plurality of insulating layers 40 are alternately stacked one by one on the insulating layer 39.

The conductor CH is provided on the uppermost insulating layer 40, the two adjacent insulators SW, and the end portions in the X direction of the two adjacent contact plugs LI. The two adjacent contact plugs LI are electrically coupled to each other with the conductor CH intervening therebetween.

Figure 8:
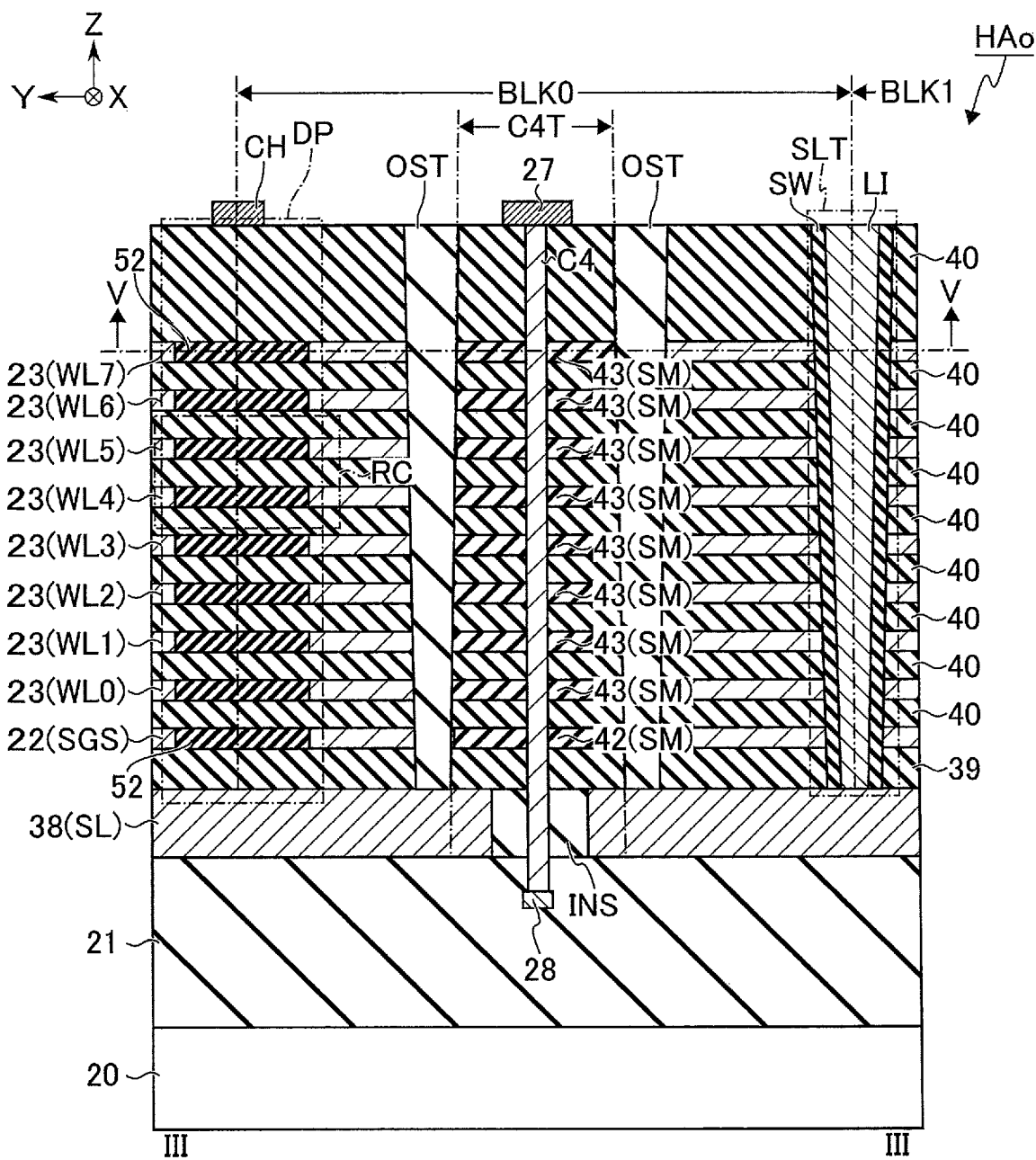
FIG. 8 is a cross-sectional view taken along line of FIG. 4 and showing an example of a cross-sectional structure in the hookup area of the memory cell array included in the semiconductor memory device according to the first embodiment.

FIG. 8 is a cross-sectional view taken along line III to III of FIG. 4. FIG. 8 shows the YZ plane of the stacked interconnects, the dividing portion DP, the conductor CH, two members OST, the contact plug C4, and the member SLT in the hookup area HAo corresponding to the block BLK0.

The end portion in the Y direction of the block BLK0 is in contact with the member SLT or the dividing portion DP. In an area in which the block BLK0 is in contact with the dividing portion DP, the interconnect layers 22 and 23 in the block BLK0 are respectively adjacent to the insulating layers 52 of the dividing portion DP provided in the same layers.

The two members OST are provided in such a manner that the contact area C4T is sandwiched therebetween in the Y direction. The member OST penetrates the plurality of interconnect layers 22 and 23. The lower end of the member OST is in contact with the interconnect layer 38. For example, the member OST has its XY plane cross-sectional area increasing from the lower portion toward the upper portion. The cross-sectional shape of the member OST is not limited to the above shape.

The contact plug C4 is provided in the contact area C4T. The contact plug C4 penetrates the plurality of sacrificial layers 42 and 43 and the insulating layer INS. The interconnect layer 27 is provided on the contact plug C4. The lower end of the contact plug C4 is in contact with the interconnect layer 28.

The member SLT penetrates the plurality of interconnect layers 22 and 23. The lower end of the member SLT is in contact with the interconnect layer 38. For example, the member SLT has its XY plane cross-sectional area increasing from the lower portion toward the upper portion. The cross-sectional shape of the member SLT is not limited to the above shape. The contact plug LI is isolated and insulated from the interconnect layers 22 to 24 by the insulator SW.

FIG. 9 is a cross-sectional view taken along line IV-IV of FIG. 4. FIG. 9 shows the YZ plane of the stacked interconnects, the two members SLT, the support pillar HR, and the contact plug CC in the hookup area HAs corresponding to the block BLK0.

The example in FIG. 9 shows a cross section of a terrace portion of the interconnect layer 23 functioning as the word line WL4 in the contact area CCT. Above the terrace portion of the interconnect layer 23 functioning as the word line WL4, three interconnect layers 23 respectively functioning as the word lines WL5 to WL7 are eliminated. The contact area CCT includes part of the block BLK0, part of the block BLK1, and part of the member SLT on the right side in the drawing sheet, provided between the block BLK0 and the block BLK1. For example, each of the terrace portions of the interconnect layers 22 and 23 is divided in the Y direction by the member SLT on the right side in the drawing sheet. Therefore, in the hookup area HAs, the YZ plane of the stacked interconnects for each block BLK is configured to be asymmetrical with respect to the axis Z1 that passes through the center in the Y direction of each block BLK and extends in the Z direction. In other words, the YZ plane of the stacked interconnects in two blocks BLK takes a structure that is symmetric while the member SLT provided between these two blocks BLK serves the center axis. The example in FIG. 9 shows that three interconnect layers 23 respectively functioning as the word lines WL5 to WL7 remain between the member SLT on the left side in the drawing sheet in the Y direction and the contact area CCT, and at the end portion of the contact area CCT. On the other hand, the interconnect layers 23 do not remain in the vicinity of the member SLT on the right side in the drawing sheet.

In the contact area CCT, the contact plug CC is provided on the terrace portion of the interconnect layer 23 functioning as the word line WL4.

The support pillar HR is provided in the contact area CCT. The support pillar HR penetrates the interconnect layer 22 and five interconnect layers 23 respectively functioning as the word lines WL0 to WL4. The lower end of the memory pillar HR is in contact with the interconnect layer 38.

1.1.4.3 Area in Vicinity of Dividing Portion DP

Next, details of the area in the vicinity of the dividing portion DP will be described. The present embodiment will describe the case in which the interconnect layers 22 to 24 are made of two conductors (conductors 55 and 56) and part of the two conductors is covered with an insulator (insulator 57).

FIG. 10 is an enlarged view of an area RA shown in FIG. 4. FIG. 10 shows a cross-sectional view along the XY plane including the insulating layer 52.

The first portion 52a and the second portion 52b of the insulating layer 52 are respectively in contact with the end portions in the X direction of the two members SLT adjacent in the X direction. In other words, one of the two members SLT adjacent in the X direction has one end in the longitudinal direction when viewed from a top, fitted within an arc shape of the first portion 52a of each of the insulating layers 52, and the other member SLT has one end in the longitudinal direction when viewed from the top, fitted within an arc shape of the second portion 52b of each of the insulating layers 52. The insulator 57 is provided between the insulating layer 52 and the conductor 56 along the XY plane. The insulator 57 covers the side surface of the end portion in the Y direction of the insulating layer 52. In other words, the insulating layer 52 and the conductor 56 are in contact with the insulator 57 in the Y direction. The insulator 57 is made of an insulating material and includes a metal oxide such as, for example, aluminum oxide. The insulator 57 functions as a block insulating film for the memory transistor MT, together with the third insulating layer 32-3 of the stacked film 32.

The conductor 56 covers the side surface of the insulator 57. The conductor 56 covers part of the side surface of the conductor 55. The conductor 56 is made of a conductive material and includes, for example, titanium nitride. The conductor 56 functions as a barrier layer of the conductor 55. The conductor 55 is made of a conductive material and includes, for example, tungsten.

The insulator SW covers the side surface of the end portion in the X direction of the insulating layer 52. The part of conductors 55 and 56 and the insulator 57 are in contact with the side surface in the Y direction of the insulator SW. Furthermore, the insulator SW covers the side surface of the contact plug LI.

Figure 11:
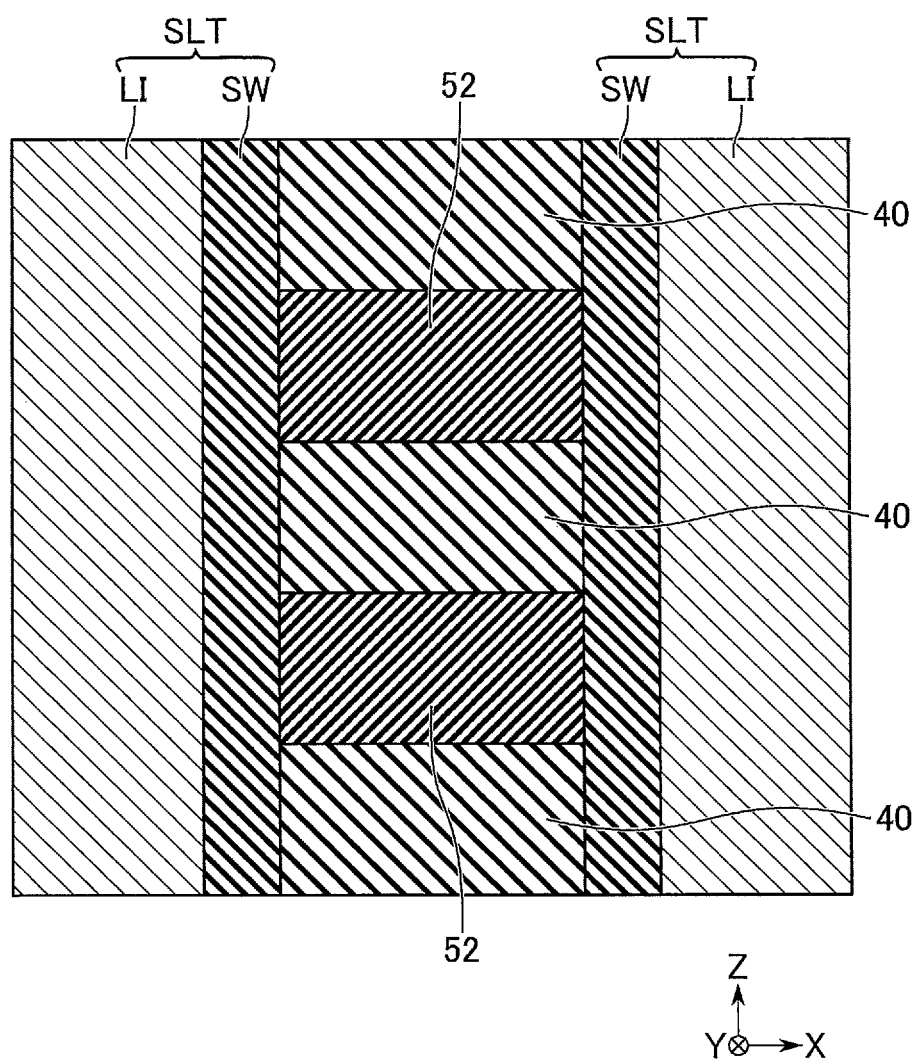
FIG. 11 is an enlarged view of an area RB shown in FIG. 7.

FIG. 11 is an enlarged view of the area RB shown in FIG. 7.

The member SLT covers the side surfaces of the insulating layers 40 and 52.

Figure 12:
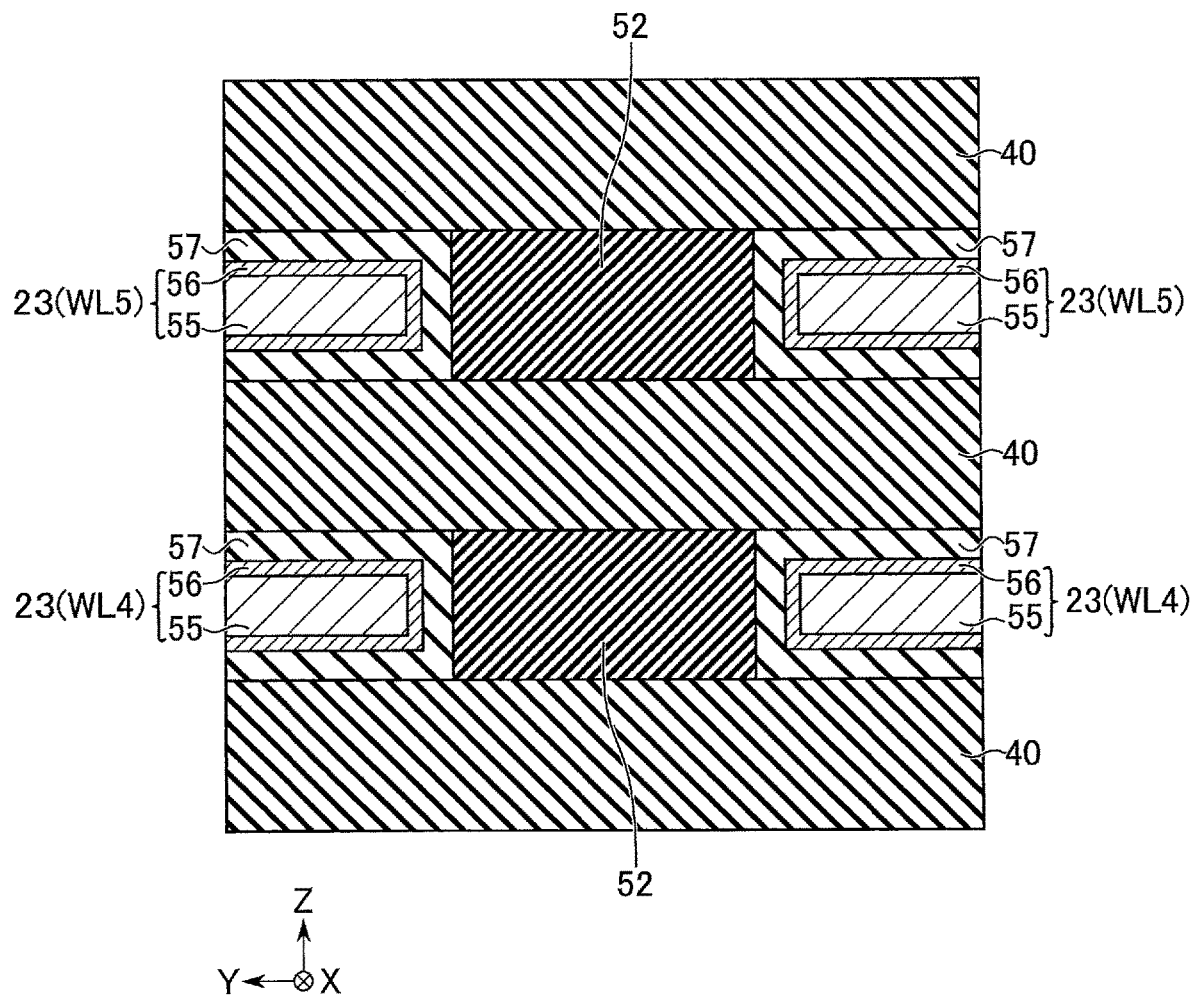
FIG. 12 is an enlarged view of an area RC shown in FIG. 8.

FIG. 12 is an enlarged view of the area RC shown in FIG. 8.

The insulator 57 covers the side surface of the insulating layer 52 and the upper, bottom, and side surfaces of the conductor 56. The conductor 56 covers the upper, bottom, and side surfaces of the conductor 55.

1.2 Method of Manufacturing Semiconductor Memory Device

Figure 13:
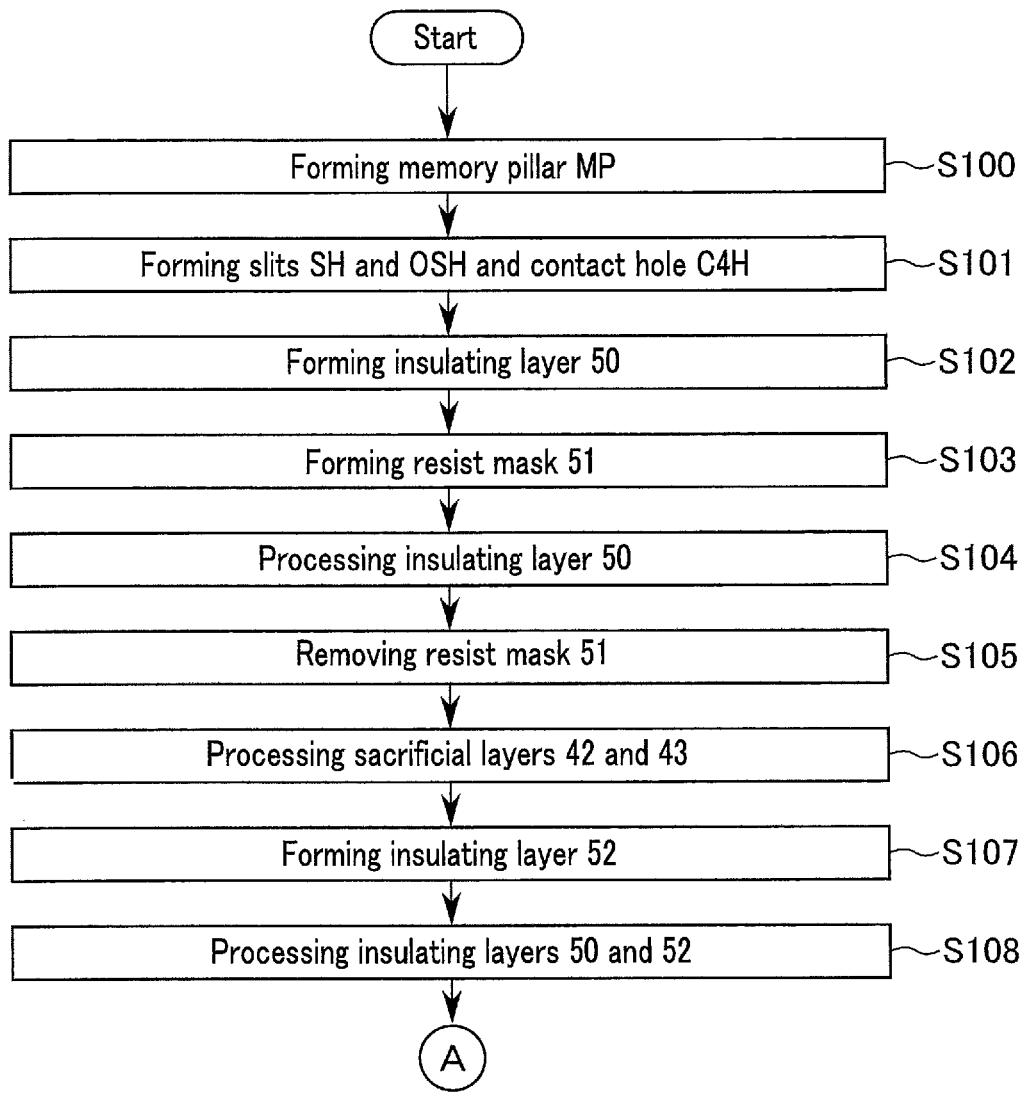
FIG. 13 is a flowchart showing an example of a method of manufacturing the semiconductor memory device according to the first embodiment.
Figure 15:
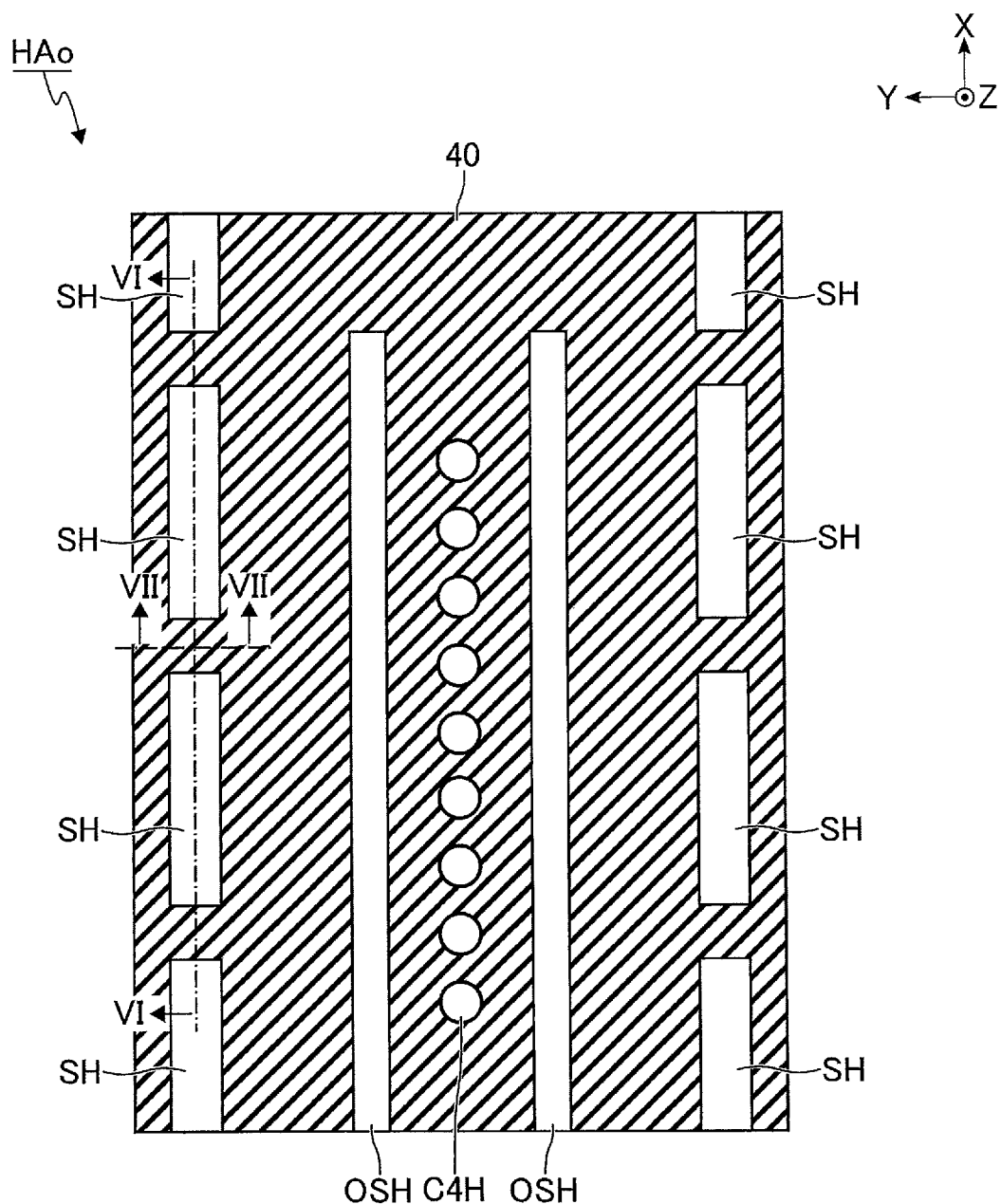
FIG. 15 is a plan view taken along a surface of an uppermost insulating layer in FIG. 8 and showing an example of a planar structure during a process of manufacturing the semiconductor memory device according to the first embodiment.
Figure 69:
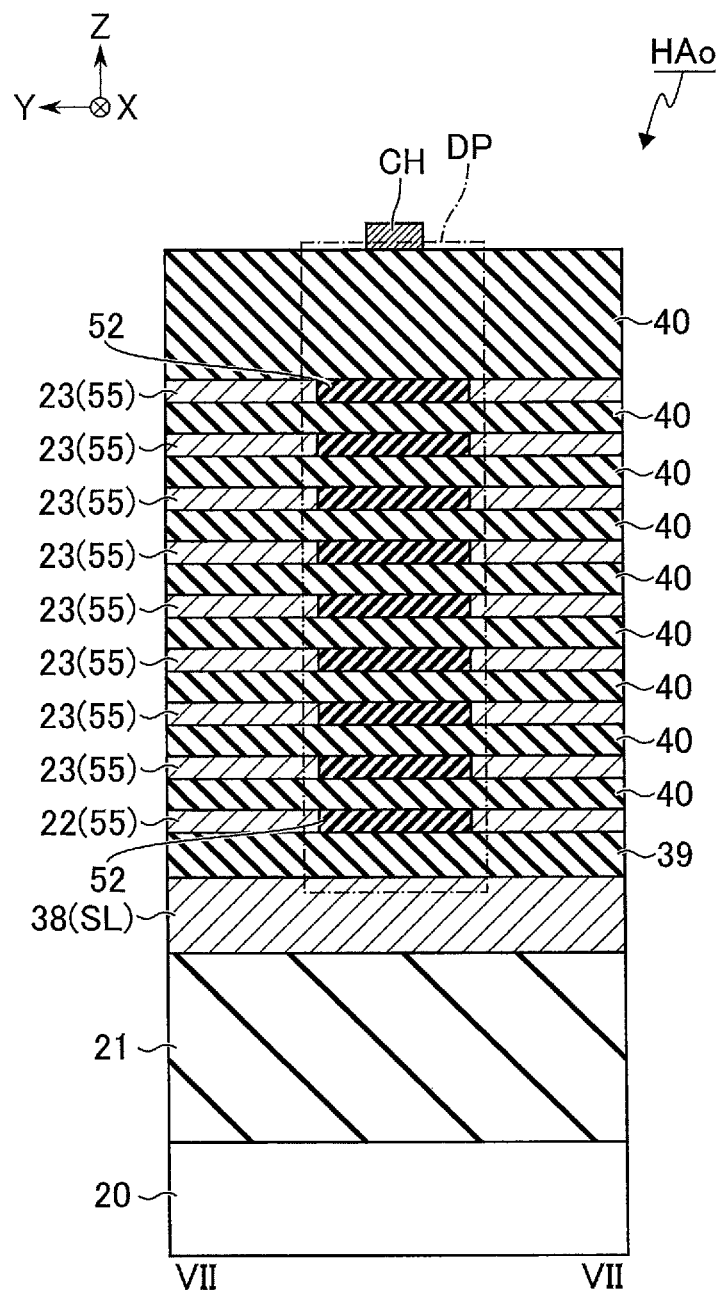
FIG. 69 is a cross-sectional view taken along line VII-VII of FIG. 67 and showing an example of a cross-sectional structure during the process of manufacturing the semiconductor memory device according to the first embodiment.

FIG. 13 and FIG. 14 are each a flowchart showing an example of the method of manufacturing of the members SLT in the semiconductor memory device 3. FIG. 15 to FIG. 69 each show an example of a planar structure or a cross-sectional structure during a process of manufacturing the semiconductor memory device 3. The plan views and cross-sectional views presented below omit the conductor 56 and the insulator 57.

The planar structures illustrated in FIG. 15, FIG. 18, FIG. 21, FIG. 24, FIG. 27, FIG. 30, FIG. 34, FIG. 38, FIG. 42, FIG. 43, FIG. 46, FIG. 50, FIG. 54, FIG. 57, FIG. 60, FIG. 63, and FIG. 67 each show a plan view taken along the surface of the uppermost insulating layer 40 in FIG. 8. The planar structures illustrated in FIG. 31, FIG. 35, FIG. 39, FIG. 47, FIG. 51, and FIG. 64 each show a plan view taken along the line V-V in FIG. 8. In these planar structures, the support pillar HR is omitted.

As shown in FIG. 13 and FIG. 14, the steps S100 to S117 are sequentially executed during the process of manufacturing the semiconductor memory device 3. Hereinafter, an example of the process of manufacturing the members SLT included in the memory cell array 10 in the semiconductor memory device 3 will be described by referring to FIG. 13 and FIG. 14 as appropriate. In the following, the hookup area HAo in the memory cell array 10 will be mainly described.

The memory pillars MP are respectively formed in the memory areas MA1 and MA2 (S100). For example, after a stacked portion in which the plurality of sacrificial layers 42 or 43 and the plurality of insulating layers 39 or 40 are alternatively stacked in the Z direction is formed above the semiconductor substrate 20, the memory pillars MP each extending in the Z direction and penetrating the stacked portion are formed.

Figure 17:
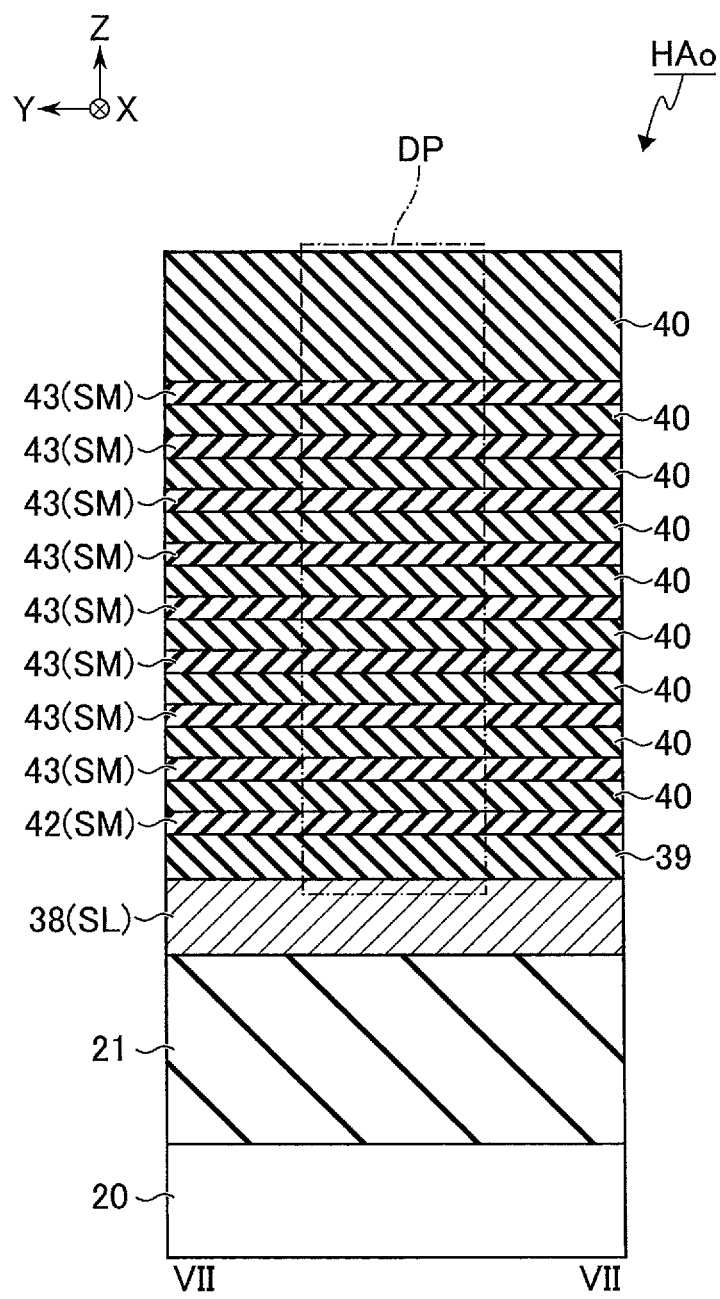
FIG. 17 is a cross-sectional view taken along line VII-VII of FIG. 15 and showing an example of a cross-sectional structure during the process of manufacturing the semiconductor memory device according to the first embodiment.

Next, as shown in FIG. 15 to FIG. 17, a plurality of slits SH and OSH and a plurality of contact holes C4H are formed (S101). The cross-sectional structure illustrated in FIG. 16 shows a cross-sectional view taken along line VI-VI in FIG. 15. The cross-sectional structure illustrated in FIG. 17 shows a cross-sectional view taken along line VII-VII in FIG. 15.

The order of forming the slits SH and OSH and the contact holes C4H is freely determined. The slits SH and OSH may be formed after formation of the contact holes C4H, or the contact holes C4H may be formed after formation of the slits SH and OSH. The slits SH and OSH and the contact holes C4H may be formed separately or may be formed collectively. Furthermore, the contact hole C4H may be formed after formation of the interconnect layers 22 to 24. In a later step of the process, the member SLT is embedded in the slit SH. In a later step of the process, the member OST is embedded in the slit OSH. In a later step of the process, the contact plug C4 is embedded in the contact hole C4H.

As shown in FIG. 15, the slit SH is formed in such a manner that it is divided into a plurality of portions in the X direction. A distance between the two slits SH adjacent in the X direction is made smaller than a distance between the slits SH and OSH adjacent in the Y direction. This is to prevent the sacrificial layers 42 and 43 from being removed until etching reaches the slit OSH in S106 to be described later.

As shown in FIG. 16, the slit SH penetrates, for example, each of the insulating layers 39 and 40 and the sacrificial layers 42 and 43. The bottom surface of the slit SH reaches the interconnect layer 38. The same applies to the slit OSH. The contact hole C4H penetrates, for example, each of the insulating layers 39, 40, and INS, part of the insulating layer 21, and the sacrificial layers 42 and 43. The bottom surface of the contact hole C4H reaches the interconnect layer 28.

Figure 20:
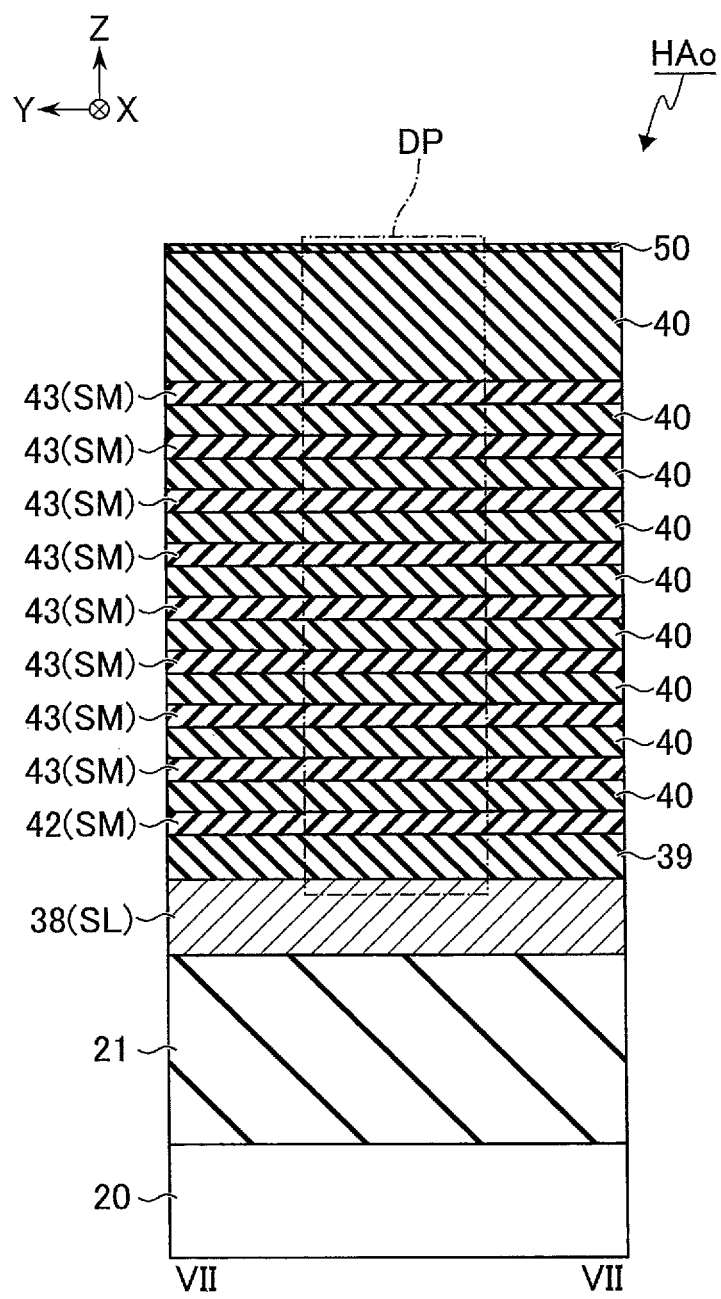
FIG. 20 is a cross-sectional view taken along line VII-VII of FIG. 18 and showing an example of a cross-sectional structure during the process of manufacturing the semiconductor memory device according to the first embodiment.

As shown in FIG. 18 to FIG. 20, an insulating layer 50 is formed (S102). The cross-sectional structure illustrated in FIG. 19 shows a cross-sectional view taken along line VI-VI in FIG. 18. The cross-sectional structure illustrated in FIG. 20 shows a cross-sectional view taken along line VII-VII in FIG. 18. In S102, the insulating layer 50 is formed on the uppermost insulating layer 40, the side and bottom surfaces of the plurality of slits SH and OSH, and the plurality of contact holes C4H. The insulating layer 50 is made of an insulating material and includes, for example, silicon oxide.

Figure 21:
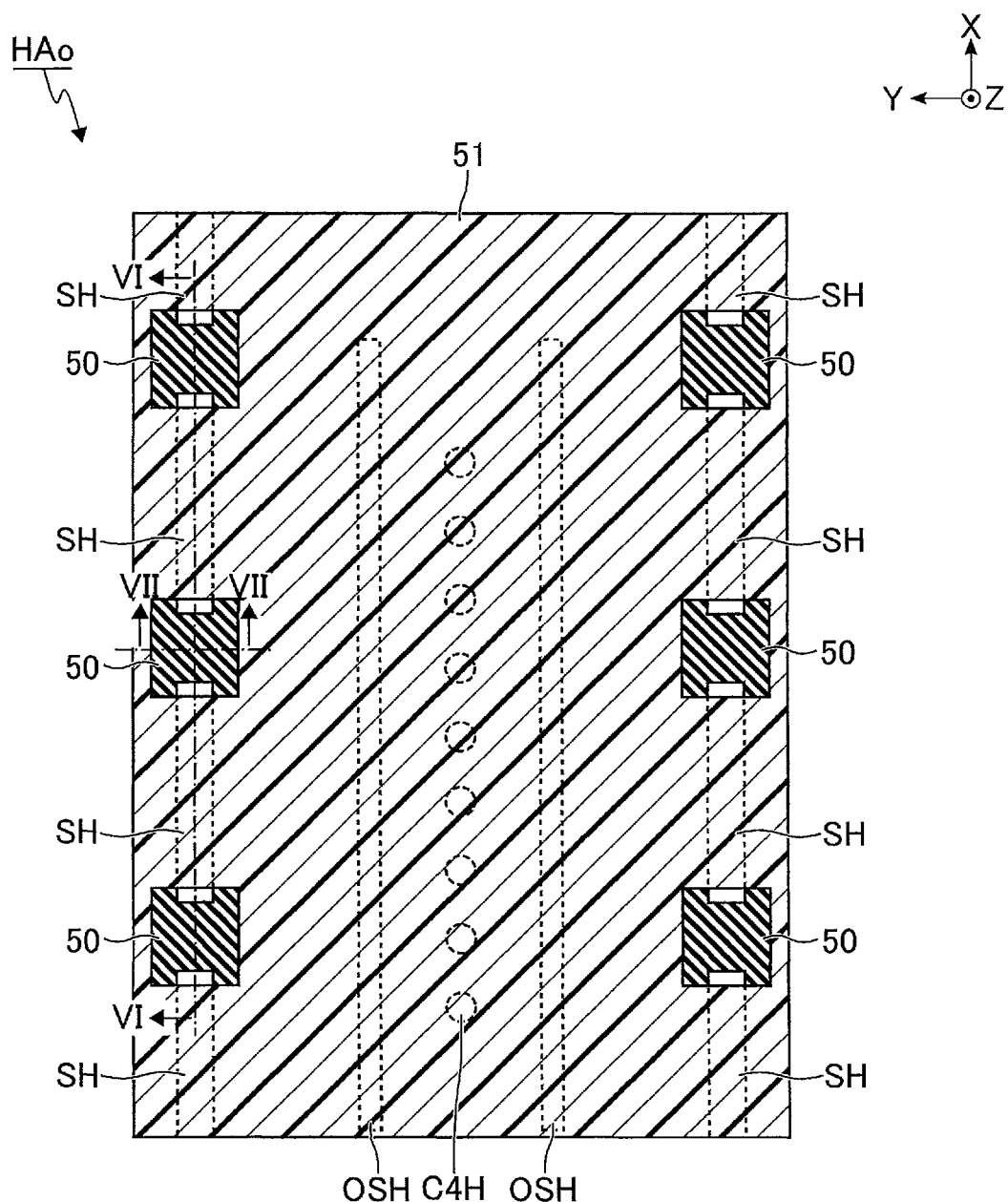
FIG. 21 is a plan view taken along the surface of the uppermost insulating layer in FIG. 8 and showing an example of a planar structure during the process of manufacturing the semiconductor memory device according to the first embodiment.
Figure 22:
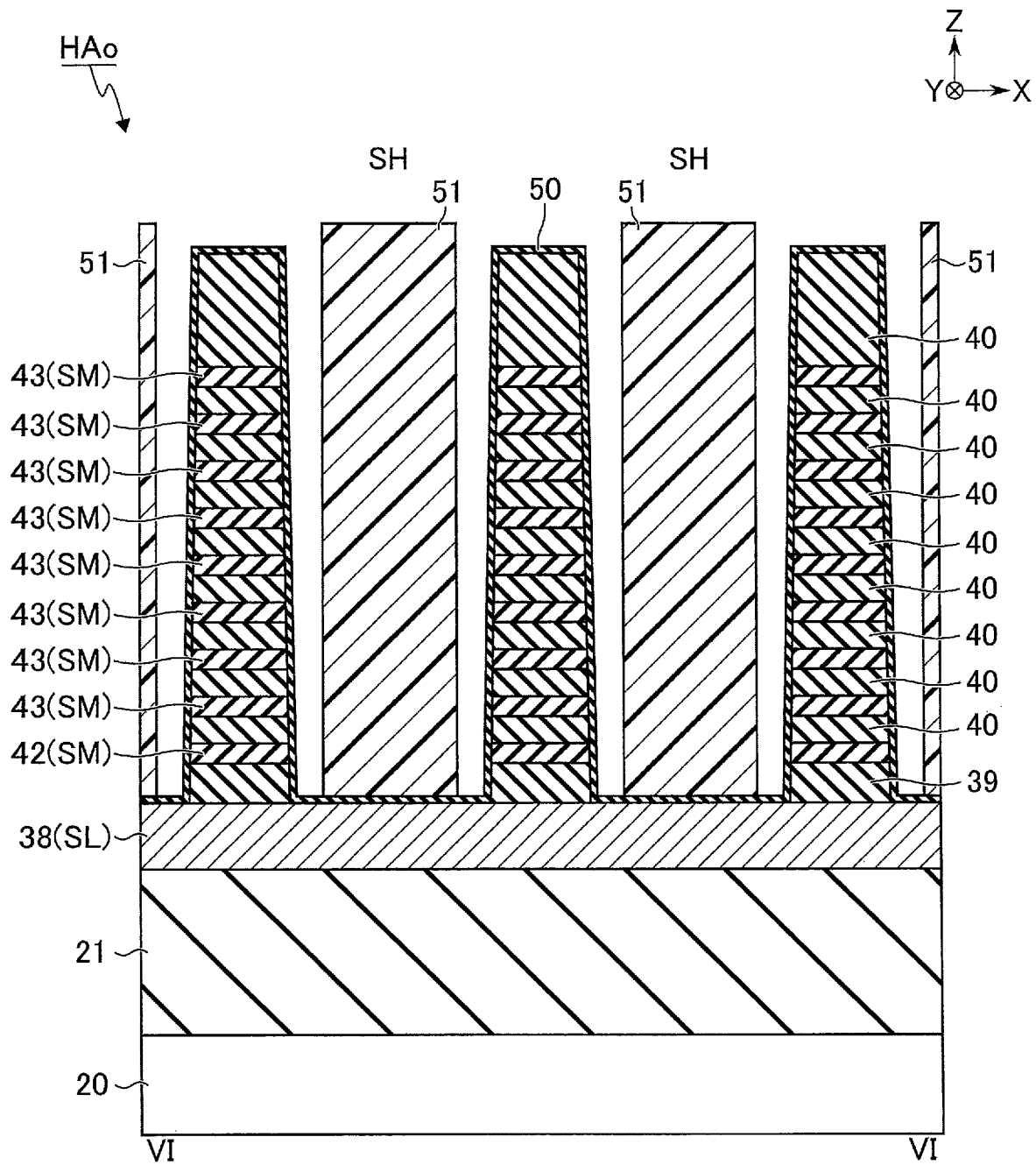
FIG. 22 is a cross-sectional view taken along line VI-VI of FIG. 21 and showing an example of a cross-sectional structure during the process of manufacturing the semiconductor memory device according to the first embodiment.

Next, as shown in FIG. 21 to FIG. 23, a resist mask 51 in which a pattern for forming the dividing portion DP is opened is formed by photolithography, etc. on the insulating layer 50, between the two slits SH adjacent in the X direction (S103). The cross-sectional structure illustrated in FIG. 22 shows a cross-sectional view taken along line VI-VI in FIG. 21. The cross-sectional structure illustrated in FIG. 23 shows a cross-sectional view taken along line VII-VII in FIG. 21. In each opening portion of the resist mask 51, the insulating layer 50 has a portion that is formed on the side surface in the vicinity of the end portion in the X direction of each slit SH, and this portion is exposed.

Next, as shown in FIG. 24 to FIG. 26, the insulating layer 50 is processed by, for example, isotropic etching such as wet etching (S104). The cross-sectional structure illustrated in FIG. 25 shows a cross-sectional view taken along line VI-VI in FIG. 24. The cross-sectional structure illustrated in FIG. 26 shows a cross-sectional view taken along line VII-VII in FIG. 24. In S104, portions of the insulating layer 50 which are exposed in the opening portions of the resist mask 51 are removed. Specifically, portions of the insulating layer 50 which are positioned on the uppermost insulating layer 40 in the opening portions, and portions of the insulating layer 50 which are positioned on the side and bottom surfaces in the vicinities of the end portions in the X direction of the slits SH are removed.

Figure 27:
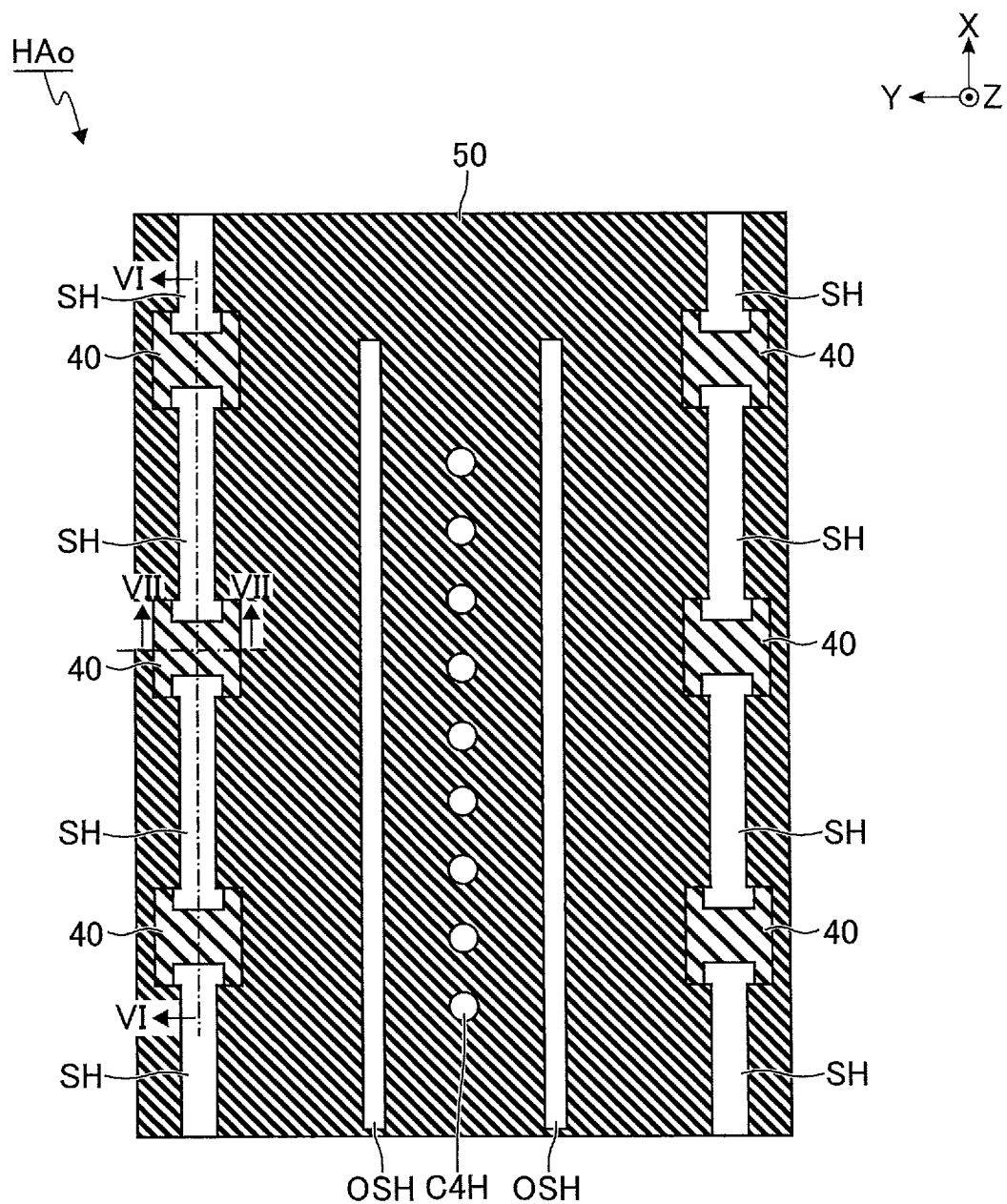
FIG. 27 is a plan view taken along the surface of the uppermost insulating layer in FIG. 8 and showing an example of a planar structure during the process of manufacturing the semiconductor memory device according to the first embodiment.
Figure 29:
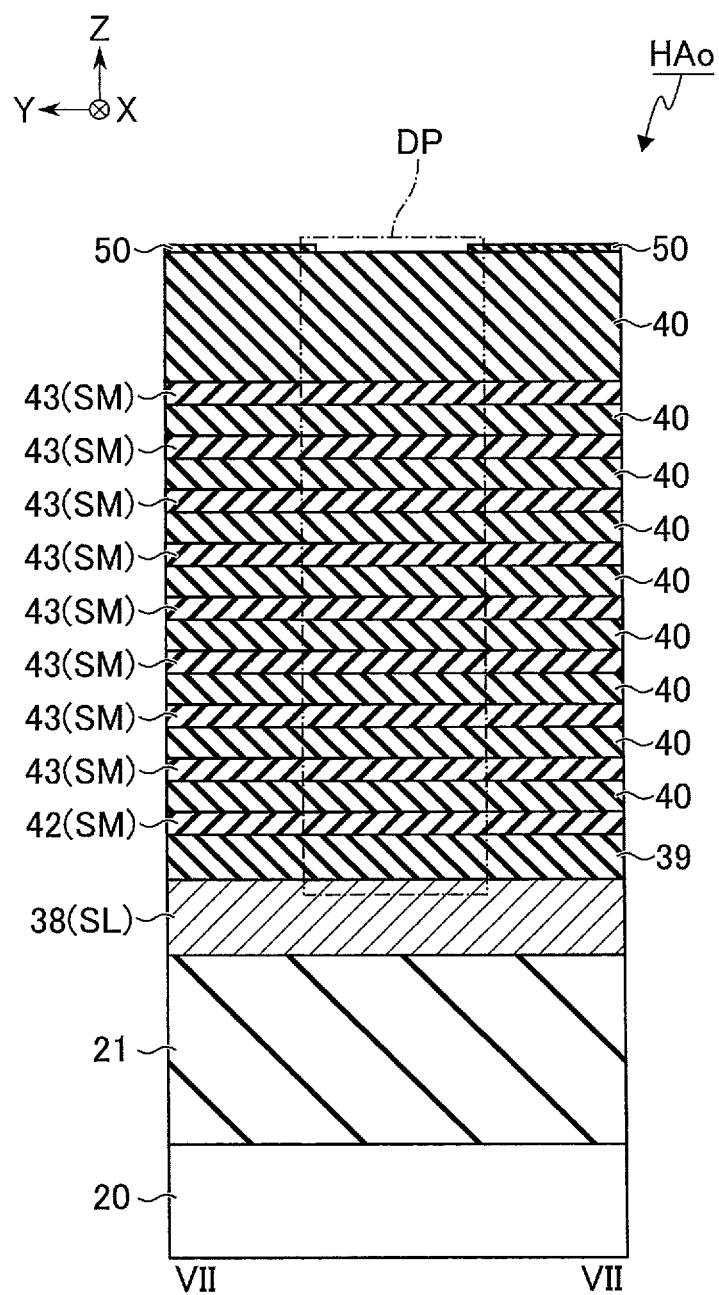
FIG. 29 is a cross-sectional view taken along line VII-VII of FIG. 27 and showing an example of a cross-sectional structure during the process of manufacturing the semiconductor memory device according to the first embodiment.

Next, as shown in FIG. 27 to FIG. 29, the resist mask 51 is removed (S105). The cross-sectional structure illustrated in FIG. 28 shows a cross-sectional view taken along line VI-VI in FIG. 27. The cross-sectional structure illustrated in FIG. 29 shows a cross-sectional view taken along line VII-VII in FIG. 27.

Figure 32:
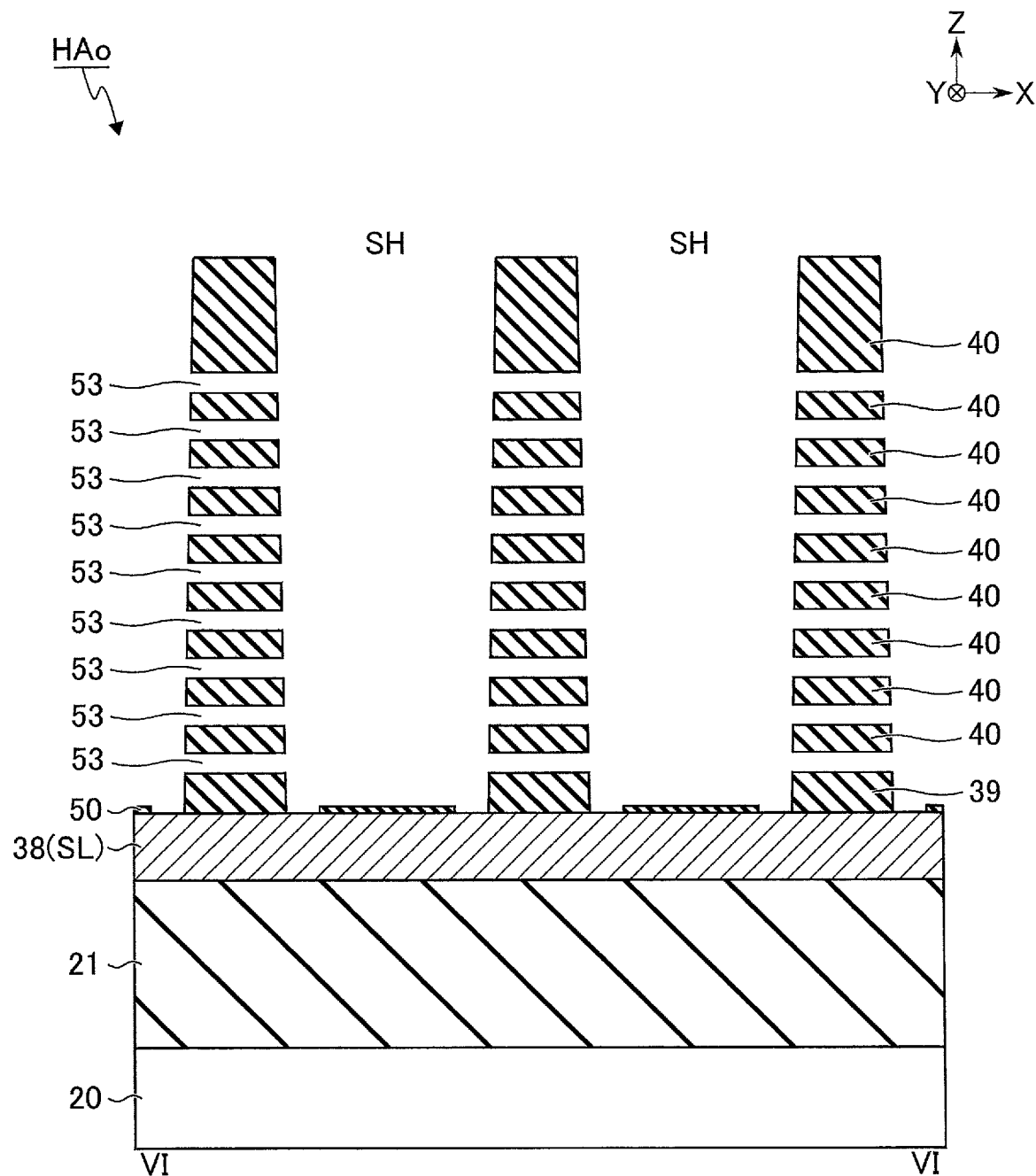
FIG. 32 is a cross-sectional view taken along line VI-VI of FIG. 30 and showing an example of a cross-sectional structure during the process of manufacturing the semiconductor memory device according to the first embodiment.
Figure 33:
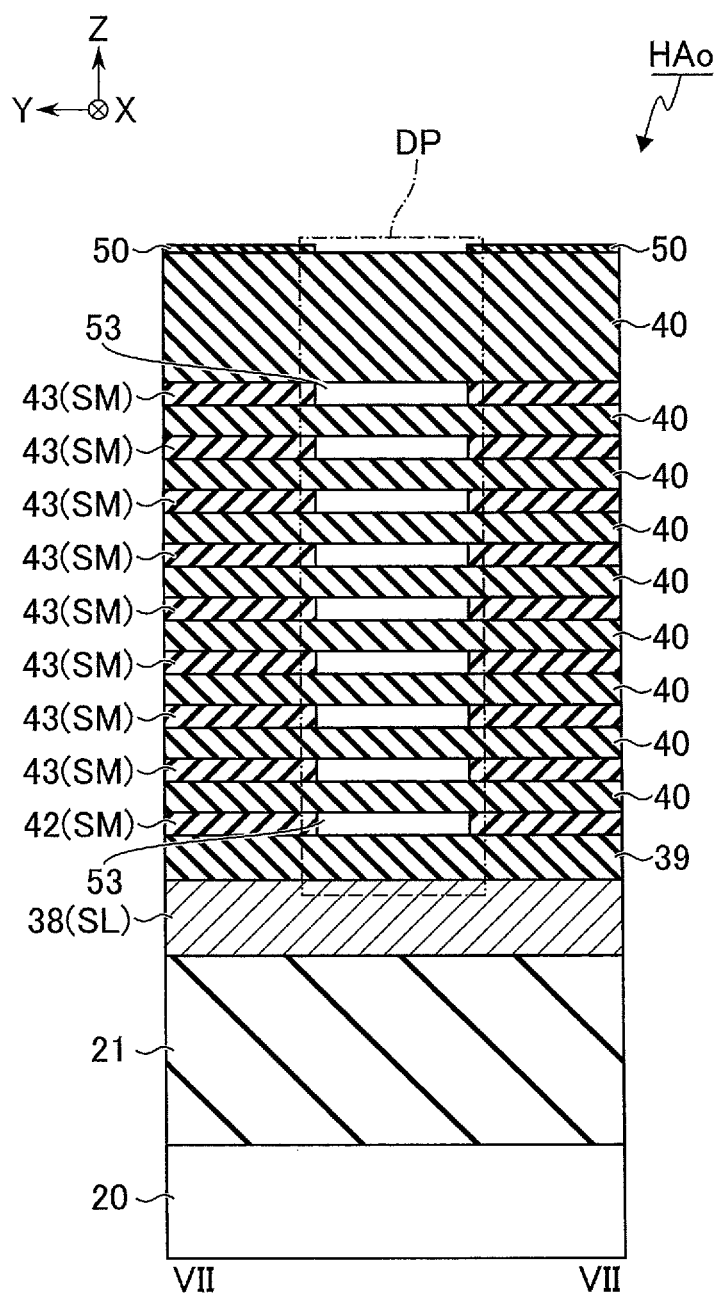
FIG. 33 is a cross-sectional view taken along line VII-VII of FIG. 30 and showing an example of a cross-sectional structure during the process of manufacturing the semiconductor memory device according to the first embodiment.
Figure 34:
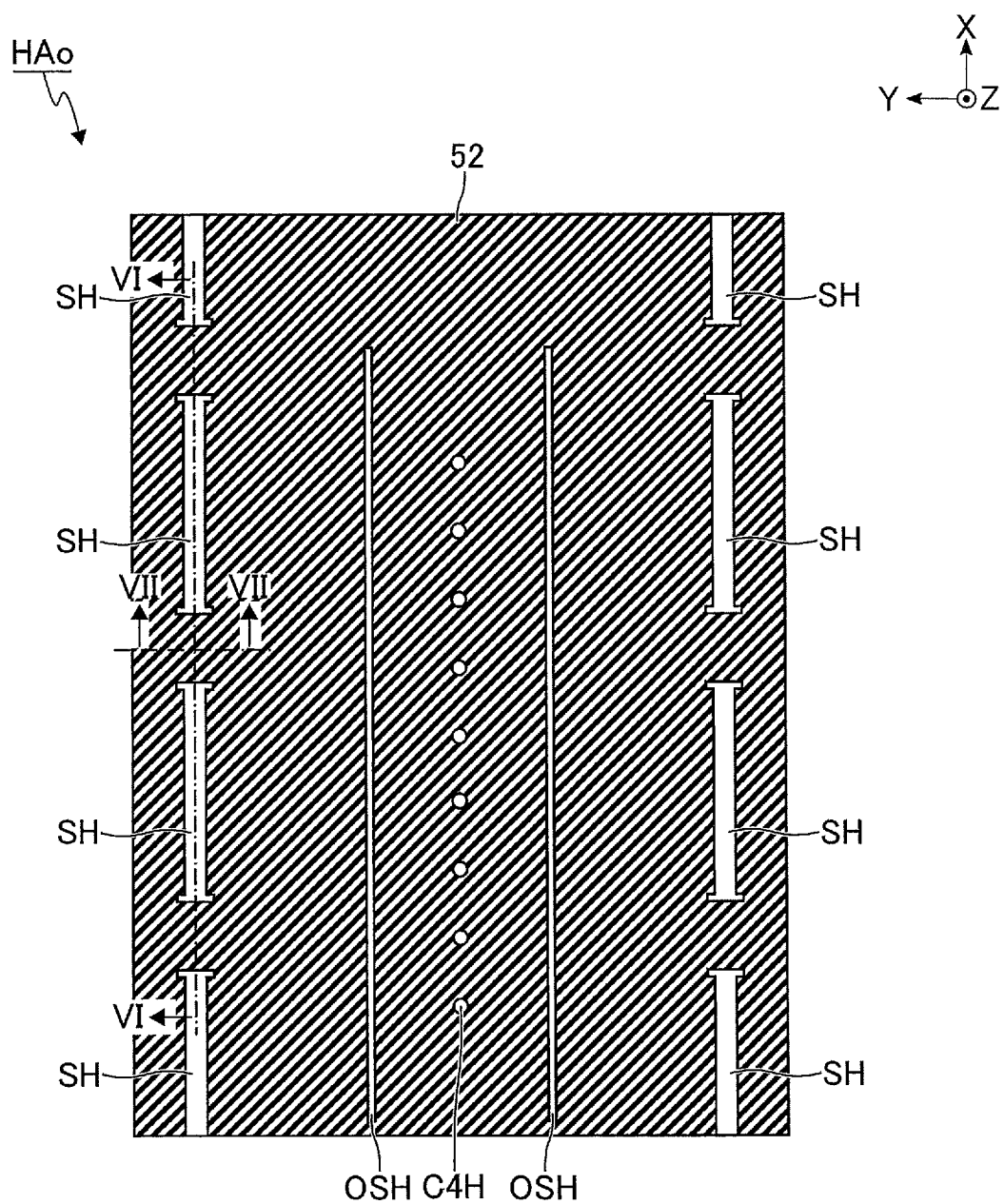
FIG. 34 is a plan view taken along the surface of the uppermost insulating layer in FIG. 8 and showing an example of a planar structure during the process of manufacturing the semiconductor memory device according to the first embodiment.

Next, as shown in FIG. 30 to FIG. 33, the sacrificial layers 42 and 43 are processed by, for example, isotropic etching such as wet etching (S106). The planar structure illustrated in FIG. 30 has no difference from that of FIG. 27. The cross-sectional structure illustrated in FIG. 32 shows a cross-sectional view taken along line VI-VI in FIG. 30. The cross-sectional structure illustrated in FIG. 33 shows a cross-sectional view taken along line VII-VII in FIG. 30. In S106, portions of the sacrificial layers 42 and 43, which are positioned between the two slits SH adjacent in the X direction, are removed. At this time, the amount of etching is set in such a manner that the sacrificial layers 42 and 43 between the two slits SH adjacent in the X direction are removed while most portions of the sacrificial layers 42 and 43 between the slits SH and OSH adjacent in the Y direction are not removed. Specifically, as shown in FIG. 31, air gaps 53 are formed as an area from which the sacrificial layers 42 and 43 are removed, between the two slits SH adjacent in the X direction.

The air gap 53 includes a first portion 53a and a second portion 53b. The first portion 53a and the second portion 53b are each in contact with the end portions of the two slits SH adjacent in the X direction. The first portion 53a and the second portion 53b each have an individual arc shape, for example, and they are in contact with each other in the X direction (they have a joint).

Next, as shown in FIG. 34 to FIG. 37, the insulating layers 52 are formed (S107). The cross-sectional structure illustrated in FIG. 36 shows a cross-sectional view taken along line VI-VI in FIG. 34. The cross-sectional structure illustrated in FIG. 37 shows a cross-sectional view taken along line VII-VII in FIG. 34. In S107, the insulating layers 52 are formed in the air gaps 53 formed in S106. That is, the first portion 52a of each insulating layer 52 is formed in the first portion 53a of each air gap 53, and the second portion 52b of each insulating layer 52 is formed in the second portion 53b of each air gap 53. Furthermore, the insulating layer 52 is formed on the insulating layer 50 and the uppermost insulating layer 40, and on the side and bottom surfaces of the plurality of slits SH and OSH and the plurality of contact holes C4H. The insulating layer 52 to be formed has a filling thickness such that the air gap 53 is filled up and the slit SH is not filled up.

Next, as shown in FIG. 38 to FIG. 41, the insulating layers 50 and 52 are processed by, for example, isotropic etching such as wet etching (S108). The cross-sectional structure illustrated in FIG. 40 shows a cross-sectional view taken along line VI-VI in FIG. 38. The cross-sectional structure illustrated in FIG. 41 shows a cross-sectional view taken along line VII-VII in FIG. 38. In S108, portions of the insulating layers 50 and 52 which are positioned on the uppermost insulating layer 40 are removed, and portions of the insulating layers 50 and 52 which are positioned on the side and bottom surfaces of the plurality of slits SH and OSH, and the plurality of contact holes C4H are removed. At this time, the amount of etching is adjusted in such a manner that the insulating layer 52 remains between the two slits SH adjacent in the X direction. Specifically, the amount of etching is set such that the insulating layers 50 and 52 on the side and bottom surfaces of the slits SH are removed and the insulating layer 52 is not etched from the end portion in the X direction of one of the slits SH to the joint between the first portion 53a and the second portion 53b of the air gap 53.

Next, as shown in FIG. 42, the members OST are filled in the plurality of slits OSH (S109). In S109, the members OST are formed.

Figure 43:
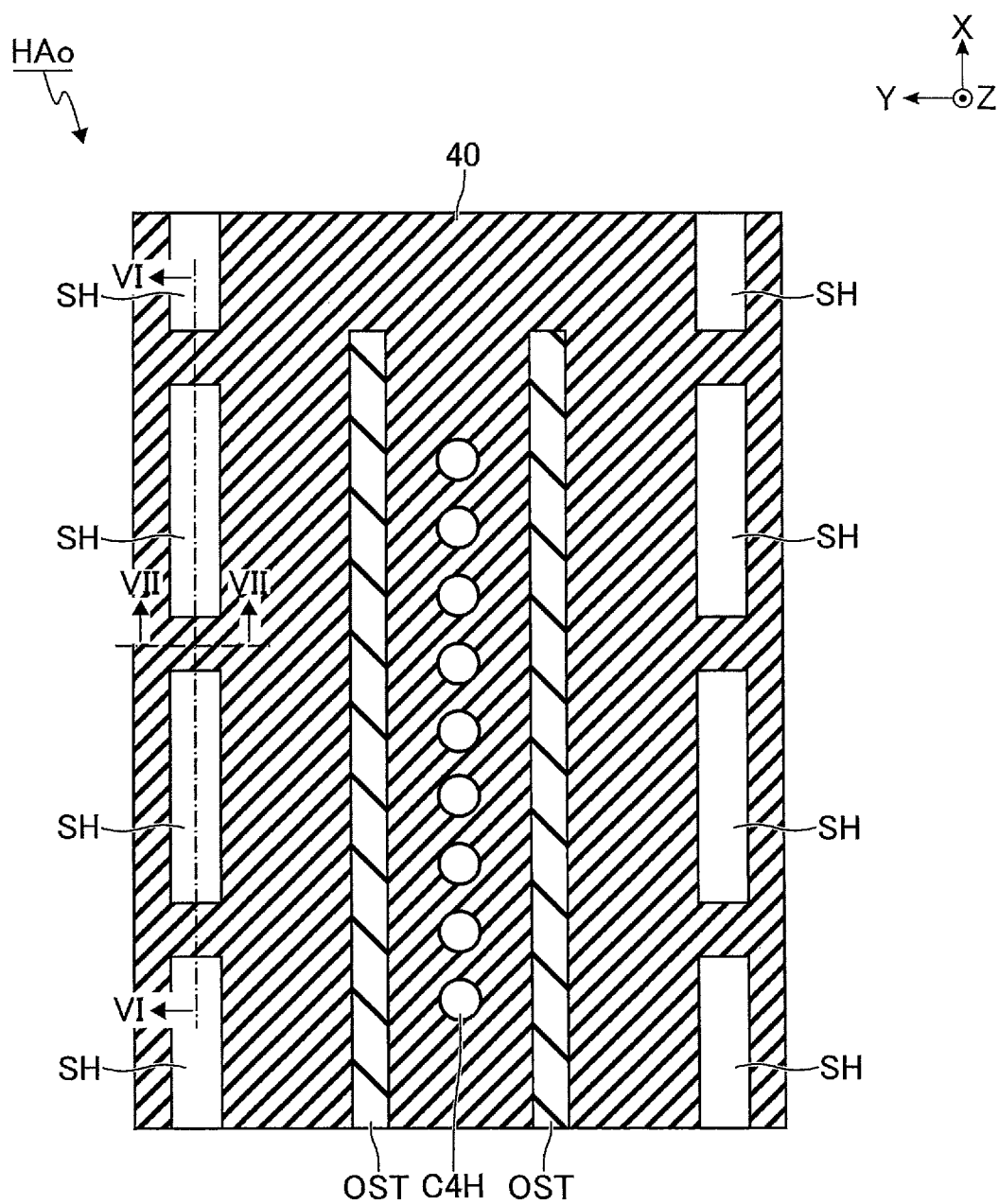
FIG. 43 is a plan view taken along the surface of the uppermost insulating layer in FIG. 8 and showing an example of a planar structure during the process of manufacturing the semiconductor memory device according to the first embodiment.
Figure 44:
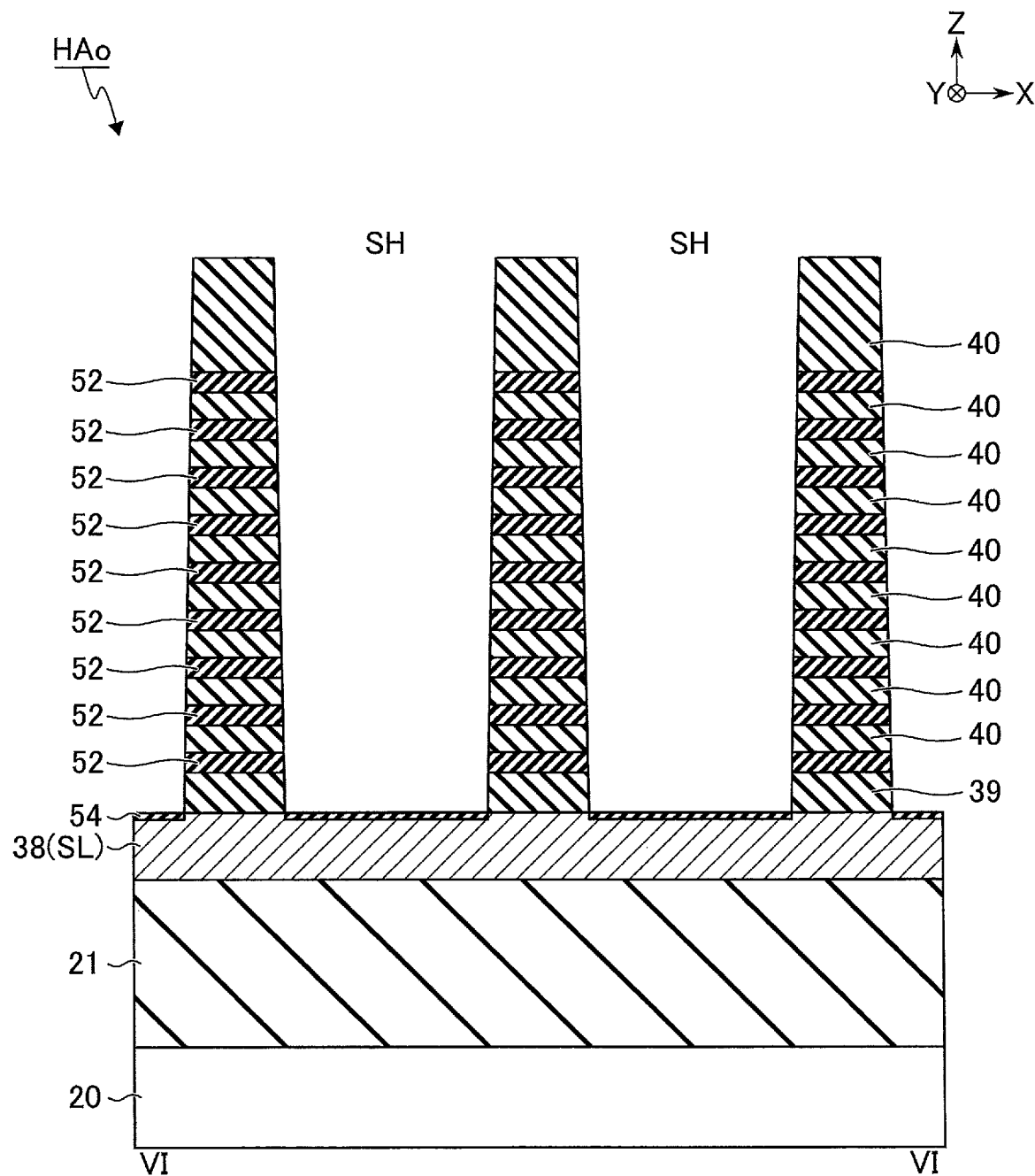
FIG. 44 is a cross-sectional view taken along line VI-VI of FIG. 43 and showing an example of a cross-sectional structure during the process of manufacturing the semiconductor memory device according to the first embodiment.

Next, as shown in FIG. 43 to FIG. 45, an insulating layer 54 is formed (S110). The planar structure illustrated in FIG. 43 has no difference from that of FIG. 42. The cross-sectional structure illustrated in FIG. 44 shows a cross-sectional view taken along line VI-VI in FIG. 43. The cross-sectional structure illustrated in FIG. 45 shows a cross-sectional view taken along line VII-VII in FIG. 43.

The cross-sectional structure illustrated in FIG. 45 has no difference from that of FIG. 41. For example, as shown in FIG. 44, the interconnect layer 38 exposed in the bottom surfaces of the plurality of slits SH is oxidized. In S110, the insulating layer 54 (silicon oxide) on the bottom surfaces of the plurality of slits SH is formed.

Figure 47:
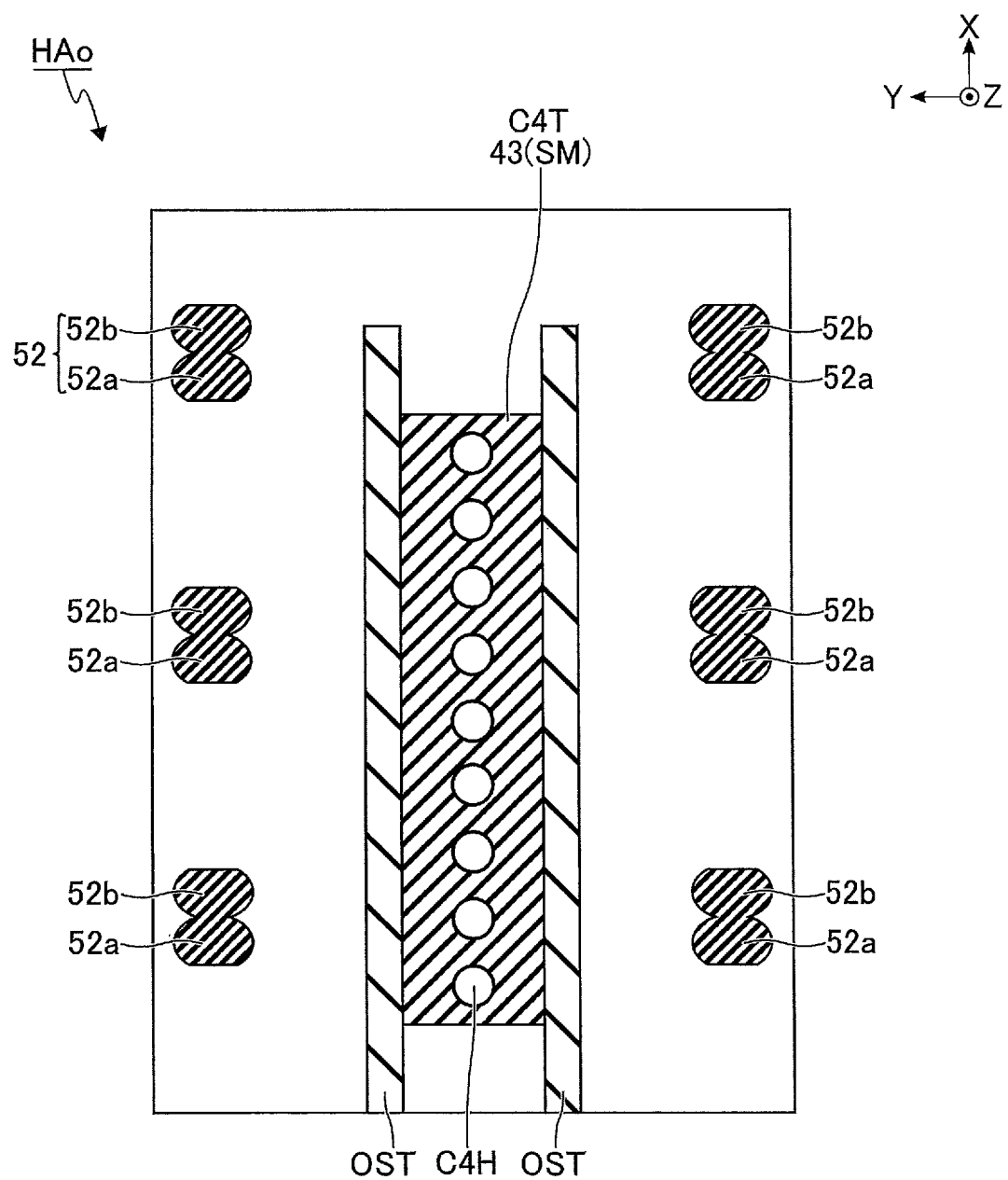
FIG. 47 is a plan view taken along line V-V of FIG. 8 and showing an example of a planar structure during the process of manufacturing the semiconductor memory device according to the first embodiment.
Figure 51:
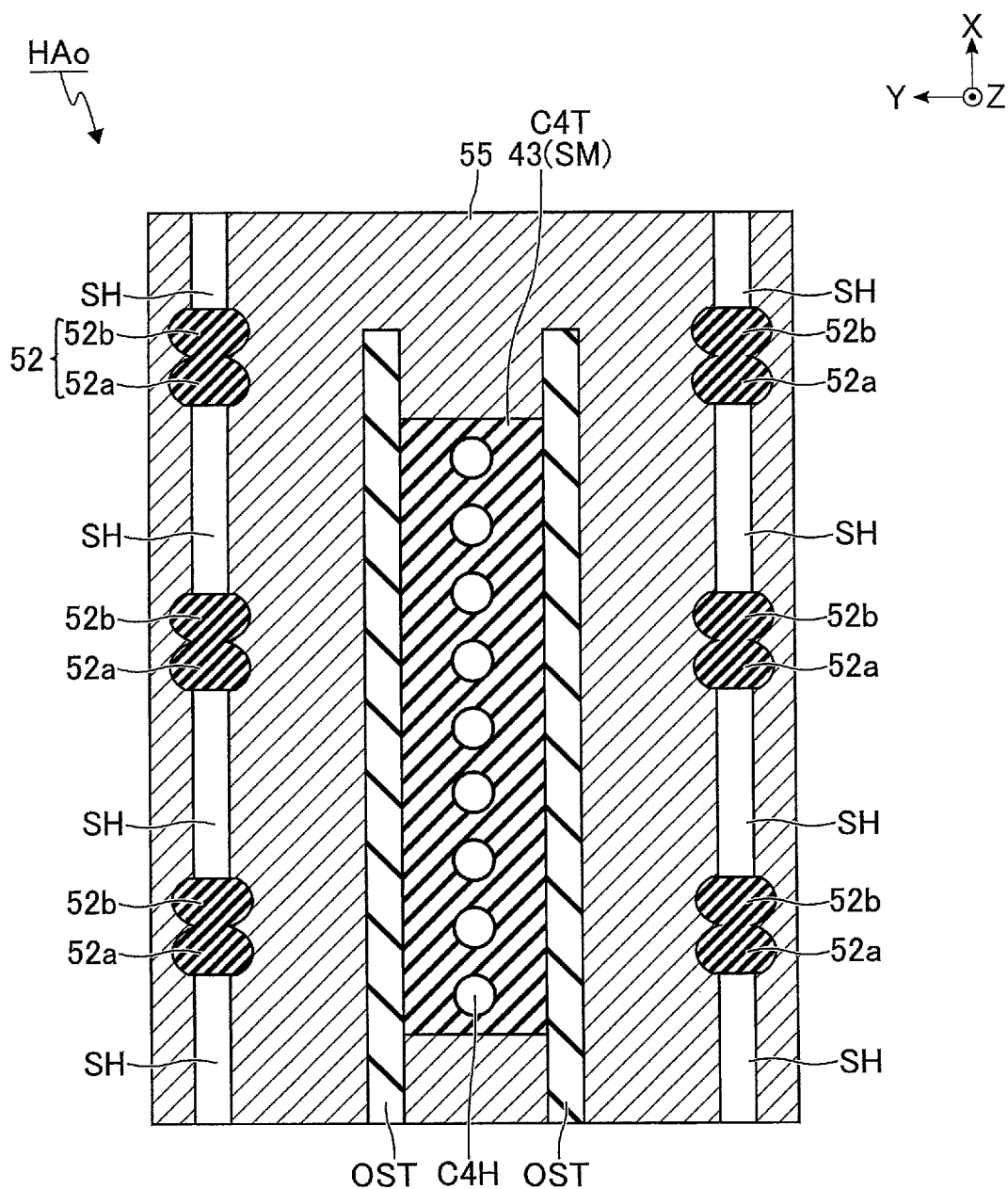
FIG. 51 is a plan view taken along line V-V of FIG. 8 and showing an example of a planar structure during the process of manufacturing the semiconductor memory device according to the first embodiment.

Next, as shown in FIG. 46 to FIG. 49, the sacrificial layers 42 and 43 are removed by, for example, isotropic etching such as wet etching (S111). The planar structure illustrated in FIG. 46 has no difference from that of FIG. 43. The cross-sectional structure illustrated in FIG. 48 shows a cross-sectional view taken along line VI-VI in FIG. 46. The cross-sectional structure illustrated in FIG. 48 has no difference from that of FIG. 44. The cross-sectional structure illustrated in FIG. 49 shows a cross-sectional view taken along line VII-VII in FIG. 46. In S111, an air gap is formed in an area corresponding to stacked interconnects. As shown in FIG. 47, the sacrificial layers 42 and 43 positioned in the contact area C4T remain without being removed because the members OST prevent entry of an etching solution from the direction of the slits SH. Therefore, an area that is included in the stacked interconnects and that overlaps the contact area C4T serves as an insulating area.

Figure 53:
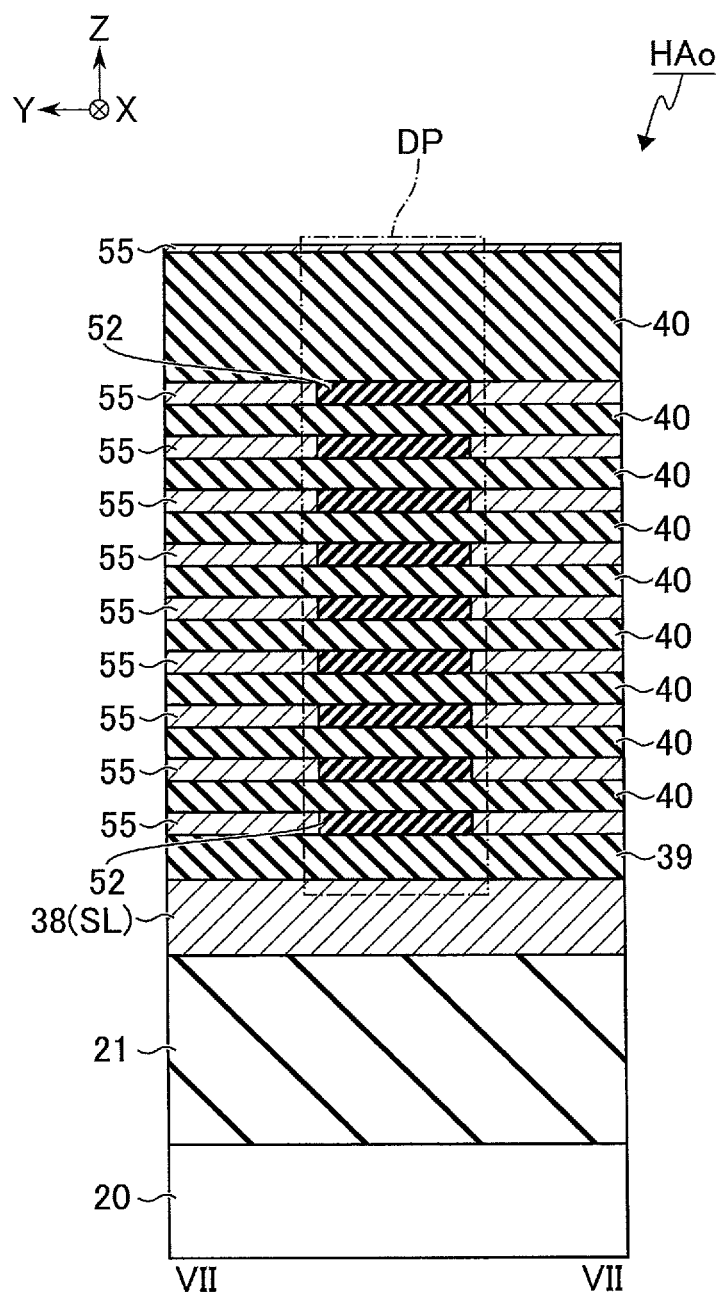
FIG. 53 is a cross-sectional view taken along line VII-VII of FIG. 50 and showing an example of a cross-sectional structure during the process of manufacturing the semiconductor memory device according to the first embodiment.

Next, as shown in FIG. 50 to FIG. 53, the conductors 55 and 56 and the insulator 57 are formed (S112). The cross-sectional structure illustrated in. FIG. 52 shows a cross-sectional view taken along line VI-VI in FIG. 50. The cross-sectional structure illustrated in FIG. 53 shows a cross-sectional view taken along line VII-VII in FIG. 50. In S112, the insulator 57 is formed in an area from which the sacrificial layers 42 and 43 are removed in S111. Furthermore, the insulator 57 is formed on the uppermost insulating layer 40, the side and bottom surfaces of the plurality of slits SH, and the members OST. Prior to S112, the plurality of contact holes C4H are covered with an insulating film (not shown). Therefore, the insulator 57 is not formed in the plurality of contact holes C4H but is formed on the insulating film (not shown) that covers the plurality of contact holes C4H. At this time, a film thickness of the insulator 57 is set such that the insulator 57 does not fill up the air gap formed in S111. After formation of the insulator 57, the conductor 56 is formed on the insulator 57. At this time, a film thickness of the conductor 56 is set such that the conductor 56 does not fill up the air gap formed in S111. After formation of the conductor 56, the conductor 55 is formed on the conductor 56. At this time, a film thickness of the conductor 55 is set such that the conductor 55 fills up the air gap formed in S111 and does not fill up the slit SH.

Figure 54:
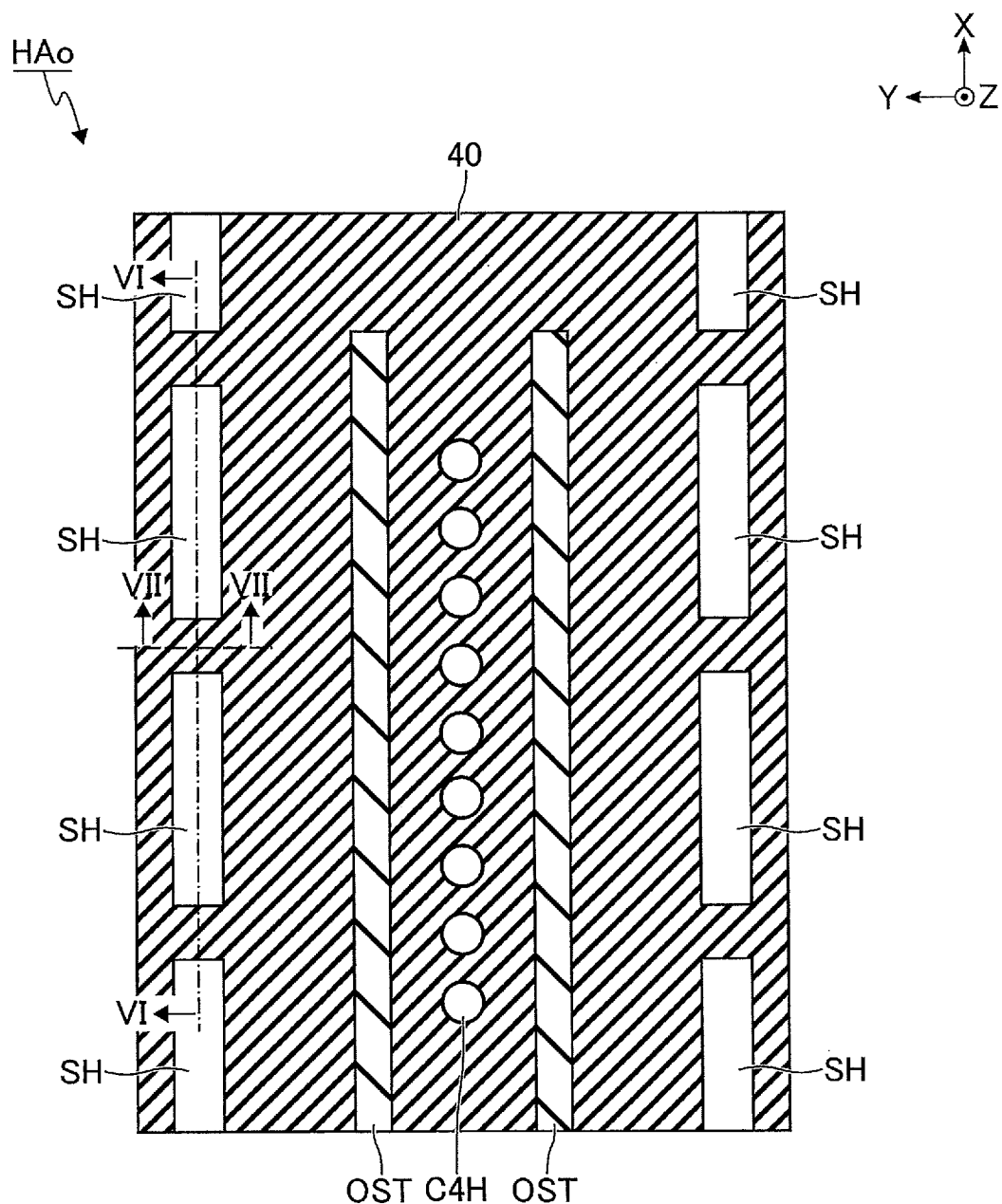
FIG. 54 is a plan view taken along the surface of the uppermost insulating layer in FIG. 8 and showing an example of a planar structure during the process of manufacturing the semiconductor memory device according to the first embodiment.
Figure 56:
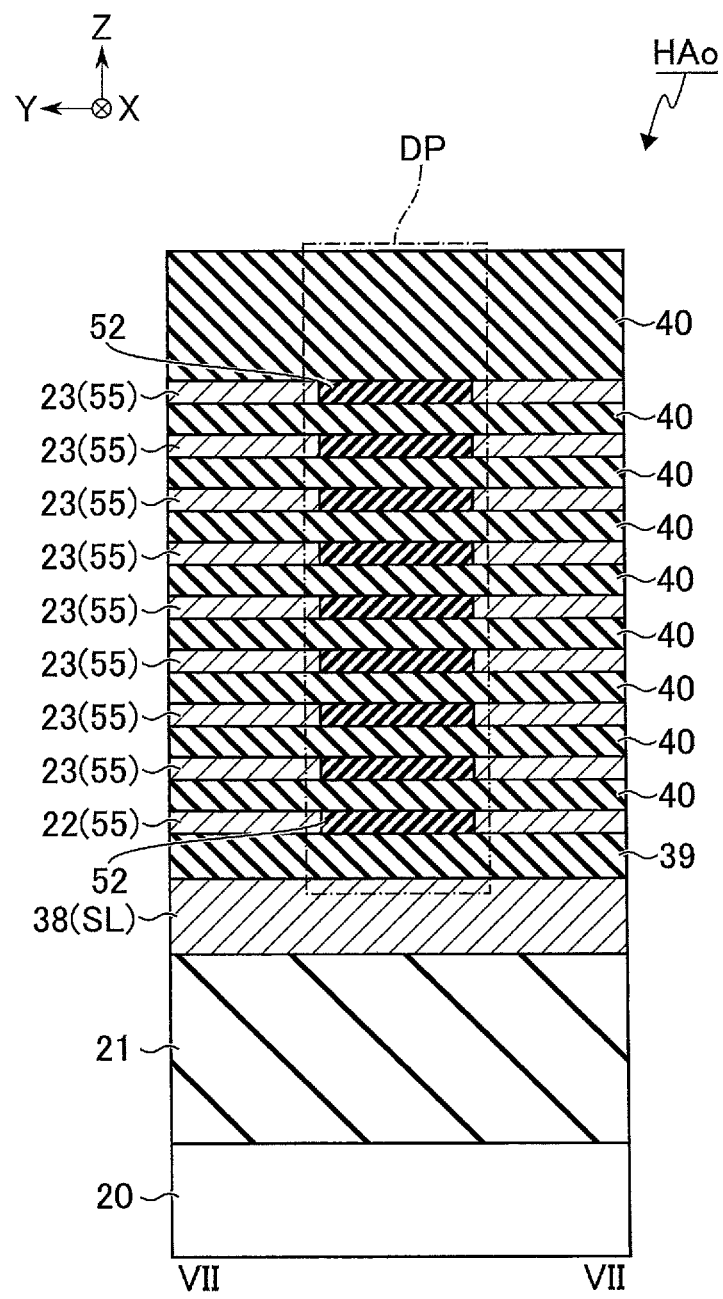
FIG. 56 is a cross-sectional view taken along line VII-VII of FIG. 54 and showing an example of a cross-sectional structure during the process of manufacturing the semiconductor memory device according to the first embodiment.

Next, as shown in FIG. 54 to FIG. 56, the conductors 55 and 56 and the insulator 57 are processed by, for example, isotropic etching such as wet etching (S113). The cross-sectional structure illustrated in FIG. 55 shows a cross-sectional view taken along line VI-VI in FIG. 54. The cross-sectional structure illustrated in FIG. 56 shows a cross-sectional view taken along line VII-VII in FIG. 54. In S113, portions of the conductors 55 and 56 and the insulator 57 which are positioned on the uppermost insulating layer 40 are removed, portions of the conductors 55 and 56 and the insulator 57 which are portioned on the side and bottom surfaces of the plurality of slits SH are removed, portions of the conductors 55 and 56 and the insulator 57 which are positioned on the member OST are removed, and portions of the conductors 55 and 56 and the insulator 57 which are positioned on the insulating film (not shown) that covers the plurality of contact holes CH4 are removed, thereby forming the plurality of interconnect layers 22 and 23, as shown in FIG. 56.

Figure 57:
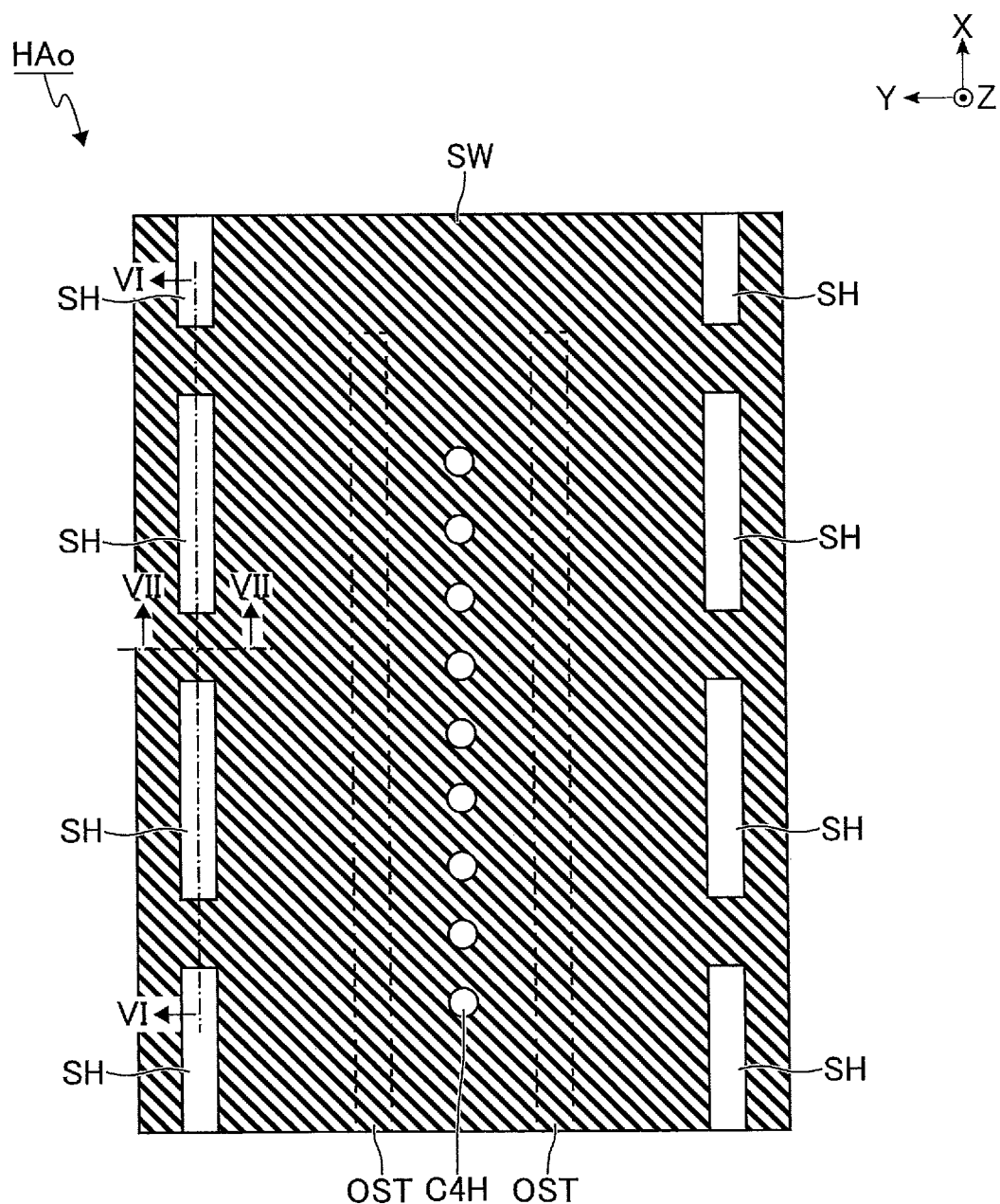
FIG. 57 is a plan view taken along the surface of the uppermost insulating layer in FIG. 8 and showing an example of a planar structure during the process of manufacturing the semiconductor memory device according to the first embodiment.
Figure 58:
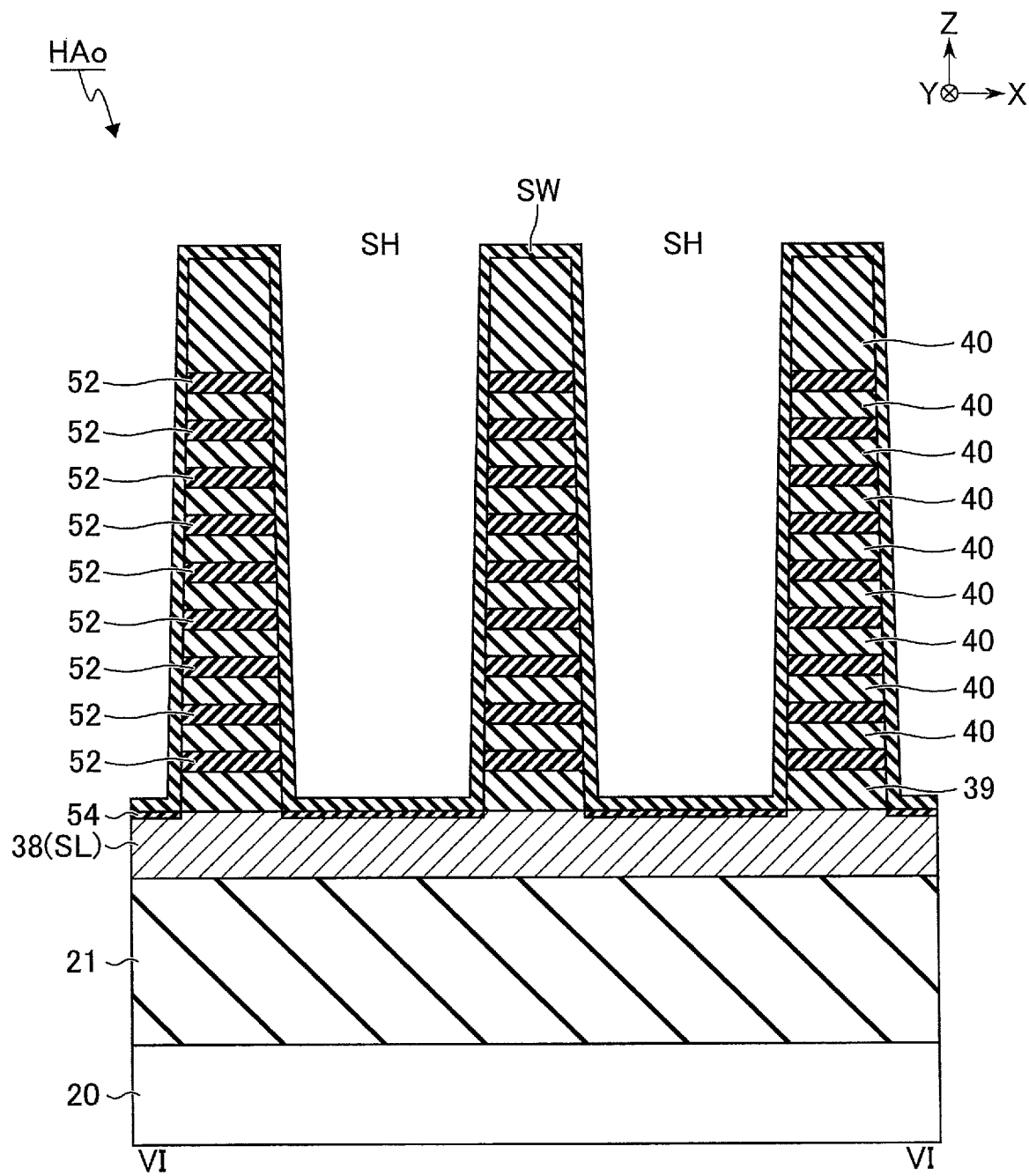
FIG. 58 is a cross-sectional view taken along line VI-VI of FIG. 57 and showing an example of a cross-sectional structure during the process of manufacturing the semiconductor memory device according to the first embodiment.
Figure 59:
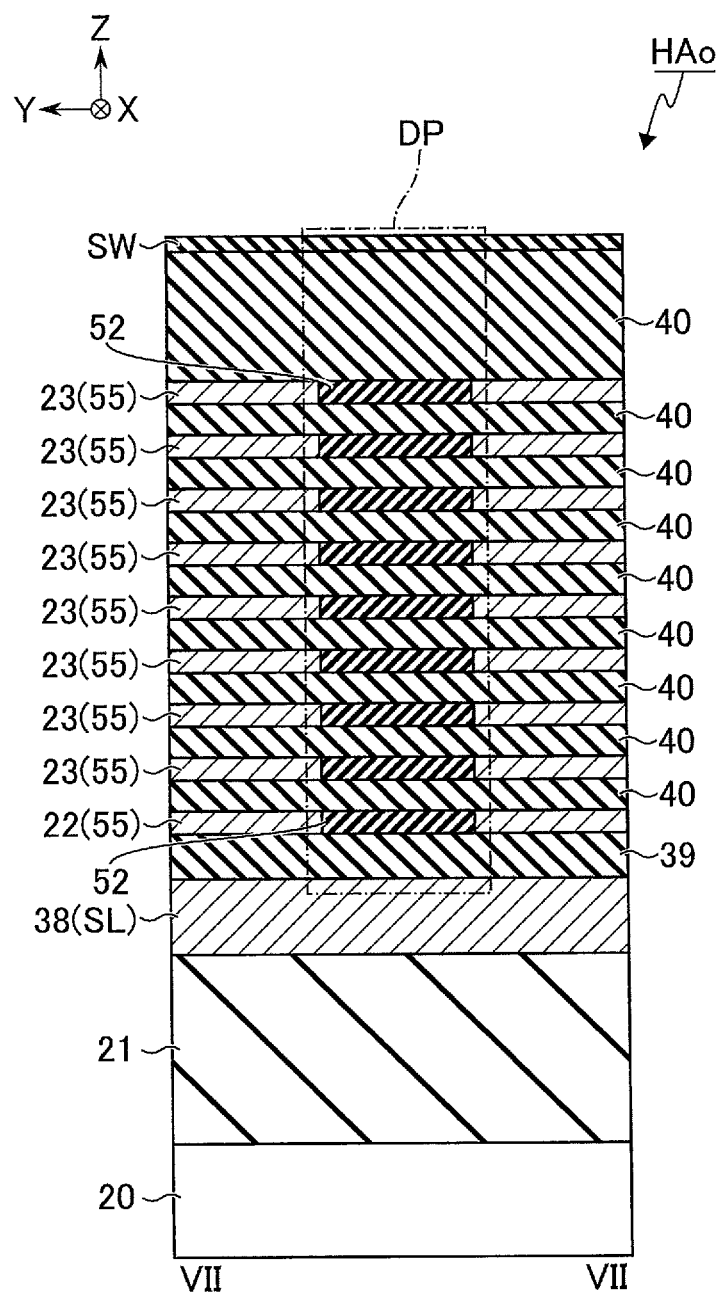
FIG. 59 is a cross-sectional view taken along line VII-VII of FIG. 57 and showing an example of a cross-sectional structure during the process of manufacturing the semiconductor memory device according to the first embodiment.

Next, as shown in FIG. 57 to FIG. 59, the insulator SW is formed (S114). The cross-sectional structure illustrated in FIG. 58 shows a cross-sectional view taken along line VI-VI in FIG. 57. The cross-sectional structure illustrated in FIG. 59 shows a cross-sectional view taken along line VII-VII in FIG. 57. In S114, the insulator SW are formed on the uppermost insulating layer 40, the side and bottom surfaces of the plurality of slits SH and the plurality of contact holes C4H, and the member OST.

Figure 60:
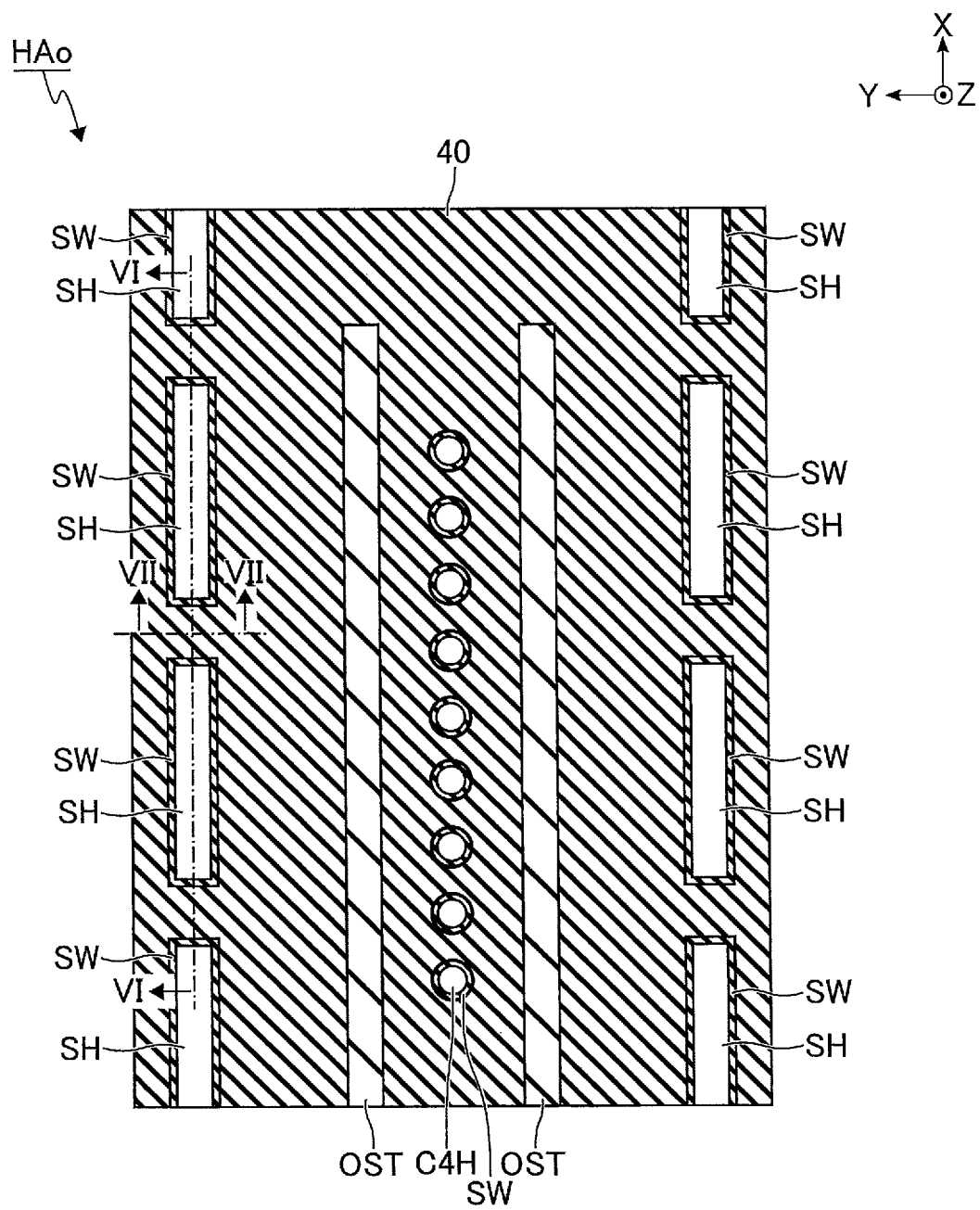
FIG. 60 is a plan view taken along the surface of the uppermost insulating layer in FIG. 8 and showing an example of a planar structure during the process of manufacturing the semiconductor memory device according to the first embodiment.
Figure 61:
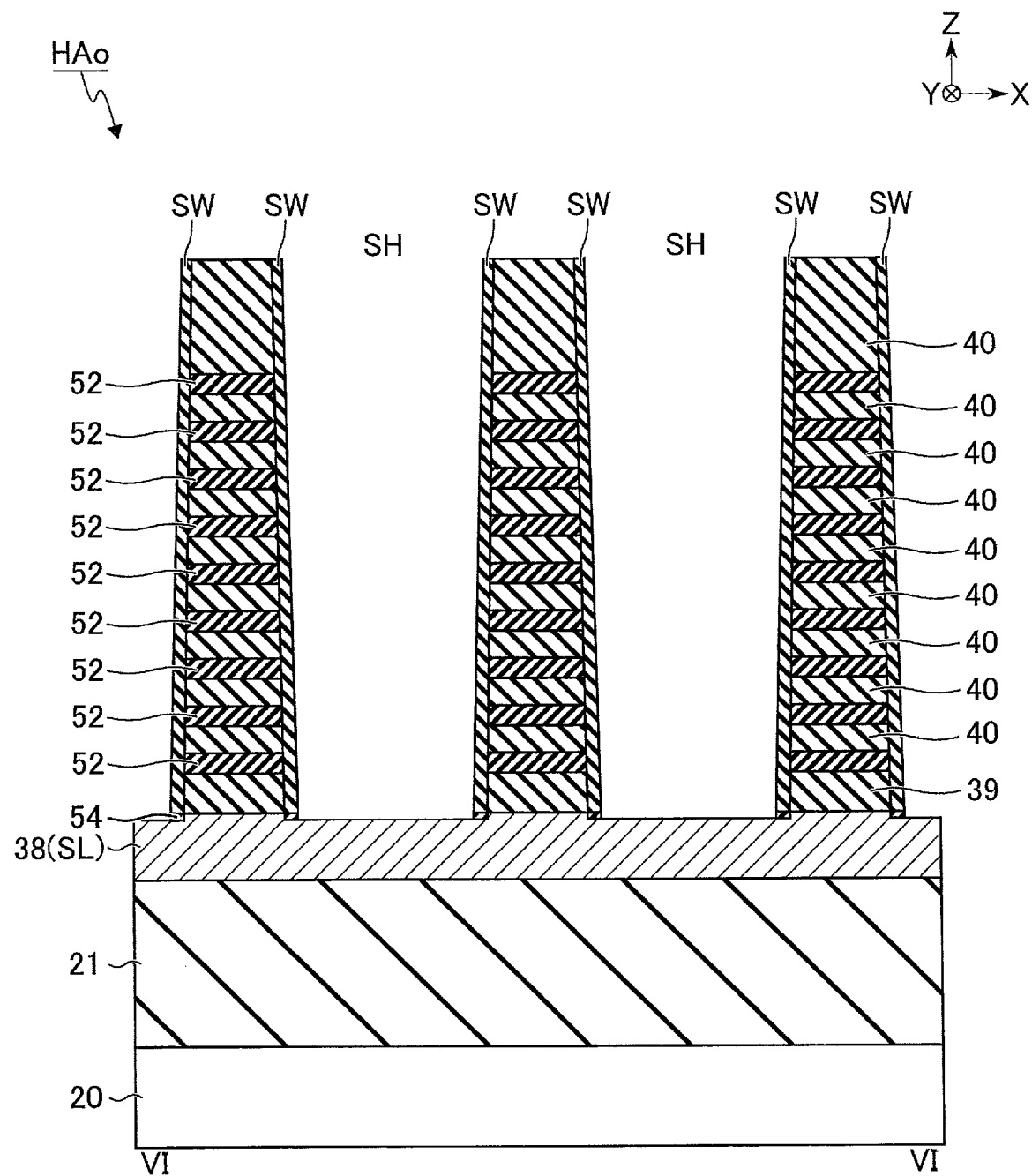
FIG. 61 is a cross-sectional view taken along line VI-VI of FIG. 60 and showing an example of a cross-sectional structure during the process of manufacturing the semiconductor memory device according to the first embodiment.
Figure 62:
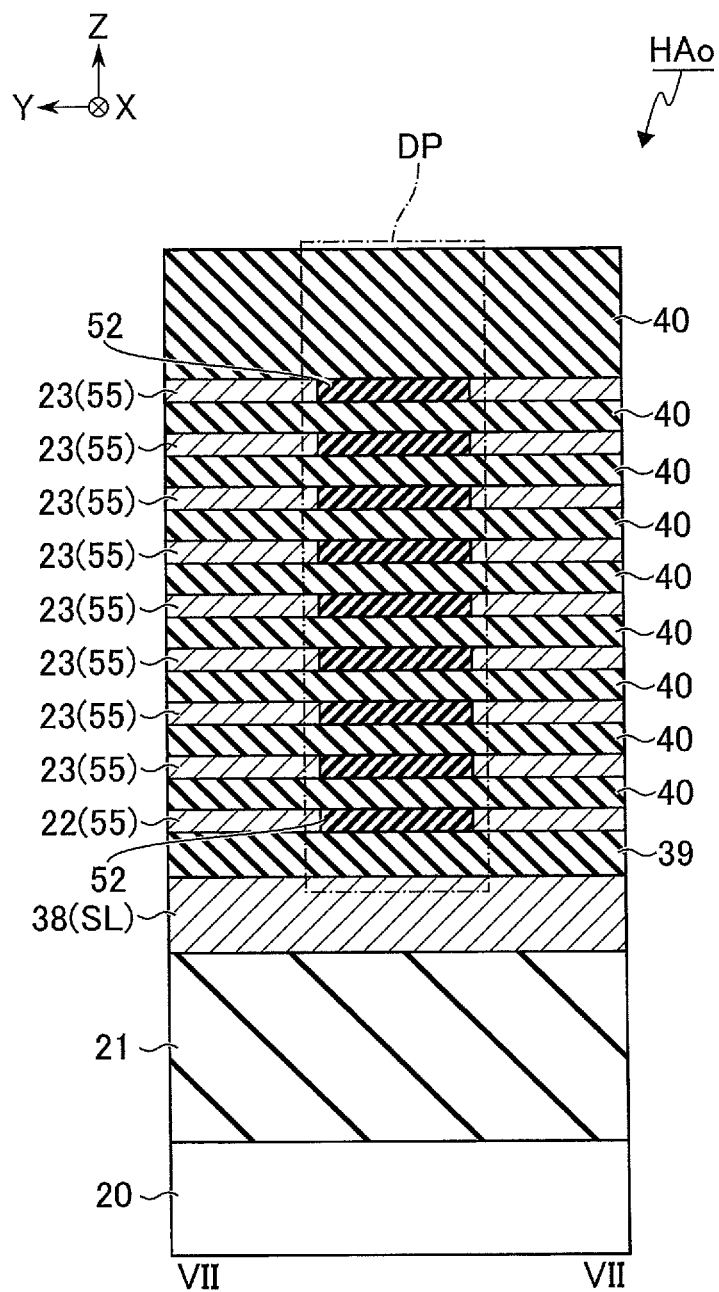
FIG. 62 is a cross-sectional view taken along line VII-VII of FIG. 60 and showing an example of a cross-sectional structure during the process of manufacturing the semiconductor memory device according to the first embodiment.

Next, as shown in FIG. 60 to FIG. 62, the insulator SW is processed by anisotropic etching (S115). The cross-sectional structure illustrated in FIG. 61 shows a cross-sectional view taken along line VI-VI in FIG. 60. The cross-sectional structure illustrated in FIG. 62 shows a cross-sectional view taken along line VII-VII in FIG. 60. In S115, portions of the insulator SW which are positioned on the uppermost insulating layer 40 are removed, portions of the insulating layer 54 and the insulator SW which are positioned on the bottom surfaces of the plurality of slits SH are removed, portions of the insulator SW which are positioned on the bottom surfaces of the plurality of contact holes C4H are removed, and portions of the insulator SW which are positioned on the member OST are removed.

Figure 66:
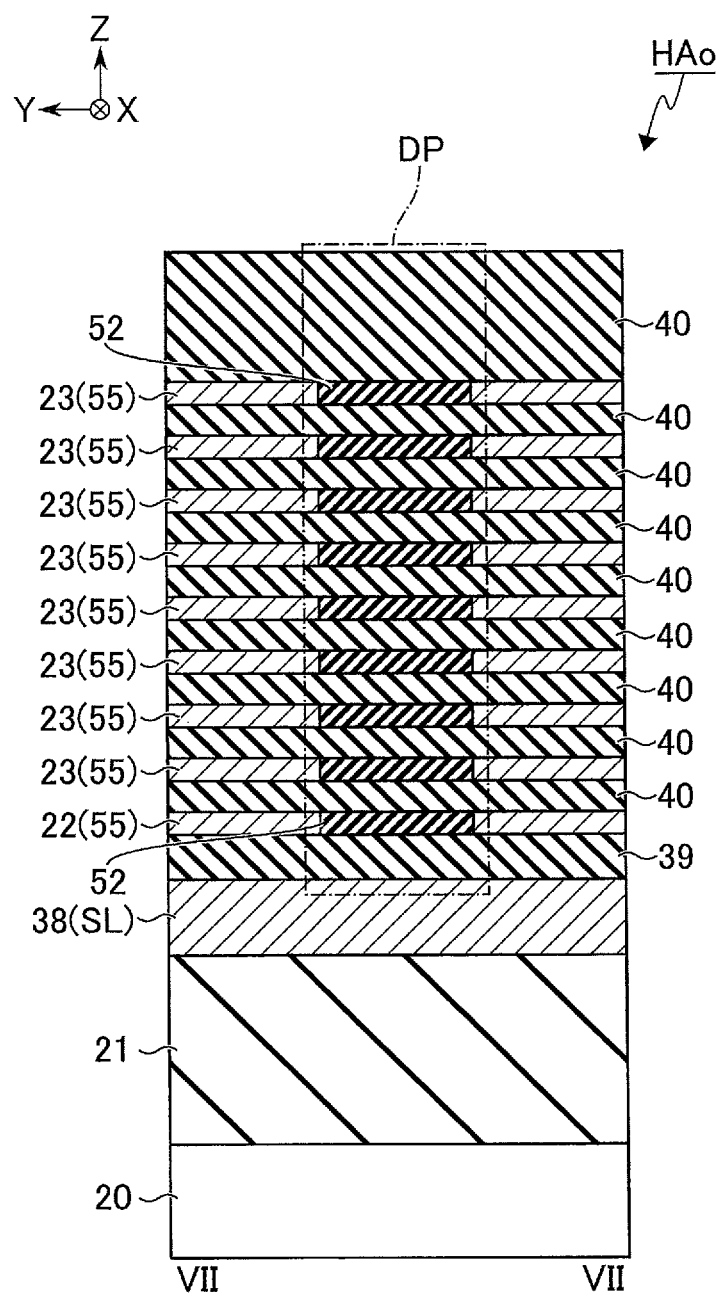
FIG. 66 is a cross-sectional view taken along line VII-VII of FIG. 63 and showing an example of a cross-sectional structure during the process of manufacturing the semiconductor memory device according to the first embodiment.

Next, as shown in FIG. 63 to FIG. 66, the contact plugs LI are embedded in the plurality of slits SH, and the contact plugs C4 are embedded in the plurality of contact holes C4H (S116). The cross-sectional structure illustrated in FIG. 65 shows a cross-sectional view taken along line VI-VI in FIG. 63. The cross-sectional structure illustrated in FIG. 66 shows a cross-sectional view taken along line VII-VII in FIG. 63. The cross-sectional structure illustrated in FIG. 66 has no difference from that of FIG. 62. In S116, the member SLT and the contact plug C4 are formed. Specifically, the contact plugs LI each having a film thickness such that the slits SH are filled up are formed. The contact plugs C4 each having a film thickness such that contact holes C4H are filled up are formed. Next, the contact plugs LI and C4 on the uppermost insulating layer 40 are removed by, e.g., Chemical Mechanical Polishing (CMP).

Figure 68:
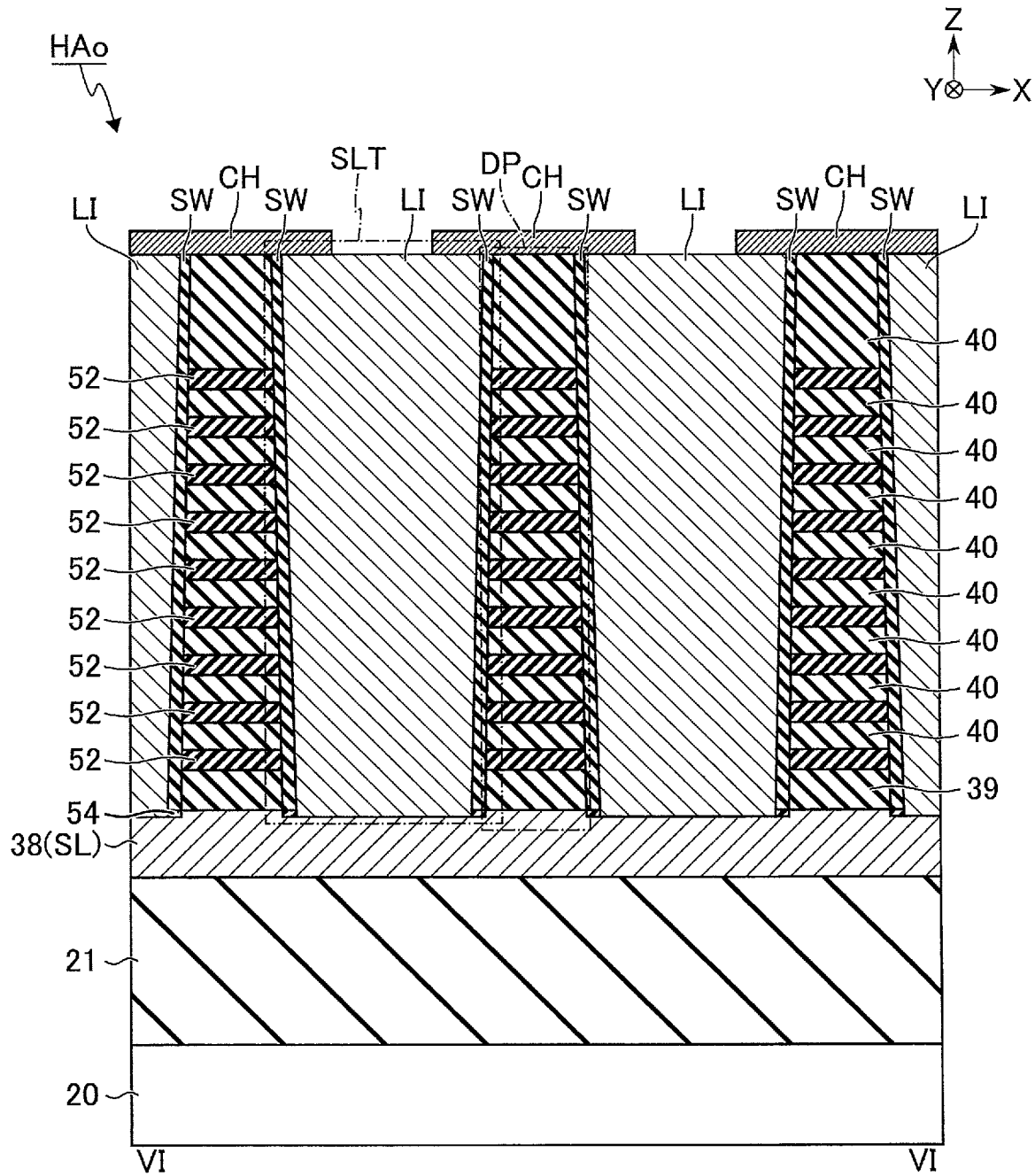
FIG. 68 is a cross-sectional view taken along line VI-VI of FIG. 67 and showing an example of a cross-sectional structure during the process of manufacturing the semiconductor memory device according to the first embodiment.

Next, as shown in FIG. 67 to FIG. 69, the conductor CH is formed (S117). The cross-sectional structure illustrated in FIG. 68 shows a cross-sectional view taken along line VI-VI in FIG. 67. The cross-sectional structure illustrated in FIG. 69 shows a cross-sectional view taken along line VII-VII in FIG. 67. In S117, the conductor CH are formed on the uppermost insulating layer 40, the insulator SW, and the contact plug LI in the vicinity of the end portion in the X direction of the member SLT.

In the present embodiment, the plurality of insulating layers 52 in the dividing portions DP are formed independently of the plurality of members SLT with a replace process interposed therebetween. For this reason, in some cases, the insulator 57, which is much thinner and more uneven here than in the modification to be described later because a metal oxide as a block insulating film formed in the replace process turns into a residue, may exist between at least part of the insulating layers 52 and the member SLT.

The manufacturing process described in the above forms the members SLT in the memory cell array 10. The manufacturing process described in the above is merely an example and is not limited thereto. For example, another step may be inserted between the respective manufacturing steps or some of the steps may be omitted or integrated. Furthermore, the respective manufacturing steps may be interchanged where possible.

1.3 Advantageous Effect of Present Embodiment

According to the first embodiment, the yield of the semiconductor memory device 3 can be improved. This advantageous effect will be described below.

In the hookup area HAo, the two members OST extending in the X direction are arranged in the Y direction in such a manner that the contact area C4T is sandwiched therebetween. The two slits SH extending in the X direction are arranged in the Y direction in such a manner that the two members OST and the contact area C4T are sandwiched therebetween. With this arrangement, during a process of forming the interconnect layers 22 to 24, one of the portions that are included in the stacked interconnects and are respectively sandwiched between the slits SH and the members OST is supported by the corresponding member OST but the other portion is not supported. This causes a possibility that an incline will occur in the stacked interconnects in the vicinity of the contact area C4T during the process of forming the interconnect layers 22 to 24. When an incline occurs in the stacked interconnects, there is a possibility that the slit SH will be blocked so that the contact plug LI cannot be formed.

On the other hand, according to the present embodiment, the member SLT facing the member OST can be divided into a plurality of portions. Then, the insulating layers 52 can be formed in the same layers as the interconnect layers 22 and 23 between the divided members SLT. By forming the insulating layers 52 by dividing the member SLT, that is, by dividing the slit SH, deformation (blockage) in the slits SH can be prevented in the hookup area HAo during the process of forming the interconnect layers 22 to 24. That is, an incline can be prevented from occurring. Furthermore, by forming the insulating layers 52 between the members SLT, the stacked interconnects in two blocks BLK provided on both sides of the slit SLT can be divided. Thus, the yield of the semiconductor memory device 3 can be improved.

1.4 Modification

The semiconductor memory device 3 according to a modification of the first embodiment will be described. The semiconductor memory device 3 according to the present modification differs from the first embodiment in terms of the configuration of the area in the vicinity of the dividing portion DP. Hereinafter, the following description will in principle concentrate on the features different from the first embodiment.

1.4.1 Area in Vicinity of Dividing Portion DP

Figure 70:
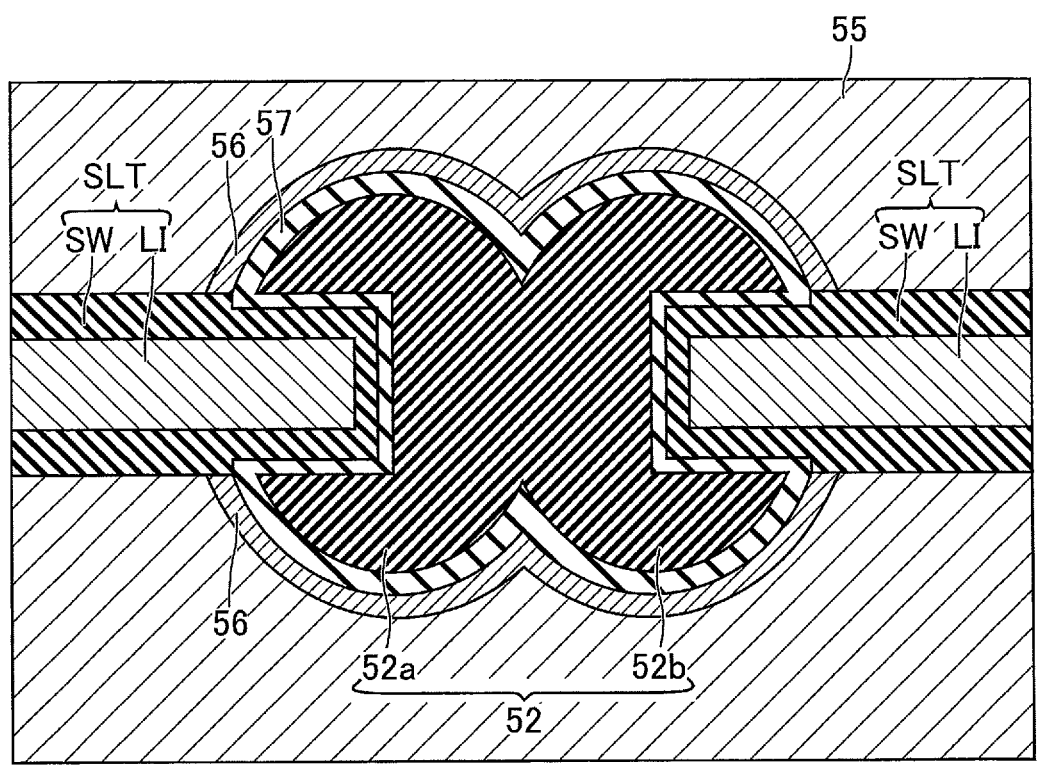
FIG. 70 is an enlarged view of an area RA shown in FIG. 4 in a semiconductor memory device according to a modification of the first embodiment.

FIG. 70 is an enlarged view of an area RA in FIG. 4 in the semiconductor memory device 3 according to the present modification. FIG. 70 shows a cross-sectional view along the XY plane including the insulating layer 52.

The insulator 57 covers the entire side surface of the insulating layer 52 and the side surfaces in the vicinities of the end portions in the X direction of the insulators SW. The insulator 57 is provided between the insulating layer 52 and the two adjacent members SLT (insulators SW). The insulating layer 52, one (insulator SW) of the two members SLT, and the other member SLT (insulator SW) adjacent in the X direction are in contact with the insulator 57 in the X direction. In the cross-sectional view along the XY plane including the insulating layer 39 or 40 (not shown), the insulator 57 covers the side surface of the insulating layer 39 or 40. The insulator SW covers the side surface of the contact plug LI. The conductor 56 covers the side surface of the end portion in the Y direction of the insulator 57. The conductor 56 covers part of the side surface of the conductor 55.

FIG. 71 is an enlarged view of an area RB in FIG. 7 in the semiconductor memory device 3 according to the present modification.

The insulator 57 covers the side surfaces of the insulating layers 40 and 52. The member SLT covers the side surface of the insulator 57.

The enlarged view of the area RC in FIG. 8 in the semiconductor memory device 3 according to the present modification is the same as FIG. 12 according to the first embodiment.

1.4.2 Manufacturing Method of Semiconductor Memory Device

The method of manufacturing the members SLT in the semiconductor memory device 3 according to the present modification differs from that of the first embodiment in terms of, for example, S113. In S113, the conductors 55 and 56 are processed by, for example, isotropic etching such as wet etching; however, the insulator 57 is not processed (removed). The rest of the process in the method of manufacturing the members SLT is similar to that of the first embodiment.

1.4.3 Advantageous Effects

The configuration according to the present modification produces advantageous effects similar to those of the first embodiment.

2. Second Embodiment

A semiconductor memory device according to a second embodiment will be described. The semiconductor memory device 3 according to the second embodiment differs from the semiconductor memory device 3 according to the first embodiment in that the dividing portion DP is arranged not only in the hookup area HAo but also in the hookup area HAs in the memory cell array 10. In the following description, the description of similar configurations to those of the first embodiment will be omitted, and the configurations different from those of the first embodiment will be mainly described. Furthermore, the description of the method of manufacturing the members SLT in the semiconductor memory device 3 according to the second embodiment will be omitted since it is equivalent to that of the first embodiment.

2.1 Hookup Area of Memory Cell Array (Planar Structure)

Figure 72:
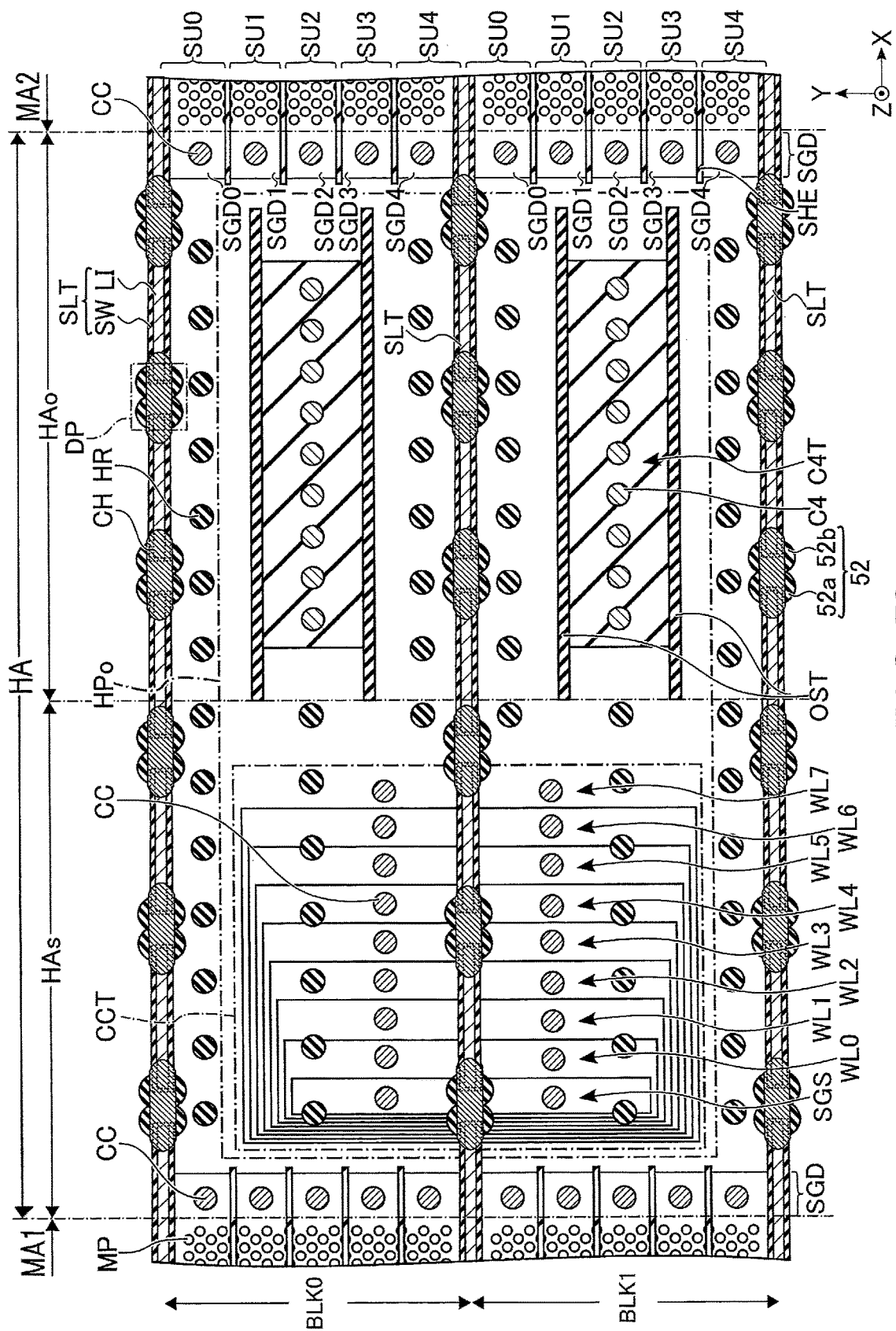
FIG. 72 is a plan view showing an example of a detailed planar structure in a hookup area of a memory cell array included in a semiconductor memory device according to a second embodiment.

The planar structure of the hookup area HA will be described in detail with reference to FIG. 72. FIG. 72 is a plan view showing an example of a detailed planar structure in the hookup area HA of the memory cell array 10. FIG. 72 shows the hookup area HA and part of the memory areas MA1 and MA2 in the two blocks BLK0 and BLK1. Each block BLK is divided by the members SLT and SHE into the string units SU0 to SU4. Interlayer insulating layers are omitted.

In the example shown in FIG. 72, three dividing portions DP and three conductors CH are further provided in the X direction in the hookup area HAs. The three dividing portions DP in the hookup area HAs are in contact with the hookup area HAs, and are arranged in positions facing the contact area CCT in the Y direction. In other words, the dividing portions DP and the staircase portion of the contact area CCT are arranged in the Y direction. The member SLT is divided into seven portions by the three dividing portions DP in the hookup area HAo and the three dividing portions DP in the hookup area HAs. The three conductors CH in the hookup area HAs are provided in a similar manner to the first embodiment.

2.2 Advantageous Effects of Present Embodiment

The second embodiment produces advantageous effects similar to those of the first embodiment.

Furthermore, as stated in the first embodiment, in the contact area CCT of the hookup area HAs, the YZ plane of the stacked interconnects for each block BLK is configured to be asymmetrical with respect to the axis Z1 that passes through the center in the Y direction of each block BLK and extends in the Z direction. This causes a possibility that an incline will occur in the stacked interconnects in the vicinity of the contact area CCT during the process of forming the interconnect layers 22 to 24.

On the other hand, according to the present embodiment, the member SLT facing the contact area CCT can be divided into a plurality of portions. Then, the insulating layers 52 can be formed in the same layers as the interconnect layers 22 and 23 between the divided members SLT. By forming the insulating layers 52 by dividing the member SLT, that is, by dividing the slit SH, deformation in the slits SH can be prevented in the hookup area HAs during the process of forming the interconnect layers 22 to 24. That is, an incline can be prevented from occurring.

As a matter of course, the present embodiment is applicable to the modification of the first embodiment.

3. Third Embodiment

A semiconductor memory device according to a third embodiment will be described. The semiconductor memory device 3 according to the third embodiment differs from the semiconductor memory device 3 according to the first embodiment in that the memory area MA is arranged between the hookup area HA1 and the hookup area HA2, and the dividing portion DP is arranged in each of the hookup areas HA1 and HA2 in the memory cell array 10. In the following description, the description of similar configurations to those of the first embodiment will be omitted, and the configurations different from those of the first embodiment will be mainly described. Furthermore, the description of the method of manufacturing the member SLT in the semiconductor memory device 3 according to the third embodiment will be omitted since it is equivalent to that of the first embodiment except for the formation of the slits OSH and filling of the members OST being eliminated.

3.1 Outline of Planar Structure of Memory Cell Array

An outline of a planar structure of the memory cell array 10 will be described with reference to FIG. 73. FIG. 73 is a plan view showing an example of a planar structure of the memory cell array 10. FIG. 73 shows areas corresponding to the four blocks BLK0 to BLK3. The memory cell array 10 is divided in the X direction into the memory area MA and the hookup areas HA1 and HA2, for example. The memory area MA is arranged between the hookup area HA1 and the hookup area HA2. The memory area MA and the hookup areas HA1 and HA2 include the stacked interconnects in which the select gate line SGS, the word lines WL0 to WL7, and the select gate line SGD are stacked with a space therebetween in the Z direction in order from a lower layer. The hookup areas HA1 and HA2 will be described later in detail.

The plurality of members SLT are arranged in the Y direction. The member SLT extends in the X direction and crosses the memory area MA and the hookup areas HA1 and HA2. The member SLT divides the stacked interconnects in the two blocks BLK adjacent in the Y direction. FIG. 73 shows the example in which the five members SLT arranged in the Y direction are provided. Each of the four blocks BLK0 to BLK3 is arranged between the five members SLT. The member SLT has a plurality of portions (not shown) extending in the X direction.

The plurality of members SHE are arranged in the memory area. MA in each block BLK. For example, in the memory area MA, the plurality of members SHE are arranged in the Y direction. The member SHE extends in the X direction and crosses the memory area MA. Both ends of the member SHE are respectively included in the hookup areas HA1 and HA2. The member SHE divides the select gate lines SGD adjacent in the Y direction and does not divide the word lines WL and the select gate lines SGS provided below the select gate lines SGD. Each of the areas separated by the members SLT and SHE corresponds to a single string unit SU.

In the hookup areas HA1 and HA2, the member OST is eliminated.

The example in FIG. 73 shows the case provided with the four blocks BLK. However, in the case provided with the five or more blocks BLK, for example, the structure shown in FIG. 73 is arranged repeatedly in the Y direction.

The planar structure of the memory cell array 10 is not limited to the structure described in the above. For example, the number of members SHE provided between the two members SLT adjacent in the Y direction may be designed to be any number based on the number of string units SU in the block BLK.

3.2 Hookup Area of Memory Cell Array (Planar Structure)

Figure 74:
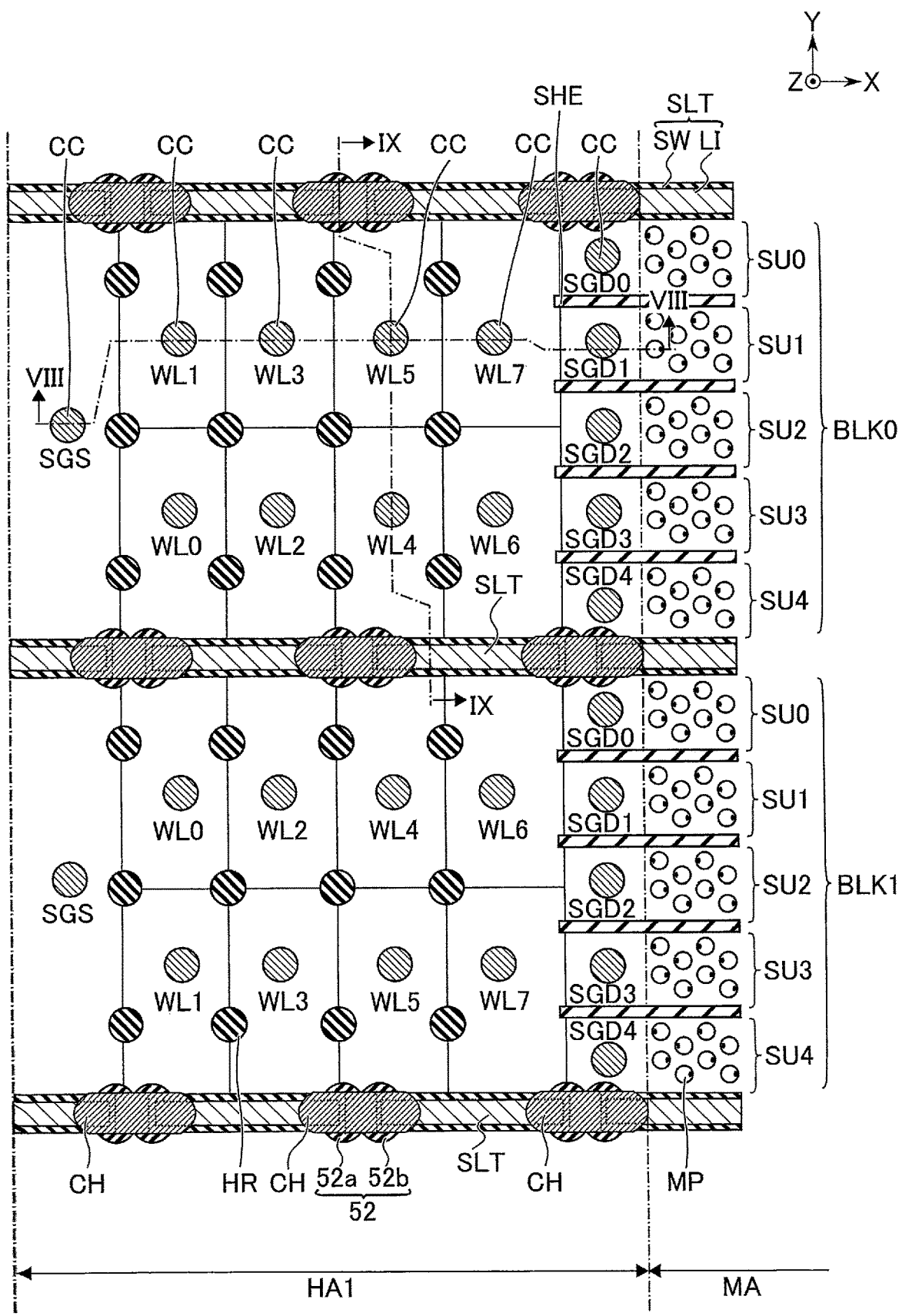
FIG. 74 is a plan view showing an example of a detailed planar structure in a hookup area of the memory cell array included in the semiconductor memory device according to the third embodiment.

The planar structure of the hookup area HA1 will be described in detail with reference to FIG. 74. FIG. 74 is a plan view showing an example of a detailed planar structure in the hookup area HA1 of the memory cell array 10. FIG. 74 shows the hookup area HA1 and part of the memory area MA in the two blocks BLK0 and BLK1. Each block BLK is divided by the members SLT and SHE into the string units SU0 to SU4. The interlayer insulating layers are omitted.

In the hookup area HA1, the select gate lines SGS and SGD and the word lines WL0 to WL7 respectively have terrace portions. The example of FIG. 74 shows the case in which the end portions of the word lines WL0 to WL7 are formed in a double-row staircase shape having one step in the Y direction and multiple steps in the X direction. To be more specific, each even-numbered word line WL (word lines WL0, WL2, WL4, and WL6) and each odd-numbered word line WL (word lines WL1, WL3, WL5, and WL7) have one step in the Y direction between corresponding terrace portions. The two word lines WL whose terrace portions are adjacent in the X direction have two steps in the X direction between the terrace portions. In the block BLK0, the terrace portions of the even-numbered word lines WL are positioned on the lower side of the drawing sheet, and the terrace portions of the odd-numbered word lines WL are positioned on the upper side of the drawing sheet. In the block BLK1, the terrace portions of the even-numbered word lines WL are positioned on the upper side of the drawing sheet, and the terrace portions of the odd-numbered word lines WL are positioned on the lower side of the drawing sheet. As described in the above, the hookup area HA1 has a staircase portion in which the respective end portions of the select gate lines SGS and SGD and the word lines WL0 to WL7 are drawn out in a stepwise manner.

In the example shown in FIG. 74, three dividing portions DP are provided in the X direction in the hookup area HA1. The three dividing portions DP are in contact with the hookup area HA1 and are arranged in positions facing the staircase portion in the Y direction. In other words, the dividing portions DP and the staircase portion are arranged in the Y direction. The three dividing portions DP divide the member SLT into four portions.

In the hookup area HA1, the contact plugs CC are provided on the terrace portions of the select gate lines SGS and SGD and the word lines WL0 to WL7.

In addition, in the hookup area HA1, the support pillars HR are arranged as appropriate in an area excluding the members SLT and SHE and the contact plugs CC.

Although not shown, the hookup area HA2 is similar to the hookup area HA1.

(Cross-Sectional Structure)

A cross-sectional structure of the memory cell array 10 will be described with reference to FIG. 75. FIG. 75 is a cross-sectional view taken along line VIII-VIII of FIG. 74. FIG. 75 shows the hookup area HA1 and part of the memory area MA.

In the hookup area HA1, the terrace portions of the interconnect layer 22, the plurality of interconnect layers 23, which respectively function as the word lines WL1, WL3, WL5, and WL7, and the interconnect layer 24 are provided in a stepwise manner. The plurality of contact plugs CC are respectively provided on the terrace portions of the interconnect layer 22, the plurality of interconnect layers 23 which respectively function as the word lines WL1, WL3, WL5, and WL7, and the interconnect layer 24. The interconnect layer 27 are provided on each contact plug CC. Each interconnect layer 27 is electrically coupled to one of the interconnect layer 22, the plurality of interconnect layers 23 which respectively function as the word lines WL1, WL3, WL5, and WL7, and the interconnect layer 24, with the contact plug CC intervening therebetween.

Each of the interconnect layers 22 to 24 includes areas (corresponding to HA1 and HA2) in which the memory pillars MP are not arranged and an area (corresponding to MA) in which the memory pillars MP are arranged. In each of the interconnect layers 22 to 24, the area in which the memory pillars MP are not arranged has a staircase portion in which the end portions of the interconnect layers 22 to 24 are drawn out in a stepwise manner.

FIG. 76 is a cross-sectional view taken along line IX-IX of FIG. 74. FIG. 76 shows the YZ plane of the stacked interconnects, the dividing portion DP, the conductor CH, the two contact plugs CC, and the member SLT in the hookup area HA1 corresponding to the block BLK0.

The example in FIG. 76 shows a cross section of a terrace portion of the interconnect layer 23 functioning as the word line WL4 and a terrace portion of the interconnect layer 23 functioning as the word line WL5 in the hookup area HA1. Above the terrace portion of the interconnect layer 23 functioning as the word line WL4, three interconnect layers 23 respectively functioning as the word lines WL5 to WL7 are eliminated. Above the terrace portion of the interconnect layer 23 functioning as the word line WL5, two interconnect layers 23 respectively functioning as the word lines WL6 and WL7 are eliminated. Therefore, in the hookup area HA1, the YZ plane of the stacked interconnects for each block BLK is configured to be asymmetrical with respect to the axis Z1 that passes through the center in the Y direction of each block BLK and extends in the Z direction.

In the hookup area HA1, the two contact plugs CC are provided in such a manner that one is positioned on the terrace portion of the interconnect layer 23 functioning as the word line WL4, and the other is positioned on the terrace portion of the interconnect layer 23 functioning as the word line WL5.

3.3 Advantageous Effects of Present Embodiment

As described in the above, in the hookup area HA1, the YZ plane of the stacked interconnects for each block BLK is configured to be asymmetrical with respect to the axis Z1 that passes through the center in the Y direction of each block BLK and extends in the Z direction. This causes a possibility that an incline will occur in the stacked interconnects in the vicinity of the staircase portion during the process of forming the interconnect layers 22 to 24.

On the other hand, according to the present embodiment, the member SLT facing the staircase portion can be divided into a plurality of portions. Then, the insulating layers 52 can be formed in the same layers as the interconnect layers 22 and 23 between the divided members SLT. By forming the insulating layers 52 by dividing the member SLT, that is, by dividing the slit SH, deformation in the slits SH can be prevented in the hookup area HA1 during the process of forming the interconnect layers 22 to 24. That is, an incline can be prevented from occurring. In the hookup area HA2 also, an incline can be prevented from occurring in a similar manner. Furthermore, by forming the insulating layers 52 between the members SLT, the stacked interconnects in two blocks BLK provided on both sides of the slit SLT can be divided. Thus, the yield of the semiconductor memory device 3 can be improved.

As a matter of course, the present embodiment is applicable to the modification of the first embodiment.

4. Modifications, Etc

As described above, the semiconductor memory device according to an embodiment includes a plurality of interconnect layers (SGS, WL, SGD) stacked above a substrate (20) and spaced apart from each other in a first direction (Z); a memory pillar (MP) configured to penetrate the plurality of interconnect layers (SGS, WL, SGD) in the first direction (Z); a first member and a second member (SLT) each having a longitudinal direction set to a second direction (X) intersecting the first direction (Z) when viewed from a top, the first member and the second member being arranged in the second direction and penetrating the plurality of interconnect layers (SGS, WL, SGD) in the first direction (Z); and a dividing portion (DP) provided between the first member and the second member (SLT). The dividing portion (DP) includes a plurality of insulating layers (52) spaced apart from each other in the first direction (Z). The plurality of insulating layers (52) each include a first portion (52a) and a second portion (52b). The first portion (52a) is provided between the first member (SLT) and the second portion (52b). The second portion (52b) is provided between the first portion (52a) and the second member (SLT). The first portion (52a) and the second portion (52b) each have an individual arc shape when viewed from the top and are in contact with each other.

The embodiments are not limited to those described in the above, and various modifications can be made.

Furthermore, the order of the steps in the flowchart described in the above embodiments may be altered to the extent possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a plurality of interconnect layers stacked above a substrate and spaced apart from each other in a first direction;
   a memory pillar configured to penetrate the plurality of interconnect layers in the first direction;
   a first member and a second member each having a longitudinal direction set to a second direction intersecting the first direction when viewed from a top, the first member and the second member being arranged in the second direction and penetrating the plurality of interconnect layers in the first direction; and
   a dividing portion provided between the first member and the second member,
   wherein the dividing portion includes a plurality of insulating layers spaced apart from each other in the first direction,
   the plurality of insulating layers each include a first portion and a second portion,
   the first portion is provided between the first member and the second portion,
   the second portion is provided between the first portion and the second member, and
   the first portion and the second portion each have an individual arc shape when viewed from the top and are in contact with each other.

2. The device according to claim 1, wherein the plurality of insulating layers in the dividing portion are formed independently of the first member and the second member.

3. The device according to claim 2, wherein the first portion is in contact with one end in the longitudinal direction of the first member, and the second portion is in contact with one end in the longitudinal direction of the second member.

4. The device according to claim 1, further comprising an insulator including a metal oxide provided between at least one layer of the plurality of insulating layers and each of the first member and the second member.

5. The device according to claim 1, wherein
   the plurality of interconnect layers include a first area and a second area in which the memory pillar is arranged, and a third area arranged between the first area and the second area, in which the memory pillar is not arranged, and
   the third area includes a fourth area formed in such a manner that the plurality of interconnect layers surround an insulating area, and a fifth area having a staircase portion in which part of each of the interconnect layers is drawn out in a stepwise manner.

6. The device according to claim 5, wherein the dividing portion and the insulating area are arranged in a third direction intersecting the first direction and the second direction.

7. The device according to claim 5, wherein the dividing portion and the staircase portion are arranged in a third direction intersecting the first direction and the second direction.

8. The device according to claim 5, wherein a distance between the first member and the second member in the second direction is smaller than a distance between the insulating area and the first and second members in a third direction intersecting the first direction and the second direction.

9. The device according to claim 1, wherein
the plurality of interconnect layers include a sixth area and a seventh area in which the memory pillar is not arranged, and an eighth area arranged between the sixth area and the seventh area, in which the memory pillar is arranged,
the sixth area and the seventh area each have a staircase portion in which an end portion of each of the interconnect layers is drawn out in a stepwise manner, and
the dividing portion and the staircase portion are arranged in a third direction intersecting the first direction and the second direction.

10. The device according to claim 1, wherein each of the interconnect layers includes a first conductor and a second conductor configured to cover a top surface and a bottom surface of the first conductor, and the second conductor is provided in such a manner as to cover a side surface of the first conductor between the first conductor and the dividing portion and not to cover the side surface of the first conductor between the first conductor and the first and second members.

11. The device according to claim 1, wherein one end in the longitudinal direction of the first member is fitted within the arc shape of the first portion of the plurality of insulating layers when viewed from the top, and
one end in the longitudinal direction of the second member is fitted within the arc shape of the second portion of the plurality of insulating layers when viewed from the top.

12. A semiconductor memory device comprising:
a plurality of interconnect layers stacked above a substrate and spaced apart from each other in a first direction;
a memory pillar configured to penetrate the plurality of interconnect layers in the first direction;
a first member and a second member each having a longitudinal direction set to a second direction intersecting the first direction when viewed from a top, the first member and the second member being arranged in the second direction and penetrating the plurality of interconnect layers in the first direction;
a dividing portion provided between the first member and the second member, the dividing portion including a plurality of insulating layers provided for the interconnect layers, respectively; and
an insulator including a metal oxide provided between each of the insulating layers in the dividing portion and each of the interconnect layers.

13. The device according to claim 12, wherein each of the insulating layers and each of the interconnect layers are in contact with the insulator in a third direction intersecting the first direction and the second direction.

14. The device according to claim 12, wherein the insulator is further provided between at least one layer of the insulating layers and each of the first member and the second member.

15. The device according to claim 14, wherein each of the insulating layers, the first member, and the second member are in contact with the insulator in the second direction.

16. The device according to claim 12, wherein the insulator covers a top surface, a bottom surface, and part of a side surface of each of the interconnect layers.

17. The device according to claim 16, wherein each of the interconnect layers includes a first conductor and a second conductor configured to cover a top surface and a bottom surface of the first conductor, and the second conductor is provided in such a manner as to cover a side surface of the first conductor between the first conductor and the dividing portion and not to cover the side surface of the first conductor between the first conductor and the first and second members.

18. The device according to claim 17, wherein the insulator does not cover a side surface of each of the interconnect layers, the side surface facing the first member and the second member.

* * * * *